(12) United States Patent  
Shimanuki

(10) Patent No.: US 6,927,096 B2  
(45) Date of Patent: Aug. 9, 2005

(54) METHOD OF MANUFACTURING A SEMICONDUCTOR DEVICE

(75) Inventor: Yoshihiko Shimanuki, Nanyo (JP)

(73) Assignees: Renesas Technology Corp., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 19 days.

(21) Appl. No.: 10/700,577

(22) Filed: Nov. 5, 2003

(65) Prior Publication Data

US 2004/0097017 A1 May 20, 2004

(30) Foreign Application Priority Data

Nov. 15, 2002 (JP) ........................................ 2002-332260  
Sep. 4, 2003 (JP) ........................................ 2003-312059

(51) Int. Cl.[7] .............................................. H01L 21/44
(52) U.S. Cl. ........................ 438/113; 438/124; 438/126; 438/127
(58) Field of Search ................................. 438/106, 107, 438/110, 111, 112, 113, 114, 118, 121–127

(56) References Cited

U.S. PATENT DOCUMENTS

| | | | | |
|---|---|---|---|---|
| 5,866,948 A | * | 2/1999 | Murakami et al. | 257/778 |
| 5,981,314 A | * | 11/1999 | Glenn et al. | 438/127 |
| 6,177,288 B1 | * | 1/2001 | Takiar | 438/113 |
| 6,399,415 B1 | * | 6/2002 | Bayan et al. | 438/113 |
| 6,723,585 B1 | * | 4/2004 | Tu et al. | 438/123 |

FOREIGN PATENT DOCUMENTS

JP      2000-286376     10/2000

* cited by examiner

Primary Examiner—Kevin M. Picardat  
(74) Attorney, Agent, or Firm—Miles & Stockbridge P.C.

(57) ABSTRACT

A method of producing a thin, non-lead type semiconductor device superior in packaging performance is to be provided. A recess and grooves are formed on a main surface of a conductive substrate in accordance with predetermined patterns to define plural compartments surrounded with the recess and grooves, and plural product-forming portions are formed each by one or plural recesses and plural compartments. Thereafter, a back surface of a semiconductor element is fixed onto a depressed bottom of each of the product-forming portions through an adhesive, then electrodes formed on the semiconductor element and the compartments are connected with each other through conductive wires, an insulating resin is formed on the main surface of the substrate so as to cover the semiconductor element and the wires, then a back surface of the substrate is removed a predetermined thickness, thereby allowing the compartments to be electrically isolated each independently and allowing the adhesive to be exposed, a plating film is formed on surfaces of the compartments exposed to a surface of the resin layer, and the resin layer is cut along boundary portions of the product-forming portions to fabricate plural, thin, non-lead type semiconductor devices in each of which the back surface of the semiconductor element is lower than the main surfaces of the compartments.

36 Claims, 68 Drawing Sheets

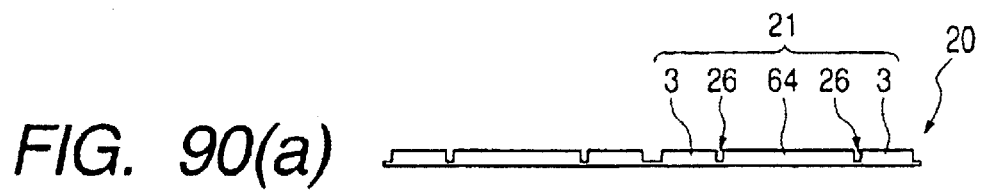
FIG. 90(a)
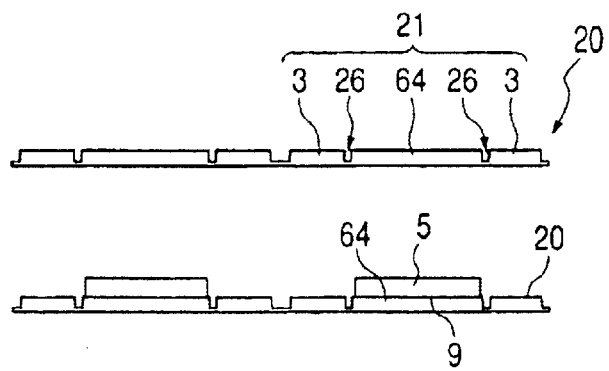
FIG. 90(b)
FIG. 90(c)
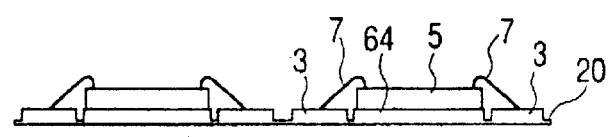
FIG. 90(d)
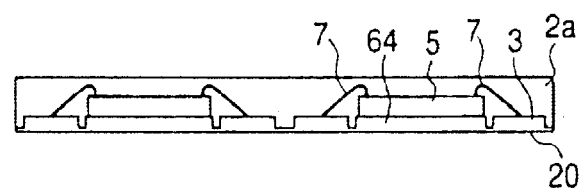
FIG. 90(e)
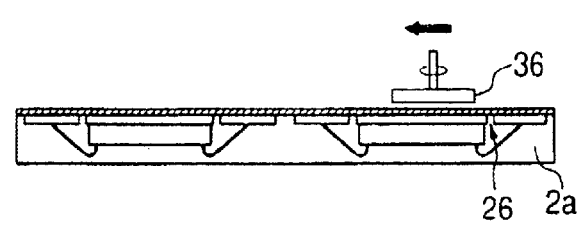
FIG. 90(f)
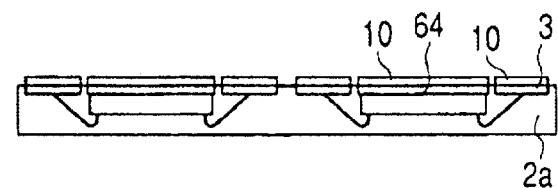
FIG. 90(g)
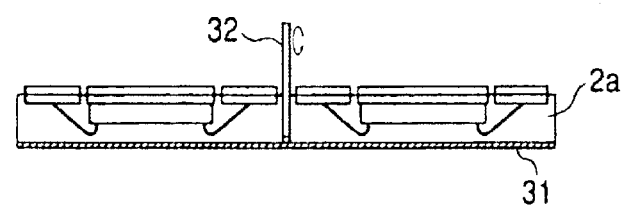
FIG. 90(h)
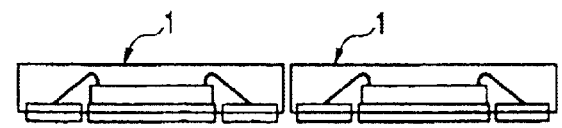

METHOD OF MANUFACTURING A SEMICONDUCTOR DEVICE

TECHNICAL FIELD

The present invention relates to a method of manufacturing a semiconductor device such as a resin-sealed type LSI (Large Scale Integration) using a metallic sheet. Particularly, the present invention is concerned with a technique effectively applicable to the manufacture of a semiconductor device (a non-lead type semiconductor device) of the type in which external electrode terminals are exposed to a mounting surface side without intentionally projecting the external electrode terminals sideways of a package, like SON (Small Outline Non-Leaded Package) and QFN (Quad Flat Non-Leaded Package).

BACKGROUND OF THE INVENTION

In manufacturing a resin-sealed type semiconductor device there is used a lead frame. The lead frame is fabricated by punching a metallic sheet with use of a precision press or by etching into desired patterns. The lead frame has a support portion called a tab or die pad for fixing a semiconductor element (semiconductor chip) and also has plural leads whose tips (inner ends) face around the support portion. The support portion (tab) is supported by tab suspension leads which extend from frame portions of a lead frame.

In fabricating a resin-sealed type semiconductor device with use of such a lead frame, a semiconductor chip is fixed onto the tab of the lead frame and electrodes of the semiconductor chip and the lead tips are connected together through conductive wires, then the lead inner ends including the wires and the semiconductor chip are sealed with an insulating resin to fill up a gap and form a sealing member (resin sealing member: package), then unnecessary lead frame portions are cut off and at the same time the leads and tab suspension leads projecting from the package are cut off.

On the other hand, as one of resin-sealed type semiconductor devices manufactured by using a lead frame there is known a semiconductor device structure (non-lead type semiconductor device) in which one-face sealing is performed for one face (main surface) of a lead frame to form a package, and leads serving as external electrode terminals are exposed to one face of the package. As such a semiconductor device there is known SON in which leads are exposed to both side edges of one face of a package and QFN in which leads are exposed to the four sides of one face of a quadrangular package.

Heretofore, as one of manufacturing methods for this type of a non-lead semiconductor device there has been known a method which uses a frame, the frame comprising suspension leads for suspending the four corners of a quadrangular island, a connector disposed so as to surround the island in a single circular form while connecting adjacent such suspension leads with each other, first connecting pieces projecting at equal intervals from the inside of the single circular connector toward the island, and second connecting pieces projecting outwards from the connector (see, for example, Patent Literature 1).

The non-lead type semiconductor device using such a frame is manufactured by fixing a semiconductor chip onto the island, fixing bonding pads formed on a surface of a semiconductor chip and the first and second connecting pieces with each other through thin wires, covering the semiconductor chip and the thin wires with a resin sealing member, conducting dicing along the connector so as to remove the connector, thereby separating the first and second connecting pieces from each other, filling up grooves with resin if necessary, and subsequently cutting (full cutting) the frame and the resin sealing member. The island is formed larger or smaller than the chip.

[Patent Literature]

Japanese Unexamined Patent Publication No. 2000-286376

SUMMARY OF THE INVENTION

From the standpoint of reducing the size of a semiconductor device and preventing the bending of leads as external electrode terminals there are used non-lead type semiconductor devices such as SON and QFN using one-face sealing. Non-lead type semiconductor devices are smaller in packaging area than such semiconductor devices as SOP (Small Outline Package) and QFP in which leads are projected from side faces of a package.

In such a non-lead type semiconductor device as QFN, external electrode terminals on a mounting surface side are arranged in one row. Therefore, as the number of external electrode terminals (also called the number of pins) increases, the structure with leads arranged in one row along the periphery of a package requires a larger size of package as compared with the size of a semiconductor element (semiconductor chip). In view of this point, such a semiconductor device as shown in the foregoing literature has been developed with a view to reducing the package size.

In Patent Literature 1 there is disclosed a structure having suspension leads for supporting an island (a chip fixing portion) to which a semiconductor chip is fixed and also having connecting pieces (first and second connecting pieces) as external electrode terminals projecting alternately inside and outside a connector which connect adjacent such suspension leads. A dicing blade having a larger width than the width of the connector is moved in the extending direction of the connector to cut off the connector.

However, the four corners of the frame deviated from the connector are vacant regions where the connecting pieces are not located, and thus the frame is not effectively utilized. From this standpoint of effective utilization of the frame there is a disadvantage that external electrode terminals cannot be formed in the regions where suspension leads are provided.

On the other hand, the first connecting pieces extending toward the island have a cantilevered structure. Therefore, at the time of transfer molding wherein the frame is clamped to a molding die comprising upper and lower die halves, there may occur a case where the tips of the cantilevered, first connecting pieces fail to come into close contact with a parting face of the lower die half. In transfer molding, resin gets into the poor contact portion and adheres (as resin burrs) to the surfaces of the external electrodes terminals which surfaces serve as mounting surface. If the resin burrs are left intact, there will occur a packaging defect, and therefore it becomes necessary to newly provide a resin burr removing step in the course of manufacture of the semiconductor device, thus obstructing the reduction of the manufacturing cost.

The applicant in the present case has already proposed a method of manufacturing a non-lead type semiconductor device being small-sized, permitting an increase in the number of external electrode terminals, capable of forming external electrode terminals with high morphological and dimensional accuracy, and further capable of enhancing the packaging reliability (Japanese Patent Application No. 2002-4435, U.S. patent application Ser. No. 10/091,302).

Among semiconductor device manufacturing methods included in the above proposal, one method, which is described in the twenty-second embodiment, will be referred to below briefly.

The method in question is a method of manufacturing a semiconductor device, comprising the steps of providing a metallic sheet, the metallic sheet having portions as plural external electrode terminals partitioned by grooves on a main surface of the metallic sheet and also having a portion (tab) for supporting a semiconductor chip, fixing a semiconductor chip to the semiconductor chip supporting portion of the metallic sheet, connecting the semiconductor chip and the portions as external electrode terminals with each other electrically through conductive wires, forming a resin sealing member, and etching the metallic sheet from a back surface thereof to remove the regions where the grooves are formed in the metallic sheet, thereby separating the external electrode terminals and the tabs from each other.

In the non-lead type semiconductor device manufactured by such a method, the semiconductor element and wires are positioned inside an insulating resin layer (resin sealing member) of a flat square shape and lower surfaces of plural compartments are exposed on the underside of the resin sealing member. One or more compartments are positioned also on the underside of the semiconductor element. The compartment(s) positioned on the underside of the semiconductor element constitutes a chip mounting portion for supporting the semiconductor element and also constitutes external electrode terminals.

In the non-lead type semiconductor device manufactured by such a method, external electrode terminals are interconnected by portions which are formed thin in the interiors of the grooves of the metallic sheet, and the foregoing connecting portions are removed by etching, so that it becomes easy to dispose external electrode terminals also at the corners of the mounting surface in the semiconductor device and thus it becomes possible to utilize the mounting surface effectively, that is, the size of the semiconductor device can be reduced.

Further, since the connecting portions in the interiors of the grooves are formed so as to surround the peripheries of the external electrode terminals, the connecting portions for the external terminals can be removed by etching or lapping, it is possible to prevent the formation of resin burrs on the mounting surfaces of the external terminals.

However, the present inventor has noticed a new problem that, when such a non-lead type semiconductor device is connected to a packaging substrate such as a mother board, there may occur peeling between the semiconductor element and the chip mounting portion, depending on product, and that a packaging defect may result.

As a result of having made analysis on the aforesaid packaging defect, it turned out that the packaging defect was apt to occur in case of bonding the semiconductor element and the chip mounting portion with use of a pasty adhesive (die bonding material). If the state of application of the pasty bonding material is bad, voids will remain in the adhesive when the semiconductor element and the chip mounting portion are bonded together.

The voids expand on heating in packaging and act to peel the semiconductor element and the chip mounting portion from each other. If the peeling force is large, the chip mounting portion will peel off from the semiconductor element. Even when the peeling force is small, cracks will be developed and the moistureproofness of bonded portions in packaging is deteriorated.

In the structure wherein a semiconductor chip is supported by a plurality of very small compartments (chip mounting portion), the bonding strength between the semiconductor element and the compartments is low because the compartments are very small. If voids are present in such a state, the bonding strength between the semiconductor element and the compartments become extremely low, and if the chip mounting portion is touched or a large vibration or thermal stress is imposed thereon, the compartments will fall off even with a small external force, which leads to a defective product.

Such falling-off of the compartments in the semiconductor device manufacturing stage obstructs a smooth production, causes a lowering of productivity, a lowering of device availability, and a lowering of production yield, thus preventing reduction of the product cost.

Further, with the recent reduction in size of electronic devices progressing in quick tempo, the demand for a further reduction in thickness of a semiconductor device has becoming more and more strong.

It is an object of the present invention to provide a method of manufacturing a non-lead type semiconductor device excellent in productivity.

It is another object of the present invention to provide a method of manufacturing a non-lead type semiconductor device in which a chip mounting portion with a semiconductor element fixed thereto is difficult to fall off.

It is another object of the present invention to provide a semiconductor device capable of attaining the reduction of thickness, as well as a method of manufacturing the same.

The above and other objects and novel features of the present invention will become apparent from the following description and the accompanying drawings.

Typical modes of the present invention disclosed herein will be outlined below.

(1) A non-lead type semiconductor device (QFN) according to the present invention is manufactured through the successive steps of:

(a) forming a recess and grooves in accordance with predetermined patterns on a main surface of a flat conductive substrate having a predetermined thickness to define a plurality of compartments enclosed with the recess and the grooves and forming a plurality of product-forming portions which are each constituted by one or plural such recesses and plural such compartments;

(b) fixing a back surface of a semiconductor element onto a bottom of the recess(es) in each of the product-forming portions through an adhesive (an insulating or conductive adhesive);

(c) connecting electrodes formed on a surface of the semiconductor element and surfaces of the compartments with each other electrically using wires in each of the product-forming portions;

(d) forming an insulating resin (for example by a transfer molding method) on the main surface of the substrate so as to cover the semiconductor element and the wires and so as to include boundary portions of each of the product-forming portions;

(e) removing (for example by etching) a predetermined thickness of a back surface of the substrate opposite to the main surface thereof, thereby allowing the compartments to be isolated electrically and allowing the adhesive to be exposed;

(g) forming a plating film on the surface of each of the compartments exposed to a surface of the resin layer;

(h) affixing a tape to the whole of a surface of the resin layer opposite to the surface thereof to which the compartments are exposed;
(f) cutting (for example dicing) the resin layer along the boundary portions of the product-forming portions to fabricate plural semiconductor devices; and
(i) peeling each of the semiconductor devices from the tape.

The semiconductor device manufacturing method according to the present invention is characterized in that, at the time of fixing the semiconductor element and at the time of connecting the wires and forming the resin layer, the back surface of the substrate is vacuum-chucked to keep the substrate flat.

In forming the product-forming portions in step (a), the depth of the recess and that of each of the grooves are set equal to each other. In removing a predetermined thickness of the back surface of the substrate in step (e), the removal is performed in such a manner that the adhesive for bonding the semiconductor element is exposed. In the plating film forming step (g), the back surface of each of the compartments is projected from the back surface of the resin layer, thus providing a stand-off structure.

Further, the compartments are arranged in plural rows (for example in two rows) along each side of each of the product-forming portions. The compartments are arranged in the same shape and same size and at equal pitches.

The following is a brief description of effects obtained by typical modes of the invention disclosed herein. In the present invention, no limitation is made to the construction that attain all of the following effects, but constructions which attain some of the following effects are also included as constructions according to the present invention.

(1) A non-lead type semiconductor device of high productivity can be provided.
(2) It is possible to provide a non-lead type semiconductor device wherein a back surface of a semiconductor element is covered with an adhesive or with a substrate portion thinner than the compartments (external electrode terminals).
(3) It is possible to provide a semiconductor device of high packaging reliability.
(4) It is possible to provide a thin, non-lead type semiconductor device.
(5) On the back surface of the semiconductor element which assumes a buried state in the resin layer, no substrate portion is present and there remains only the adhesive that has been used to bond the substrate and the semiconductor element, so there will not occur the phenomenon that the substrate portion falls off from the semiconductor element. As a result, in the semiconductor device manufacturing stage, there no longer occurs any problem attributable to the aforesaid dislodgment of the substrate portion. Thus, a non-lead type semiconductor device can be manufactured in high efficiency and high yield.
(6) No substrate portion is present on the back surface of the semiconductor element, so in the bonded portion between the substrate portion and the semiconductor element there no longer is developed any crack or peeled-off portion attributable to a difference in thermal expansion coefficient between the two. Consequently, there is no trap of water in such cracked or peeled-off portion, and at the time of mounting the non-lead semiconductor device onto a packaging substrate by solder reflow there no longer arises such a problem as peeling of the semiconductor device that is attributable to the expansion of water. Thus, it is possible to improve the packaging yield and packaging reliability.
(7) Since the non-lead type semiconductor device is manufactured using a substrate wherein the semiconductor element mounting surface (back surface) is lower than main surfaces of the compartments, it is possible to thin the resin layer in comparison with the structure wherein the semiconductor element mounting surface and compartments' main surfaces are flush with each other or the former lies at a higher position than the compartments, thus making it possible to afford a non-lead type semiconductor device of a thin structure.
(8) In the semiconductor device manufacturing method according to the present invention, since the fixing of a semiconductor element, the connection of wires, and the formation of a resin layer are performed in a flattened state of a substrate whose back surface to be kept flat is vacuum-chucked, it is possible to effect a highly accurate processing and there can be produced a non-lead type semiconductor device of a high quality in high yield.
(9) In the semiconductor device manufacturing method according to the present invention, product-forming portions are formed while setting the recess depth and the groove depth equal to each other, a predetermined depth of the substrate back surface is removed in such a manner that a semiconductor element bonding adhesive is exposed, and thereafter a plating film is formed on the back surface of each compartment, so that the compartment coated with the plating film projects from the back surface of the resin layer, affording a stand-off structure. Consequently, the packaging performance of the non-lead type semiconductor device is improved.
(10) In the semiconductor device manufacturing method according to the present invention, compartments are arranged in plural rows (for example in two rows) along each side of each product-forming portion, and the compartments are arranged in the same shape and size and at equal intervals. This is advantageous in that the mounting of the semiconductor device to a packaging substrate can be done by grid array connection.

BRIEF DESCRIPTION OF THE DRAWINGS

FIG. 2 is a schematic plan view of the semiconductor device wherein external electrode terminals, etc. are seen through;

FIG. 18 is a schematic plan view of the semiconductor device of the fourth embodiment wherein external electrode terminals, etc. are seen through;

FIG. 23 is a schematic plan view of the semiconductor device of the fifth embodiment wherein external electrode terminals, etc. are seen through;

FIG. 27 is a schematic plan view of a semiconductor device according to a sixth embodiment of the present invention wherein external electrode terminals, etc. are seen through;

FIG. 31 is a schematic plan view of the semiconductor device of the seventh embodiment wherein external electrode terminals, etc. are seen through;

FIG. 36 is a schematic plan view of the semiconductor device of the eighth embodiment wherein external electrode terminals, etc. are seen through;

FIG. 41 is a schematic plan view of the semiconductor device of the ninth embodiment wherein external electrode terminals, etc. are seen through;

FIG. 44 is a schematic plan view of a semiconductor device according to a tenth embodiment of the present invention wherein external electrode terminals, etc. are seen through;

FIG. 46 is a schematic plan view of a semiconductor device according to an eleventh embodiment of the present invention wherein external electrode terminals, etc. are seen through;

FIG. 51 is a schematic plan view of the semiconductor device of the twelfth embodiment wherein external electrode terminals, etc. are seen through;

FIG. 59 is a schematic plan view of the semiconductor device of the modification of the fourth embodiment wherein external electrode terminals, etc. are seen through;

FIG. 62 is a schematic plan view of the semiconductor device of the modification of the fifth embodiment wherein external electrode terminals, etc. are seen through;

FIG. 73 is a schematic plan view of the semiconductor device of the third modification of the eighth embodiment wherein external electrode terminals, etc. are seen through;

FIG. 80 is a schematic plan view of the semiconductor device of the modification of the thirteenth embodiment wherein external electrode terminals, etc. are seen through;

FIGS. 90(a) to 90(h) are sectional views showing, step by step, a method of manufacturing the semiconductor device of the fourteenth embodiment;

DETAILED DESCRIPTION OF THE PREFERRED EMBODIMENTS

Figure 1:
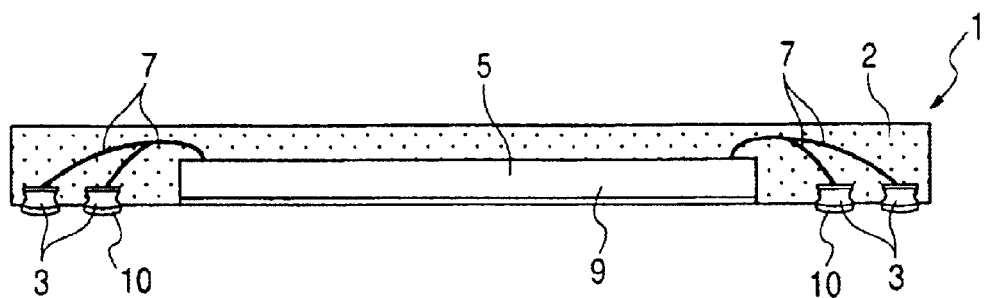
FIG. 1 is a schematic sectional view of a semiconductor device according to a first embodiment of the present invention.

Embodiments of the present invention will be described in detail hereinunder with reference to the accompanying drawings. In all of the drawings for illustrating the embodiments, portions having the same functions are identified by like reference numerals, and explanations thereof will be omitted.

[First Embodiment]

FIGS. 1 to 10 are concerned with a method of manufacturing a resin-sealed, non-lead type semiconductor device according to a first embodiment of the present invention. In this first embodiment, as shown in FIGS. 1 to 4, the present invention is applied to a method of manufacturing a non-lead type semiconductor device wherein external electrode terminals formed of a conductor (metal) are exposed to a back surface of a quadrangular resin layer (resin sealing member).

Figure 2:
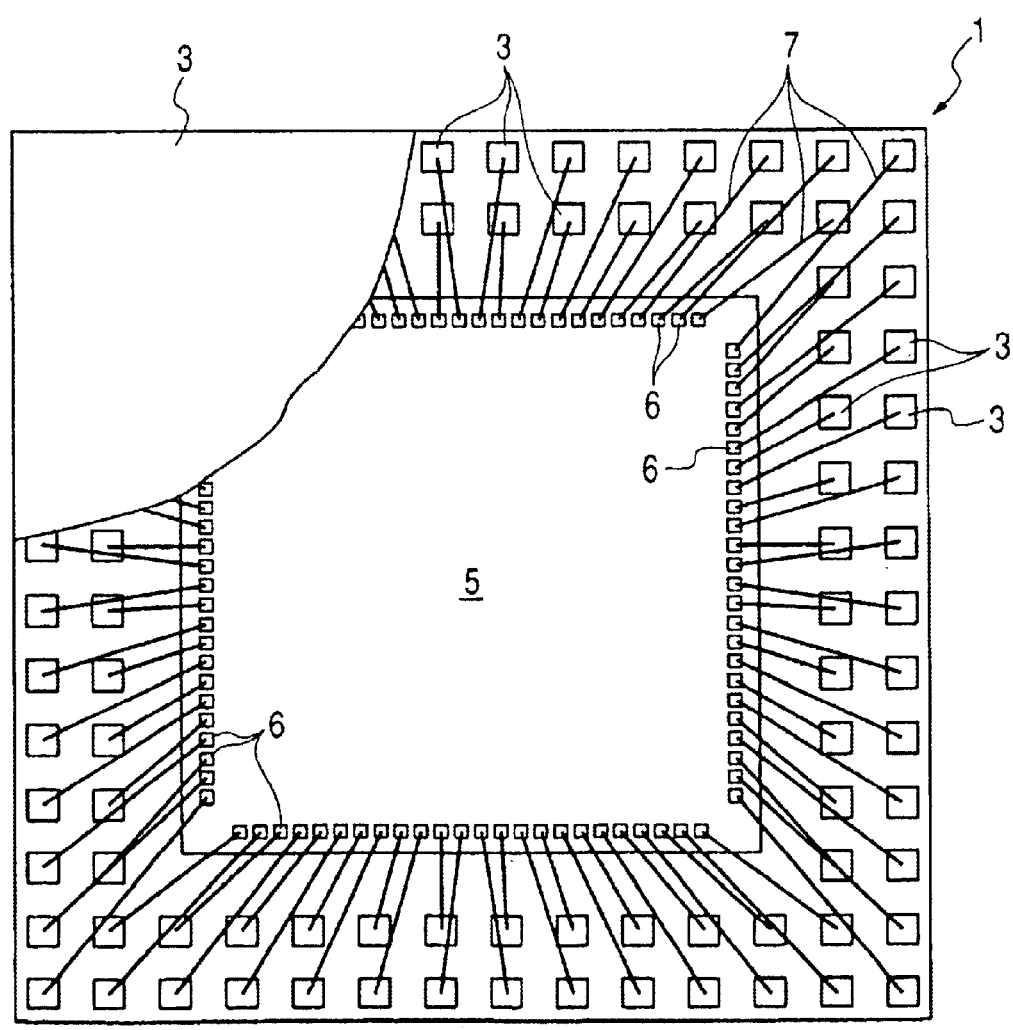

In this first embodiment, as shown in FIGS. 1 and 2, a non-lead type semiconductor device 1 has a quadrangular resin sealing member 2 of a predetermined thickness, and a semiconductor element (semiconductor chip) 5 and a plurality of electrically independent compartments (partitioned regions) 3 are positioned on a back surface (mounting surface side) of the resin sealing member 2. For example, the resin sealing member 2 is formed of an epoxy resin, while the compartments 3 are formed of a copper alloy or an iron-nickel alloy.

Figure 4:
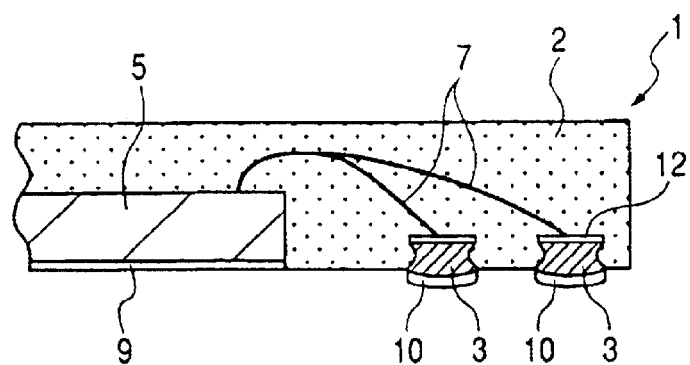
FIG. 4 is an enlarged sectional view of a part of the semiconductor device.

As shown in FIG. 4, a back surface of the semiconductor element 5 is covered with an adhesive 9 having a thickness of several ten μm for example. A plating film 10 is formed on a back surface of each compartment 3. The compartments 3 are exposed to the back surface of the resin sealing member 2 and constitute external electrode terminals. In the presence of the plating film 10, the back surface of each compartment 3 projects by a length corresponding to the thickness of the plating film 10, that is, a stand-off structure is provided. The plating film 10 is also designated an outer plating film and is provided for improving the bonding property (wettability) between the semiconductor device 1 and solder which is used at the time of mounting the semiconductor device onto a wiring substrate such as a packaging substrate. In case of using PbSn solder as the solder, it is preferable to use PbSn solder plating film as the outer plating film. In this embodiment, PbSn solder plating film is used.

Figure 3:
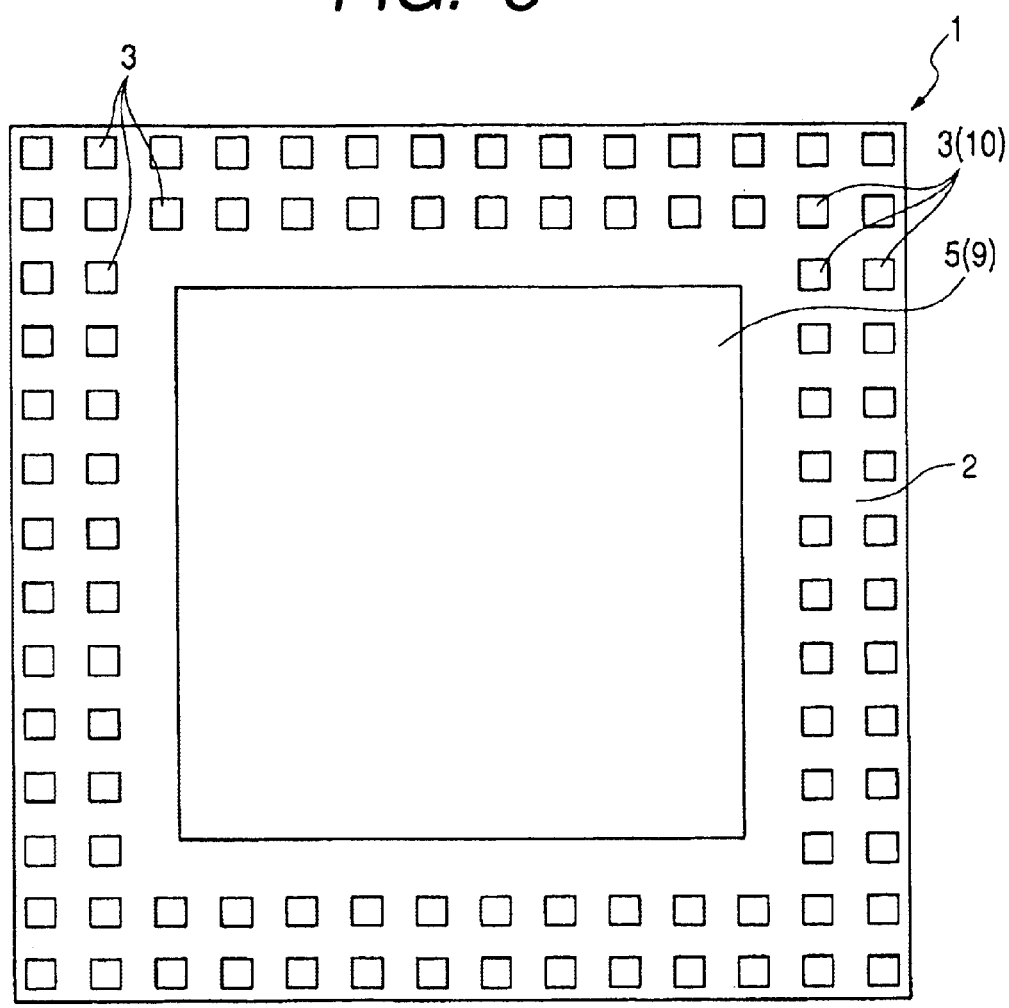
FIG. 3 is a bottom view of the semiconductor device.

As shown in FIG. 3, the semiconductor element 5 is positioned centrally of the back surface of the resin sealing member 2, and the compartments 3 are arranged so as to be spaced a predetermined distance from and surround the semiconductor device 5. The sides of the resin sealing member 2 opposed to the sides of the semiconductor element 5 are generally parallel to each other.

The compartments 3 are the same in shape and size. In this embodiment, the compartments 3 are quadrangular in shape.

Further, the compartments 3 are arranged in two rows along the sides of the resin sealing member 2 which is quadrangular in shape. The compartments are arranged in a grid shape at predetermined pitches. In other words, the compartments 3 are arranged double along the periphery of the quadrangular semiconductor element 5.

In this first embodiment, though not specially limited, the present invention is applied to the non-lead type semiconductor device 1 wherein the compartments 3 arranged in two rows along the sides of the quadrangular resin sealing member 2 are used as external electrode terminals.

The compartments (partitioned regions) 3 are each square in shape 0.5 mm long by 0.5 mm wide. The spacing between adjacent compartments 3 is, for example, about 0.15 mm. In the case where the pitch of the external electrode terminals is set at 0.5 mm, the length and width of each compartment 3 are each 0.35 mm. As shown in FIG. 4, a man surface of each compartment 3 is formed with a plating film 12 so as to permit satisfactory connection of a wire therewith. As the plating film there is formed, for example, Ag plating film, Au plating film, or Pd plating film.

As shown in FIGS. 1 and 4, the semiconductor element (semiconductor chip) 5 is positioned within the resin sealing member 2. Electrodes 6 (see FIG. 2) of the semiconductor element 5 and the surfaces of predetermined compartments 3 which surfaces are covered with the resin sealing member 2, are connected with each other electrically through conductive wires 7. The wires 7 are also covered with the resin sealing member 2 (see FIG. 2).

By forming a depressed bottom of the substrate lower than the main surface (upper surface in FIG. 1) of each compartment 3, the back surface (lower surface in FIG. 1) of the semiconductor element 5 is made lower than the main surface (upper surface in FIG. 1) of each compartment 3. This permits thinning of the resin sealing member 2 and makes it possible to reduce the thickness of the semiconductor device 1 in comparison with the case where the main surface of the semiconductor element 5 and that of each compartment 3 are flush with each other. That is, the thickness of the resin sealing member on the semiconductor element, when to be made thin, depends on the loop height of wires connected to electrodes (first connection points) on the main surface (upper surface) of the semiconductor element. In the case where the wire loop height is constant, the back surface of the semiconductor element is lower than the main surfaces of the compartments which are second connection points of wires, so that it is possible to thin the resin sealing member and reduce the thickness of the semiconductor device 1 as compared with the structure wherein the semiconductor element is mounted through an adhesive onto the chip mounting portion (tab) which is equal in thickness to the compartments. As to this structural feature, a further explanation will be given later in connection with a semiconductor device manufacturing method.

As noted earlier, the adhesive 9 which adheres to the back surface of the semiconductor element 5 is exposed to the back surface of the resin sealing member 2. In manufacturing the semiconductor device 1, as will be described later, there is used a substrate provided on its main surface side with a recess and projecting compartments, and the semiconductor element is fixed a depressed bottom of the substrate. Thereafter, a resin layer is formed on the whole surface of the substrate main surface. Then, the back surface of the substrate is removed a predetermined thickness by etching. As a result, the compartments are isolated independently from one another and the adhesive 9 is exposed.

Therefore, even in the as-manufactured state of the semiconductor device 1, as shown in FIG. 1, the adhesive 9 on the back surface of the semiconductor element 5 is exposed to the back surface of the resin sealing member 2. The adhesive 9 covers the semiconductor element 5 completely.

As the adhesive 9 there may be used a conductive adhesive or an insulating adhesive selectively. If an insulating adhesive (e.g., epoxy, acrylic, or silicone rubber adhesive) is used as the adhesive 9, the back surface of the semiconductor element 5 is covered with an insulator. As a result, a semiconductor substrate of the semiconductor element 5, such as a silicon semiconductor substrate or a compound semiconductor substrate, is insulated electrically.

In the case where such a conductive adhesive as silver (Ag) paste, solder paste, or solder tape, is used as the adhesive 9, not only the semiconductor substrate of the semiconductor element 5 can be connected electrically to a ground wiring on a packaging substrate through a conductive solder, but also the heat generated from the semiconductor element 1 can be radiated to the packaging substrate more efficiently.

Figure 5A:
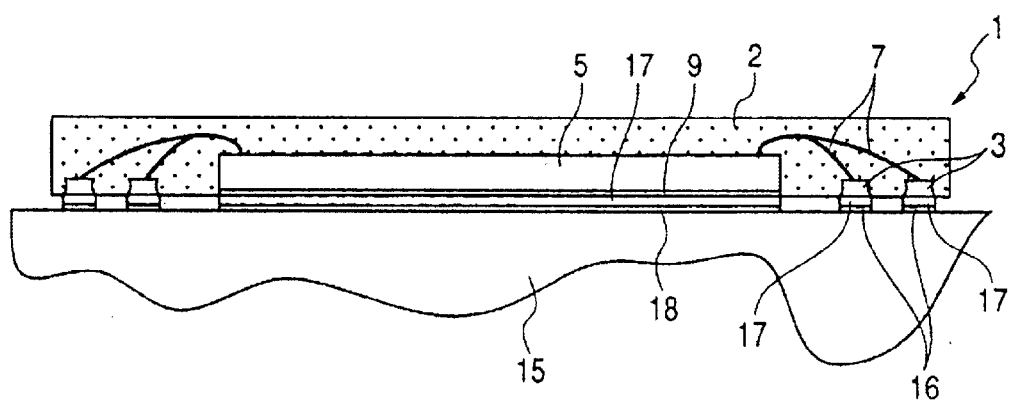
FIGS. 5(a) and 5(b) are sectional views showing in what state the semiconductor device is packaged.
Figure 5B:
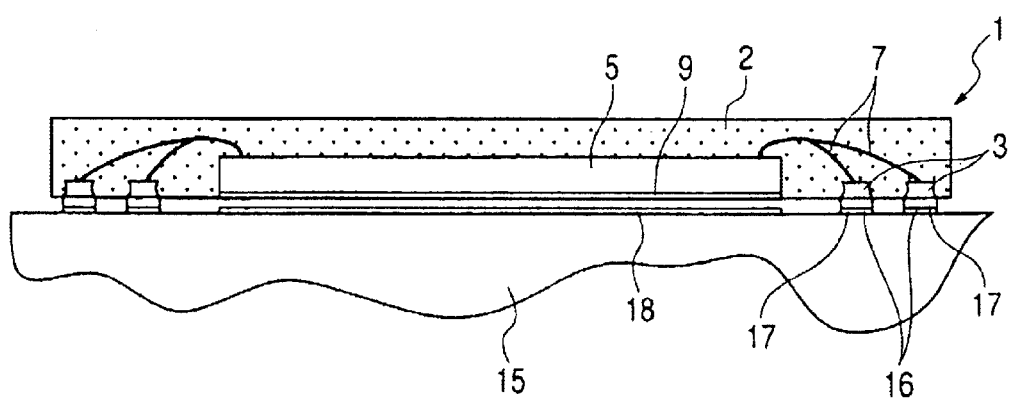

FIGS. 5(a) and 5(b) shows a state in which the semiconductor element 5 is mounted on a main surface of a packaging substrate 15, in which FIG. 5(a) shows a package structure in case of the adhesive 9 being formed by a conductive adhesive, which FIG. 5(b) shows a package structure in case of the adhesive 9 being formed by an insulating adhesive. As shown in FIG. 5(a), in the case where the adhesive 9 is a conductive adhesive, the compartments 3 are superimposed on lands 16 which are formed by wiring lines provided on the main surface of the packaging substrate 15, and the compartments 3 as external electrode terminals are electrically connected to the lands 16 through a conductive solder 17. In this case, a pad 18 corresponding to the semiconductor element 15 is formed by wiring beforehand on the main surface of the packaging substrate 15, and the back surface of the semiconductor element 5 is bonded to the pad 18 through the solder 17. As a result, the semiconductor substrate of the semiconductor element 5 and the pad 18 become equal in potential. Thus, when the semiconductor substrate of the semiconductor element 5 is at the ground potential, the pad 18 can be used as ground wiring.

Since the adhesive 9 and the solder 17 are electrically conductive, they contain a metal superior in thermal conductivity and are low in heat resistance. Therefore, the heat generated from the semiconductor element 18 can be transferred and dissipated rapidly to the pad 18.

In the case where the adhesive 9 is an insulating adhesive, as shown in FIG. 5(b), the back surface of the semiconductor element 5 is not connected to the pad 18 of the packaging substrate 15. However, if the insulating adhesive is high in thermal conductivity, the adhesive 9 may be connected to the pad 18 through solder 17 to dissipate heat, as shown in FIG. 5(a).

For example, in the semiconductor device 1, the thickness of the semiconductor element 5 is 280 $\mu$m or so, the thickness of each compartment 3 serving as an external electrode terminal is 150 $\mu$m or so, the projecting length of each compartment 3 projecting from the back surface of the resin sealing member 2 is 50 $\mu$m or so, the wire loop height on the main surface of the semiconductor element 5 is 150 $\mu$m or so, and the thickness of the resin sealing member 2 is 0.5 mm or so. Thus, the thickness (height) of the semiconductor element 1 is as extremely small as 0.5 mm or so.

The following description is now provided about a method of manufacturing the semiconductor device constructed as above. The semiconductor device is manufactured by the steps of forming a recess and grooves in accordance with predetermined patterns on a main surface of a conductive substrate to form plural compartments enclosed with the recess and the grooves and forming a plurality of product-forming portions which are each constituted by one or plural such recesses and plural such compartments [step (a)], thereafter fixing a back surface of a semiconductor element onto a bottom of the recess(es) in each of the product-forming portions through an adhesive [step (b)], connecting electrodes of the semiconductor element and the compartments with each other through conductive wires [step (c)], forming an insulating resin on the main surface of the substrate so as to cover the semiconductor element and the wires [step (d)], removing a predetermined thickness of a back surface of the substrate, thereby isolating the compartments electrically independently and allowing the adhesive to be exposed [step (e)], forming a plating film on the surface of each of the compartments exposed to a surface of the resin layer [step (f)], and cutting the resin layer along boundary portions of the product-forming portions [step (g)].

Next, with reference to the sectional view of FIGS. 6(a) to 6(h) showing manufacturing steps, a more concrete description will be given about manufacturing the semiconductor device, in which sectional view hatching is not used because it would make the figure indistinct. Also in the embodiments which follow, descriptions may be given using hatching-free drawings.

Figure 6A:
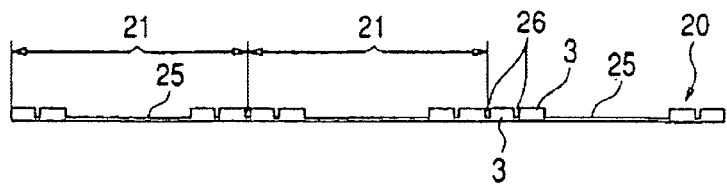
FIGS. 6(a) to 6(h) are sectional views showing, step by step, a method of manufacturing the semiconductor device.
Figure 6B:
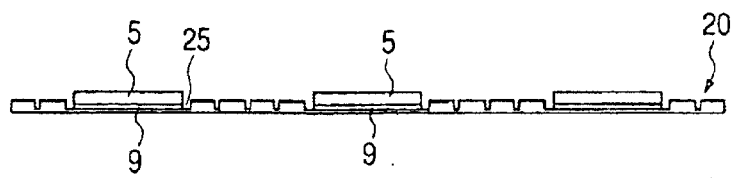
Figure 6C:
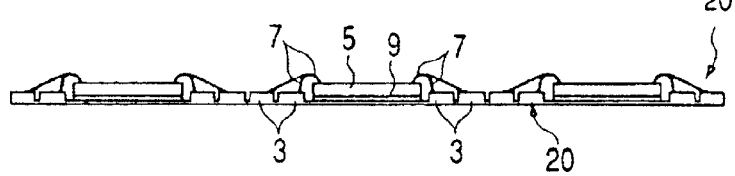
Figure 6D:
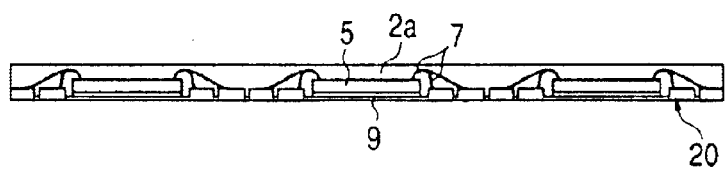
Figure 6E:
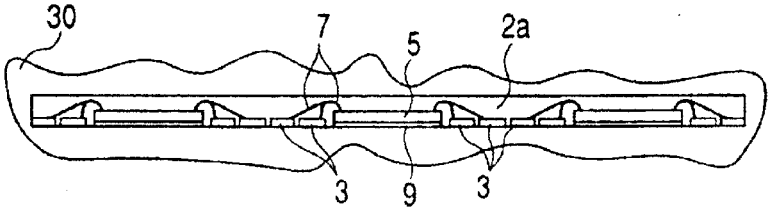
Figure 6F:
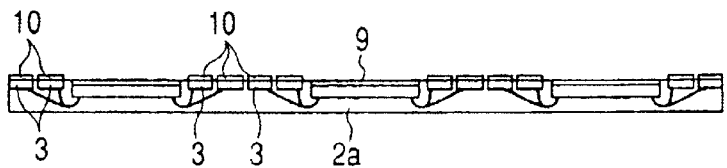
Figure 7:
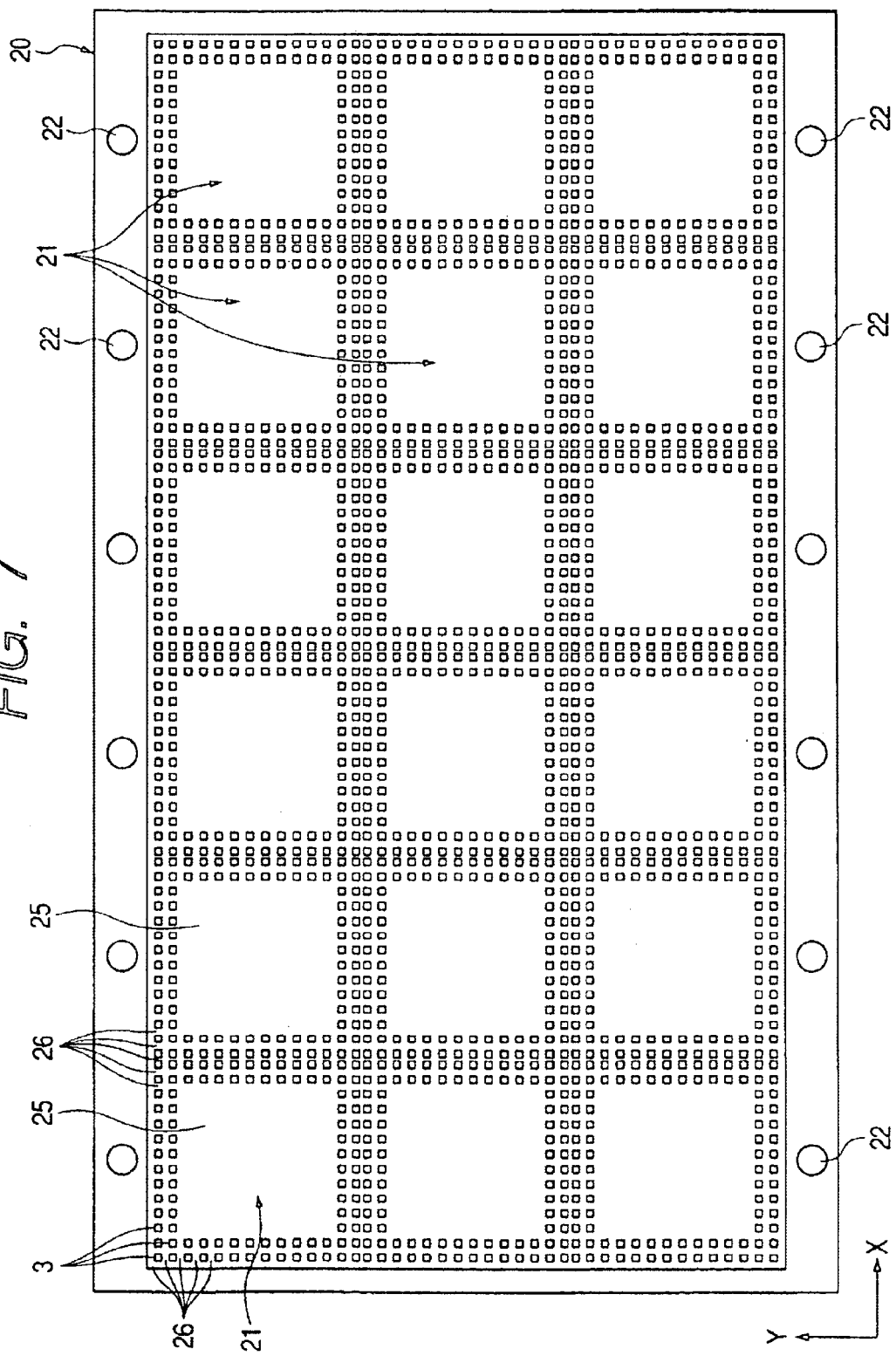
FIG. 7 is a plan view of a substrate used in the manufacture of the semiconductor device.
Figure 8:
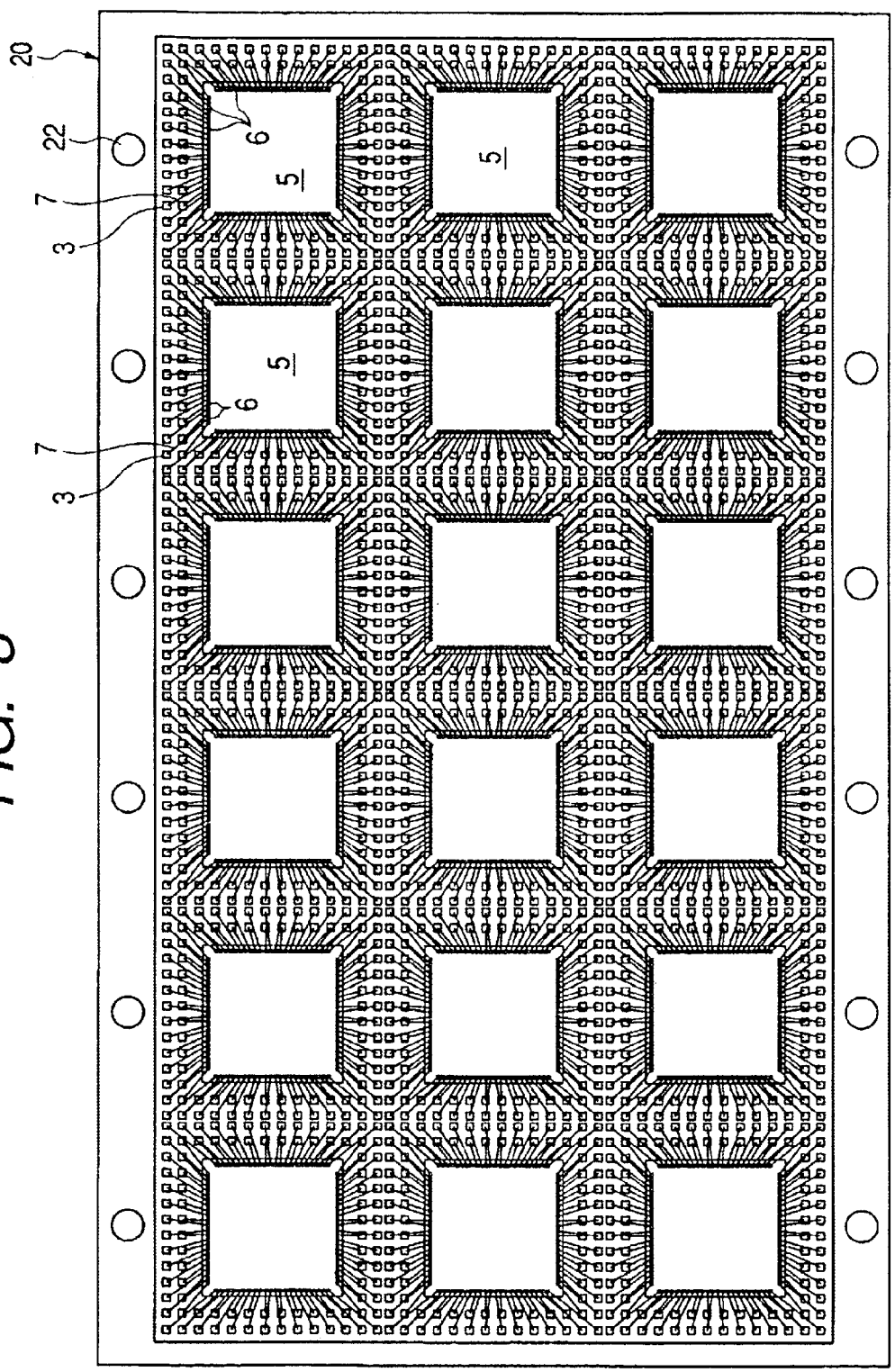
FIG. 8 is a plan view of the substrate with semiconductor elements fixed thereto and wires attached thereto.

In manufacturing the non-lead type semiconductor device, there initially is provided a single conductive substrate 20 of a rectangular shape, as shown in FIG. 6(a). The substrate 20 is constituted by a metallic sheet usually employed in the manufacture of a semiconductor device such as a copper alloy sheet, copper sheet, or iron-nickel alloy sheet. In this first embodiment there is used a flat copper alloy sheet. Plural product-forming portions 21 are formed on a main surface of the substrate 20. Semiconductor devices 1 are fabricated by the product-forming portions 21 respectively. The product-forming portions 21 are arranged longitudinally and transversely along the sides of the rectangular substrate 20 (longitudinal and transverse directions are assumed to be X and Y directions respectively). In FIG. 7, though not specially limited, three rows by six columns, i.e., a total of eighteen, product-forming portions 21 are formed on the substrate 20. Guide holes 22 are formed along long-side edges of the substrate 20 and are used for the conveyance and positioning of the substrate 20.

Figure 9A:
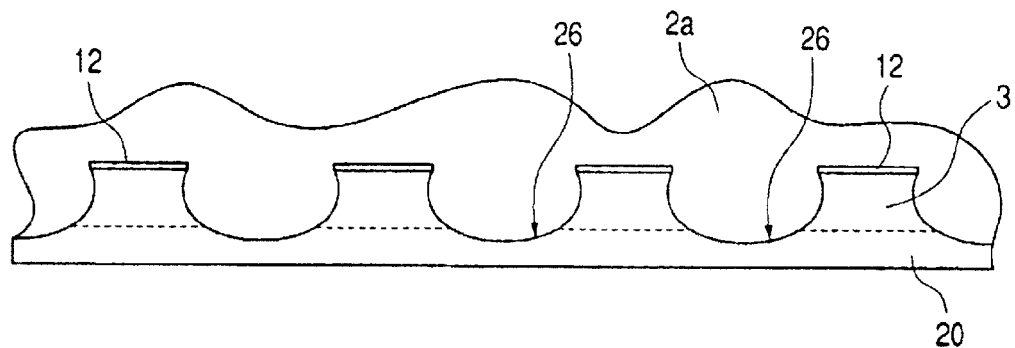
FIGS. 9(a) and 9(b) are partial schematic sectional views showing in what state a back surface of the substrate is etched in the semiconductor device manufacturing method.
Figure 9B:
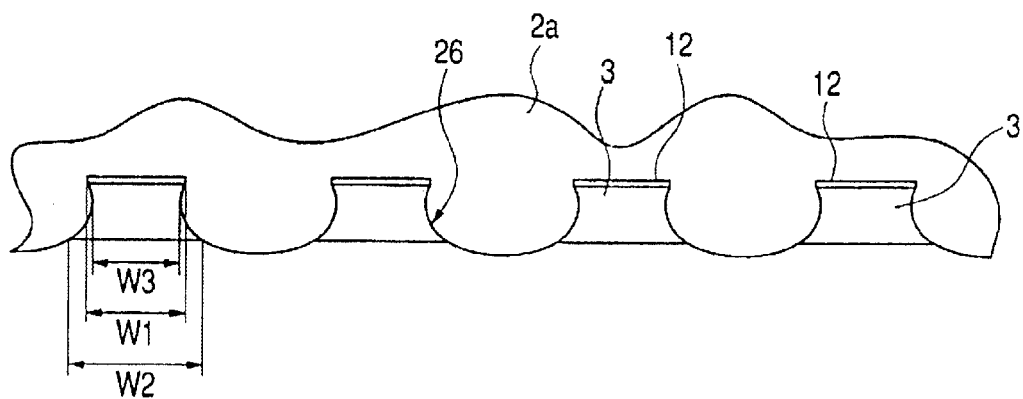

A back surface of the substrate 20 opposite to the main surface thereof is a flat face. In each of the product-forming portions 21 on the main surface of the substrate 20, square compartments 3 are arranged double in the form of a quadrangular frame and a quadrangular recess 25 is formed inside the frame. A semiconductor element 5 is fixed to a depressed bottom of the recess 25. In the square frame arrangement of the compartments 3, the arrangement extends in X and Y directions. As noted earlier, the shape of each compartment 3 is a 0.5 mm square shape and the spacing between adjacent compartments 3 is 0.15 mm. That, the arrangement pitch of the compartments 3 is 0.5 mm. The compartments 3 are formed as portions surrounded with the recess 25 and grooves 26 formed in X and Y directions. The recess 25 and the grooves 26 are formed by etching for example and are equal in depth. As shown in FIGS. 9(a) and 9(b), a plating film 12 is formed on a main surface of each compartment 3 so as to effect wire bonding in a satisfactory manner. For example, the thickness of the substrate 20 is 200

μm and the depth of each of the recess 25 and the grooves 26 is about 150 μm.

In this first embodiment, each product-forming portion 21 has one recess 25, but may be constituted by plural recesses and plural compartments.

Next, as shown in FIGS. 6(*b*) and 8, using a conventional chip bonder (not shown), the semiconductor element 5 is fixed (mounted) through an adhesive 9 to the depressed bottom of the recess 25 in each product-forming portion 21. As noted earlier, a conductive or insulating adhesive is used as the adhesive 9. In this chip bonding operation, the semiconductor element is fixed while vacuum-chucking the back surface of the substrate 20 to flatten the substrate. By so doing, chip bonding can be done with high accuracy. Particularly, on the back surface of the substrate 20 there remains a face portion to which a surface treatment by half etching for the reduction of thickness has not been applied. By vacuum-chucking this face portion not subjected to half etching, it is possible to further improve the production yield of the semiconductor device.

This is related to the fact that usually very small concaves and convexes remain on the surface of a half-etched metallic sheet and that therefore the flatness thereof becomes lower than that of a metallic sheet surface not subjected to half etching. If an attempt is made to vacuum-chuck a surface of a low flatness, the flatness of the chucked substrate 20 or semiconductor element 5 will be deteriorated due to the presence of concaves and convexes on the surface, or an unstable chucked state will result, which leads to deterioration in quality or yield of the semiconductor device. Therefore, in each product-forming portion 21, if there is formed a recess 25 by a surface treatment using etching for the reduction of thickness, if the back surface of the substrate 20 positioned opposite to the recess 25 is not subjected to half etching to keep the back surface high in flatness as compared with the inside of the recess 25, and if such a back surface of the substrate 20 is chucked in the wire bonding step, it is possible to form the semiconductor device in higher yield and quality. As to the concaves and convexes on the substrate surface resulting from half etching, their illustration is omitted because they are very small.

Next, as shown in FIGS. 6(*c*) and 8, using a conventional wire bonder (not shown), electrodes 6 of the semiconductor element 5 and the compartments 3 in each product-forming portion 21 are connected together through conductive wires 7. For example, gold wires having a diameter of about 25 μm are used as the wires 7. A wire loop height from a main surface of the semiconductor element 5 is kept to 150 μm or less. In this wire bonding operation, the back surface of the substrate, which is flat in comparison with the inside of the half-etched recess 25, is vacuum-chucked to flatten the substrate and in this state there is performed wire connection (wire bonding). Thus, it becomes possible to effect a high precision processing (wire bonding) and therefore the non-lead type semiconductor device 1 can be manufactured in high quality and high yield.

Then, as shown in FIG. 6(*d*), an insulating resin layer 2*a* is formed on the main surface of the substrate 20 so as to cover the compartments 3, semiconductor elements 5 and wires 7 with use of a transfer molding apparatus (not shown). The resin layer 2*a* is formed in uniform thickness and the semiconductor elements 5 and wires 7 are covered with resin closely without any clearance. As shown in FIG. 9(*a*), the interiors of the grooves 26 are filled with the resin 2*a*. The dotted line portion shown in the same figure indicates a boundary line to be removed by etching as will be described later. This resin layer is formed while vacuum-chucking the back surface of the substrate 20 to flatten the substrate, so it becomes possible to effect a high precision processing (formation of the resin layer) and the non-lead type semiconductor device 1 can be produced in high quality and high yield.

In transfer molding which uses a molding die, an upper surface of the resin layer 2*a* is a flat surface. For reducing the thickness of the semiconductor device, the thinner the resin layer 2*a*, the better, on condition that the semiconductor elements 5 and wires 7 are covered with the resin layer and that moistureproofness of the semiconductor device is not deteriorated. In this first embodiment, the thickness of the resin layer 2*a* is, for example, 0.5 mm or so in terms of height (thickness) from the bottom of each groove 26. As the insulating resin which forms the resin layer 2*a* there is used an epoxy resin for example.

The resin layer 2*a* may be formed by any other resin filling method than transfer molding.

Next, as schematically shown in FIG. 6(*e*), the back surface of the substrate 20 is etched using an etching solution 30. With the lapse of etching time, the back surface of the substrate 20 is etched in a progressive manner to also remove bottom portions of the grooves 26 and recess 25 in each semiconductor element 5. As a result, the compartments 3 are isolated from one another and the adhesive 9 present on the back surface of each semiconductor element 5 are exposed. In this state the etching process is completed.

Then, as shown in FIG. 6(*f*), an outer plating process is carried out to form a plating film 10 on each compartment 3. In this first embodiment, a plating film 10 of about 50 to 100 μm in thickness is formed with PbSn solder. The plating is performed by a printing plating method or an electroless plating method. The outer plating method may be substituted by a plating method in which Pb—Sn solder paste is printed, followed by heat treatment in a reflow furnace, whereby Pb—Sn solder film can be formed on the surface of each compartment 3 which surface is exposed to the mounting surface.

Figure 10:
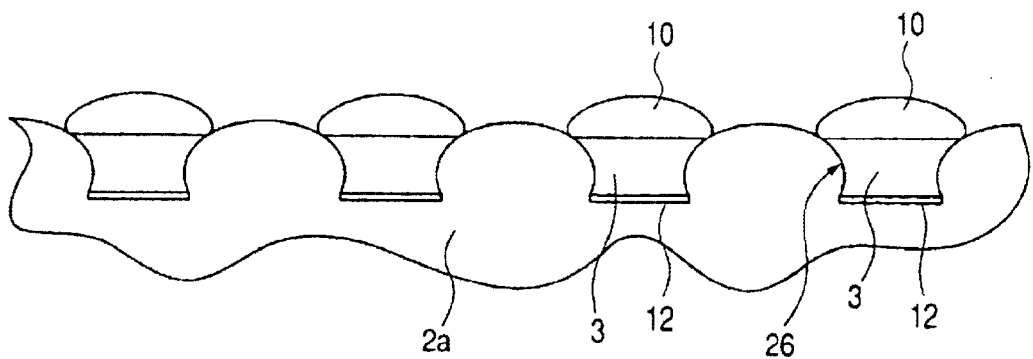
FIG. 10 is a partial schematic sectional view showing a state of a plating film formed on each external electrode terminal.
Figure 11A:
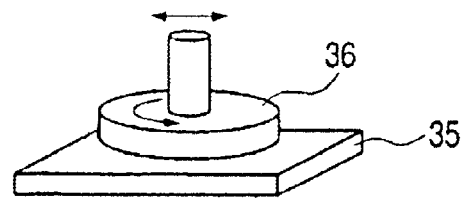
FIGS. 11(a) to 11(e) are schematic diagrams showing an example of polishing according to a modification of the semiconductor device manufacture in the first embodiment.
Figure 11B:
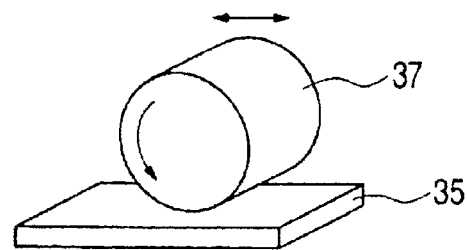
Figure 11C:
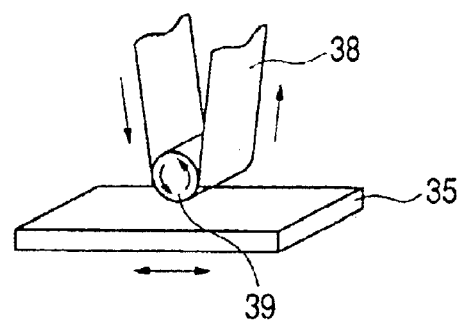
Figure 11D:
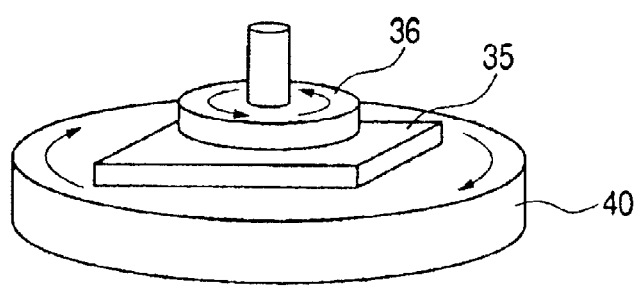
Figure 11E:
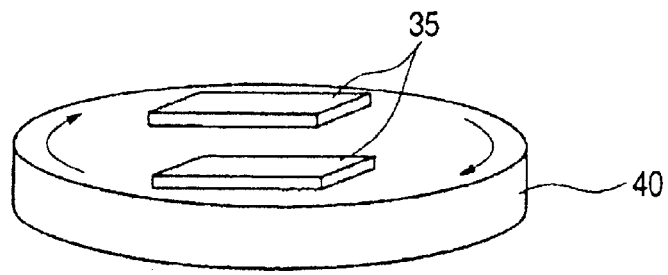

FIG. 9(*b*) is a schematic diagram showing the resin layer 2*a* injected into the grooves 26 and the recess 25 (not shown) and also showing compartments 3 which are left over after etching. By over-etching there is obtained a structure wherein the back surface of each compartment 3 is retracted relative to tip portions on the back surface of the resin layer 2*a*. Such over-etching stabilizes the formation of the plating film 10, as shown in FIG. 10.

According to the means wherein a solder film is formed on the back surface of each compartment 3 by the foregoing solder paste printing and reflow, there is obtained an effect of preventing the occurrence of a defect caused by the leakage of solder between adjacent compartments 3 because tip portion on the back surface of the resin layer 2*a* projecting from the back surface of each compartment 3 to the mounting surface side functions as a dam at the time of solder paste printing and solder reflow.

Moreover, since the resin layer 2*a* projects slightly between adjacent compartments 3 which serve as external electrode terminals, the projecting portion of the resin layer 2*a* functions as a dam at the time of packaging the semiconductor device 1, so that the packaging performance is improved and it is possible to improve the packaging yield and packaging reliability.

Further, since the grooves 26 and recesses 25 in the substrate 20 are formed by etching, side walls of the grooves 26 and recesses 25 (not shown) are depressed arcuately, as shown in FIG. 9(*a*), and in the isolated state of compartments 3 by etching, as shown in FIG. 9(*b*), the width W3 of an intermediate portion in section of each compartment 3 is narrower than the width W1 of the main surface of the compartment 3 and the width W2 of the compartment back surface. Consequently, as shown in FIGS. 9(b) and 10, the compartment 3 is positioned so as to mesh with the resin layer 2a, whereby the compartment 3 becomes difficult to fall off from the resin layer 2a and hence the reliability of each external electrode terminal (compartment 3) becomes higher. Although in FIGS. 9(a) and 9(b) two opposed side faces of each compartment 3 are shown in section, the other two opposed side faces are also narrow in the width of their intermediate portion. A dislodgment preventing means is constituted by all of the four side faces of each compartment or terminal.

Figure 6G:
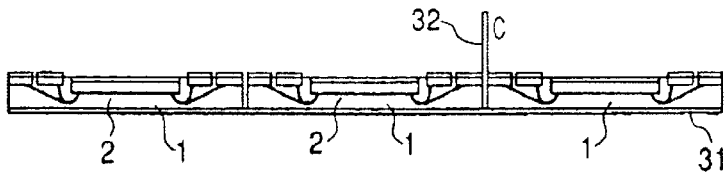

Next, as shown in FIG. 6(g), a tape 31 as a support member is affixed to the entire surface of the resin layer 2a. Thereafter, the resin layer 2a is diced longitudinally and transversely with a dicing blade 32 so that the resin layer 2a lies on an upper side to form semiconductor devices 1 of a square shape. The resin layer 2a is diced into resin sealing members 2. The dicing of the resin layer 2a with the dicing blade 32 is carried out so as not to cut the tape 31. Therefore, the semiconductor devices 1 thus separated from one another remain affixed to the tape 31. The dicing blade 32 may be a single blade or may have plural blades for simultaneous and parallel cutting. The cutting of the resin layer 2a may be done using another cutting method such as laser cutting for example.

Figure 6H:
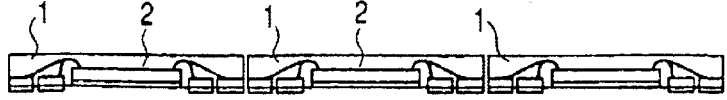

Then, the tape 31 is peeled off from the semiconductor devices 1. In this way there are produced plural semiconductor devices 1, as shown in FIG. 6(h).

The following effects are attained by this first embodiment.

(1) On the back surface of each semiconductor element 5 which is in a buried state into the resin sealing member 2 there is not present any substrate portion that has been used in the manufacture of each semiconductor device, and there remains only the adhesive 9 which has bonded the substrate and the semiconductor element 5. Accordingly, the phenomenon of a substrate portion falling off from the semiconductor element 5 does not occur. As a result, in the semiconductor device manufacturing stage, there no long arise any problem attributable to the falling-off of a substrate portion. Thus, the non-lead semiconductor device 1 can be manufactured in high efficiency and high yield.

(2) No substrate portion is present on the back surface of the semiconductor element 5, so in the bonded portion between the substrate portion and the semiconductor element there no longer is developed any crack or peeled-off portion attributable to a difference in thermal expansion coefficient between the two. Consequently, there is no trap of water in such cracked or peeled-off portion, and at the time of mounting the non-lead semiconductor device 1 onto a packaging substrate 15 by solder reflow there no longer arises such a problem as peeling of the semiconductor device 1 that is attributable to the expansion of water. Thus, it is possible to improve the packaging yield and packaging reliability.

(3) Since the non-lead type semiconductor device 1 is manufactured using a substrate wherein the semiconductor element mounting surface (back surface) is lower than main surfaces of the compartments, it is possible to thin the resin layer in comparison with the structure wherein the semiconductor element mounting surface and compartment's (external electrode terminals) main surfaces are flush with each other or the former lies at a higher position than the compartments 3 (lies on the side remote from the mounting surface), thus making it possible to afford a non-lead type semiconductor device 1 of a thin structure.

(4) In the semiconductor device manufacturing method according to the present invention, since the fixing of a semiconductor element, the connection of wires, and the formation of a resin layer are performed in a flattened state of a smoother substrate whose back surface is vacuum-chucked, it is possible to effect a highly accurate processing and there can be produced a non-lead type semiconductor device 1 of a high quality in high yield.

(5) In the semiconductor device manufacturing method according to the present invention, since the plating film 10 is formed on the back surface of each compartment 3 after removing a predetermined thickness of the substrate back surface, so that the compartment (external electrode terminal) 3 with the plating film 10 projects from the back surface of the resin layer 2a (resin sealing member 2), providing a stand-off structure, whereby the packaging performance of the non-lead type semiconductor device 1 is improved.

(6) In the semiconductor device manufacturing method according to the present invention, since the compartments 3 (external electrode terminals) are arranged in plural rows (e.g., in two rows) along the sides of each product-forming portion 21, the mounting of the semiconductor device to the packaging substrate 15 can be done by grid array connection, which is convenient.

(7) In the semiconductor device 1, the resin layer 2a slightly projects between adjacent compartments 3 which serve as external electrode terminals, so at the time of packaging the semiconductor device 1 or at the time of printing cream solder to the back surface of each compartment 3 or at the time of packaging the semiconductor device 1 by reflow, the projecting portions of the resin layer 2a function as dams, so that it is possible to improve the packaging yield and packaging reliability.

(8) In the semiconductor device 1, the peripheral faces (side walls) of each compartment 3 as an external electrode terminal whose back surface is exposed to the back surface of the resin sealing member 2 are formed by etching, so they are depressed arcuately and the intermediate width W3 in section of the compartment 3 becomes narrower than the width W1 of the main surface of the compartment and the width W2 of the compartment back surface, resulting in mesh with the resin layer 2a (resin sealing member 2) and the compartment 3 becoming difficult to fall off from the resin layer 2a. Thus, the reliability of the external electrode terminals (compartments 3) becomes higher.

In manufacturing the semiconductor device of this first embodiment there may be adopted the following methods.

In the case where the adhesive 9 is an insulating adhesive in manufacturing the semiconductor device 1, it is desirable to use, as the material of the adhesive, such a material as affords a stronger bonding force between the adhesive 9 and the semiconductor element 5 than the bonding force between the substrate and the resin sealing member 2 in the manufacture of the semiconductor device. This brings about an effect that the adhesive 9 is sure to remain on the semiconductor element 5 side. For example, in the case where the resin sealing member 2 is an epoxy resin, it is preferable that the adhesive 9 be a silicone-based adhesive.

In the case where the adhesive 9 is an insulating adhesive in manufacturing the semiconductor device 1, it is preferable to use an adhesive which contains an organic resin having a strong bonding force for the semiconductor element 5, whereby the semiconductor element 5 can be surely insulated electrically. As such an adhesive there is used a silicone-based adhesive for example.

In manufacturing the semiconductor device 1, when fixing the semiconductor element 5 to the depressed bottom of the recess in its fabrication stage, a filmy adhesive sheet may be affixed to the back surface of the semiconductor element and it may be used as the adhesive 9. In this case, since the adhesive sheet is present on the back surface of the semiconductor element 5, it is possible to prevent the formation of voids between the semiconductor element 5 and the adhesive 9 and also in the adhesive layer. As a result, not only a packaging defect caused by reflow of the semiconductor device 1 can be diminished, but also the packaging reliability can be enhanced.

In manufacturing the semiconductor device 1, it is preferable that a material lower in elastic modulus than the substrate be used as the material of the adhesive 9. The use of such a material is effective in diminishing a thermal distortion of the semiconductor element 5 and the packaging substrate and relaxing a stress induced by a difference in thermal expansion coefficient. As a preferred example of such a material there is mentioned a silicone-based adhesive.

In manufacturing the semiconductor device 1, priority is given to the state in which the amount of warp in the transverse direction of the substrate 20 is small after formation of the resin layer 2a, and it is preferable to form the resin layer 2a by selecting and using a resin having a predetermined thermal expansion of coefficient so that the amount and angle of warp in the longitudinal direction become larger than in the transverse direction. By so doing, it is possible to improve the working efficiency and yield in each step after formation of the resin layer 2a. Further, even in the case where an internal stress is imposed on the adhesive, especially on an insulating adhesive (insulator), it is possible to prevent peeling of the insulator.

In this first embodiment, removal of a predetermined thickness of the back surface of the substrate 20 may be done by any other method than etching. For example, there may be adopted polishing to make the compartments 3 independent or expose the adhesive 9. FIGS. 11(*a*) to 11(*e*) are schematic diagrams showing various polishing examples (polishing methods). In the polishing method shown in FIG. 11(*a*), a polishing disc 36 is moved while being rotated to polish an object 35 to be polished through a flat polishing surface.

In the polishing method shown in FIG. 11(*b*), a drum-like polishing roll 37 is moved while being rotated to polish the object 35 through an arcuate polishing surface.

In the polishing method shown in FIG. 11(*c*), a contact shift polishing is performed using a tape-like polishing member 38 which is several ten to several hundred meters in length. This method is a so-called tape polishing or belt polishing method. The amount of polishing can be adjusted by adjusting a pressing force of a guide roller 39 for the polishing member 38 or by adjusting the rotating speed of the roller 39. According to this method, since the tape-like polishing member 38 is long, the object 35 to be polished is polished always by a new polishing surface. Besides, not only a highly accurate polishing can be done, but also clogging of the object 35 is difficult to occur. Thus, this method is suitable for polishing a soft metal such as copper.

In the polishing method shown in FIG. 11(*d*), in combination with the polishing method shown in FIG. 11(*a*), the object 35 to be polished is held on a turntable 40 for rotating the object 35, whereby the object 35 is polished more efficiently.

In the polishing method shown in FIG. 11(*e*), in combination with the polishing method shown in FIG. 11(*d*), there is used a mechanism for holding plural object 35 to be polished. This method is characterized by being high in working efficiency because plural objects 35 can be polished at a time.

In all of these polishing methods, a polishing agent and cooling water are fed to a portion being polished.

In the polishing process, it is not always necessary that a polishing agent and cooling water be fed to the portion being polished. The polishing may be done even in a dry condition insofar as it is possible to suppress the generation of heat from the portion being polished.

[Second Embodiment]

Figure 12:
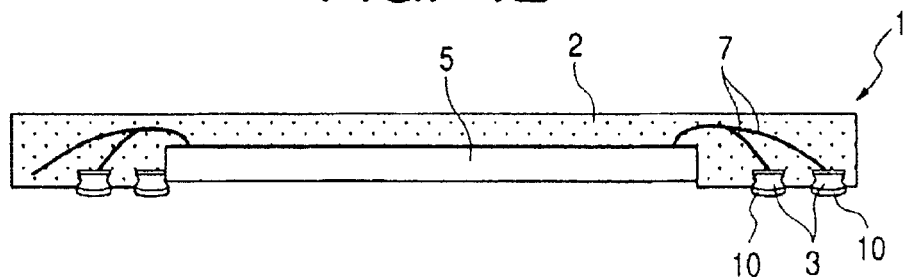
FIG. 12 is a schematic sectional view of a semiconductor device according to a second embodiment of the present invention.
Figure 13:
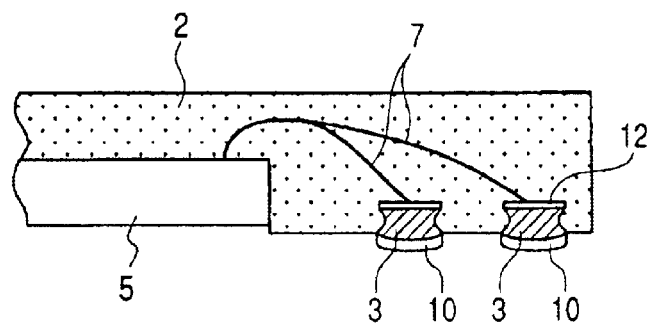
FIG. 13 is a partial enlarged sectional view of the semiconductor device of the second embodiment.
Figure 14:
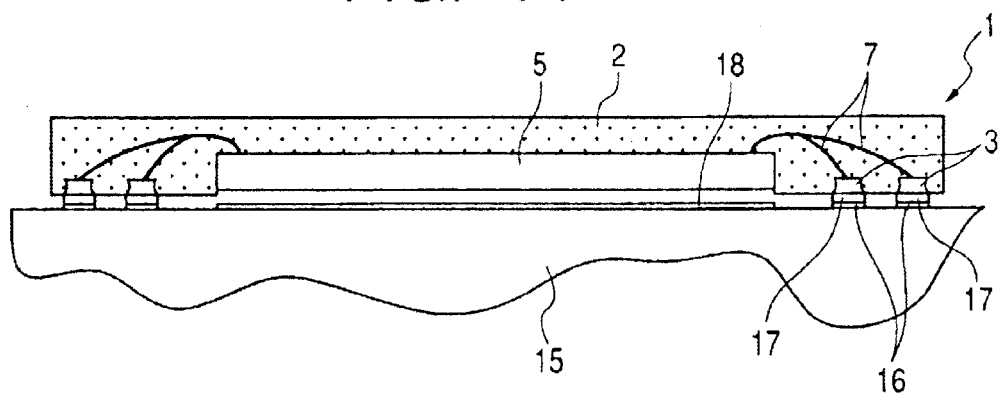
FIG. 14 is a schematic sectional view showing in what state the semiconductor device of the second embodiment is packaged.

FIGS. 12 to 14 are related to a semiconductor device according to a second embodiment of the present invention.

According to this second embodiment, in the semiconductor device manufacturing method of the first embodiment, in step (e) the substrate back surface is removed a predetermined thickness to isolate the compartments from one another and the adhesive 9 present on the back surface of the semiconductor element 5 is exposed and thereafter in step (i) the exposed adhesive 9 is removed to expose the back surface of the semiconductor element 5. The removal of the adhesive 9 is done by etching for example. A suitable etching solution is selected to match the material of the adhesive 9.

The method for removing the adhesive 9 is not limited to etching, but an adhesive 9 which is weak against low temperatures may be used and removed by a thermal stress, depending on characteristics of the adhesive 9. In case of selecting an adhesive 9 which is weak against the absorption of moisture, a hydrogen bond can be decomposed and removed by hydrating the adhesive.

FIG. 12 is a schematic sectional view of a semiconductor device according to this second embodiment and FIG. 13 is an enlarged sectional view of a part of the semiconductor device.

In the semiconductor device manufacturing method according to this second embodiment there is obtained, in addition to the effects obtained in the previous first embodiment, an effect that the adhesive 9 is not present on the back surface of the semiconductor element 5 but the back surface of the semiconductor element is exposed and that therefore there no longer occurs a packaging defect caused by Voids formed in the interface between the adhesive 9 and the semiconductor element 5. Consequently, it is possible to provide a non-lead type semiconductor device in which the back surface of the semiconductor element is exposed.

[Third Embodiment]

Figure 15:
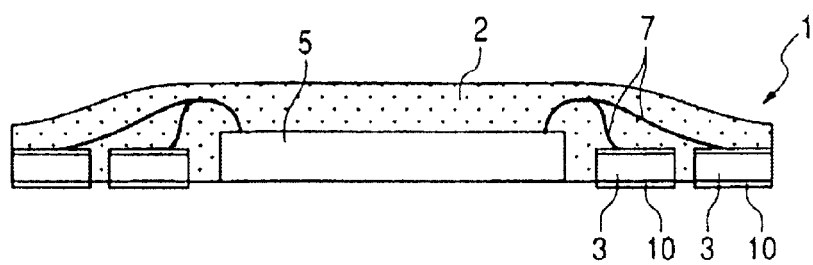
FIG. 15 is a schematic sectional view of a semiconductor device according to a third embodiment of the present invention.

FIG. 15 is a schematic sectional view of a semiconductor device according to a third embodiment of the present invention and FIGS. 16(*a*) to 16(*h*) are sectional views showing, step by step, a method of manufacturing the semiconductor device.

According to this third embodiment, in the semiconductor device manufacturing method of the first embodiment, the resin layer 2a is formed by a method other than the transfer molding method, for example, by means of a dispenser. Because of the application using a dispenser, unlike the first embodiment, the surface does not become flat but is uneven. FIG. 15 schematically illustrates the semiconductor device 1 manufactured. In this third embodiment, the adhesive 9 on the back surface of the semiconductor element 5 is removed.

FIGS. 16(*a*) to (*h*) are sectional views showing, step by step, a method of manufacturing the semiconductor device of the third embodiment, which figures correspond to FIGS.

6(a) to (h) in the first embodiment. This method is different from the method of the first embodiment in that, in step (d), the resin layer 2a is formed using a dispenser and the applied resin is cured by baking and, in the etching step (e), the adhesive 9 present on the back surface of the semiconductor element 5 is also removed. The other steps are the same as in the first embodiment. In FIGS. 16(a) to 16(h), the adhesive 9 for fixing the semiconductor element 5 to the depressed bottom of each recess 25 in the substrate is omitted.

Figure 16A:
FIGS. 16(a) to 16(h) are sectional views showing, step by step, how to manufacture the semiconductor device of the third embodiment.
Figure 16B:
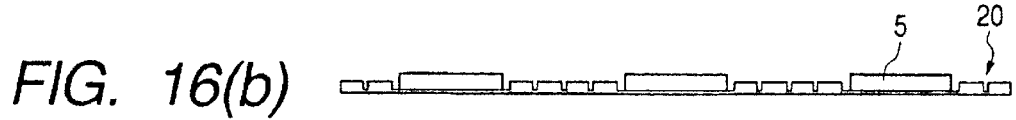
Figure 16C:
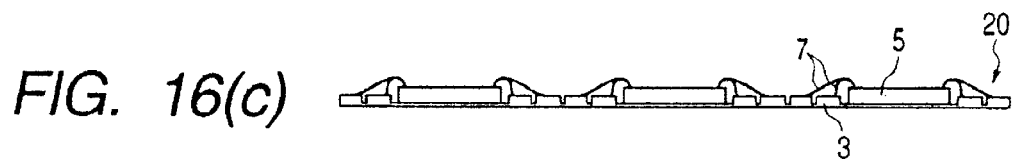
Figure 16D:
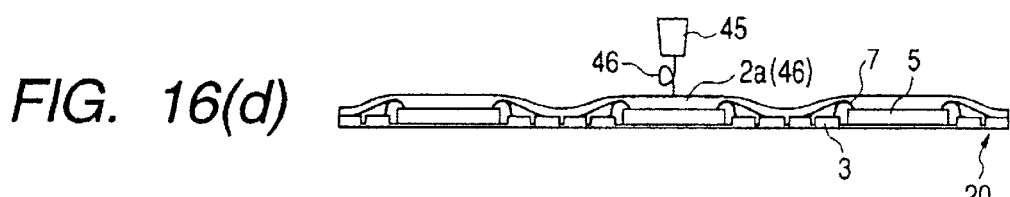

In the formation of resin layer 2a in step (d), as shown in FIG. 16(d), a predetermined amount of an insulating liquid resin 46 such as epoxy resin is poured from a nozzle 45 of a dispenser onto the substrate 20 from above the substrate to cover the semiconductor element 5 and wires 7. In this case, though not shown, it is necessary to use means which permits the resin to surely cover the semiconductor element 5 and wires 7 and prevents it from flowing out from ends of the substrate 20. More specifically, a suitable viscosity of the resin is selected and, though not shown, a stopper is disposed along the peripheral surface of the substrate 20 and is allowed to function as a dam to prevent the resin from flowing outside. Only one nozzle 45 is shown in the figure, but actually there is used a dispenser having a large number of nozzles for the supply of resin.

Next, the insulating liquid resin 46 is baked under predetermined conditions to form a resin layer 2a which covers the semiconductor element 5 and wires 7, as shown in FIG. 16(d). The surface of the resin layer 2a is uneven because of presence of the semiconductor element 5 and wires 7, but the semiconductor element 5 and wires 7 are covered with the resin closely without any clearance. For avoiding the formation of concaves and convexes on the surface, the surface may be flattened using a jig such as squeegee. Further, as the insulating liquid resin 46 there may be used a UV curing resin (ultraviolet curing resin).

Figure 16E:
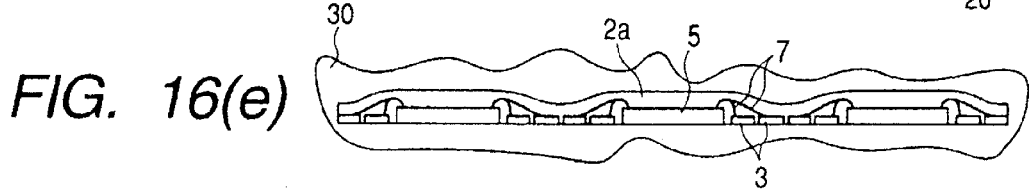
Figure 16F:
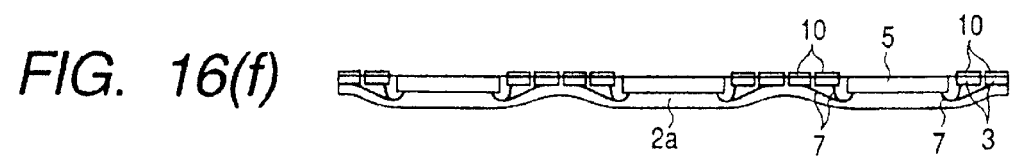
Figure 16G:
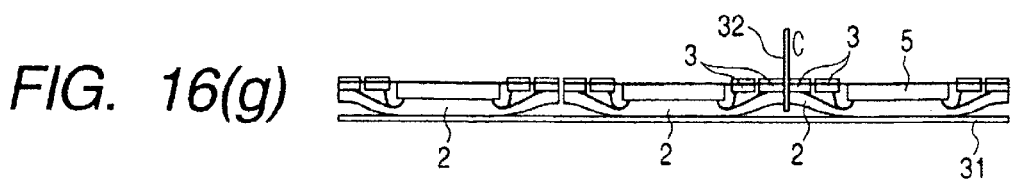
Figure 16H:
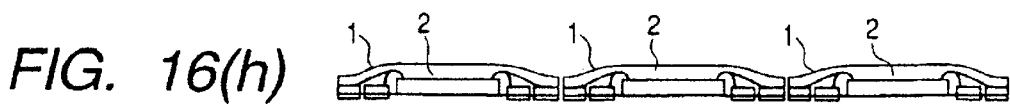

Next, as shown in FIG. 16(e), the back surface of the substrate 20 is etched using an etching solution. With the lapse of etching time, the substrate back surface is etched in a progressive manner, whereby the bottom portions of the grooves 26 are also removed. As a result, the compartments 3 are isolated from one another and the adhesive 9 present on the back surface of the semiconductor element 9 becomes exposed. Further, the etching solution changed to remove the adhesive 9 and the back surface of the semiconductor element 5 is exposed. Through subsequent steps which are the same as in the first embodiment there is fabricated such a semiconductor device 1 as shown in FIG. 15.

In the dicing step (g) in this third embodiment, a thin portion of the resin layer 2a is diced, thus bringing about an actual advantage that the cutting of the resin layer 2a becomes easier.

Also according to the semiconductor device manufacturing method in this third embodiment, as is the case with the first embodiment, it is possible provide a semiconductor device 1 which is thin and high in packaging reliability.

The method of supplying the resin for forming the resin layer 2a may be any other method than the method using a dispenser.

[Fourth Embodiment]

Figure 17:
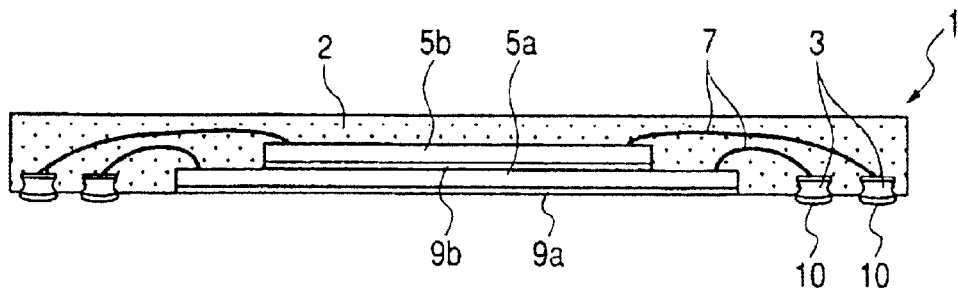
FIG. 17 is a schematic sectional view of a semiconductor device according to a fourth embodiment of the present invention.
Figure 18:
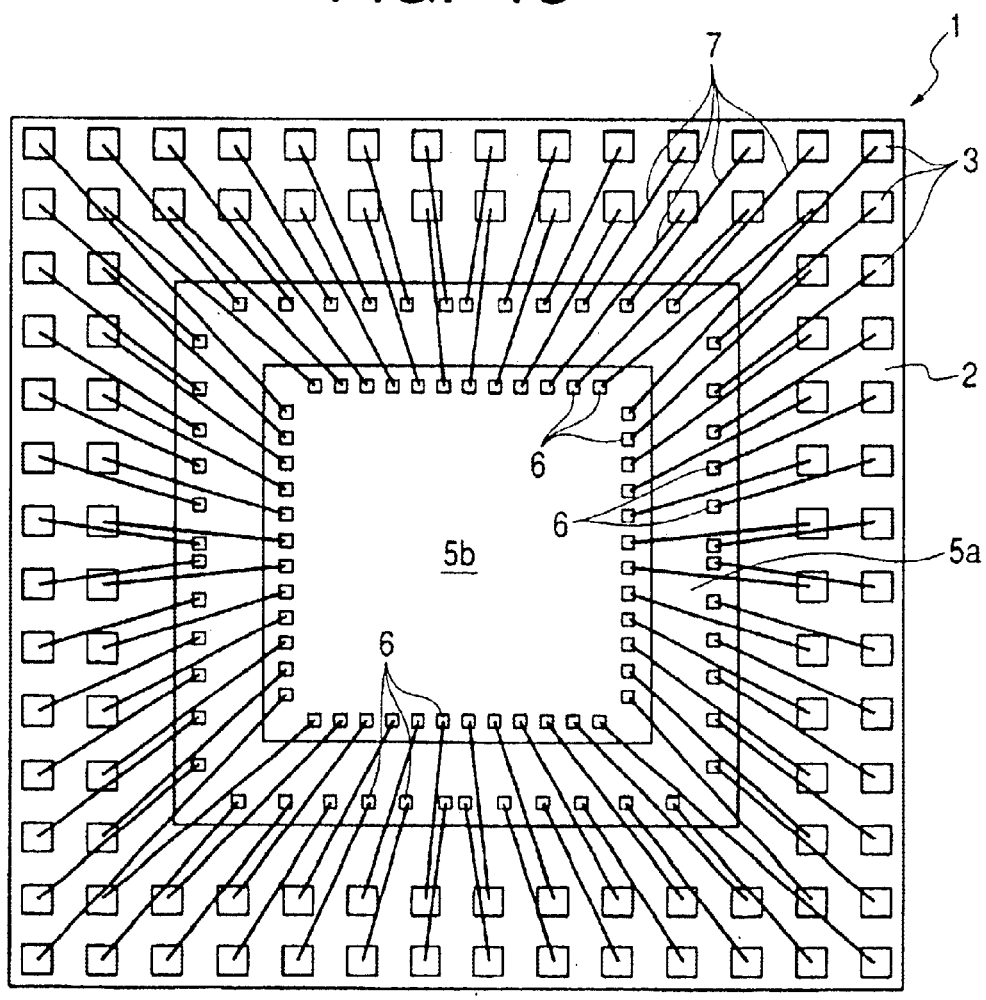
Figure 19:
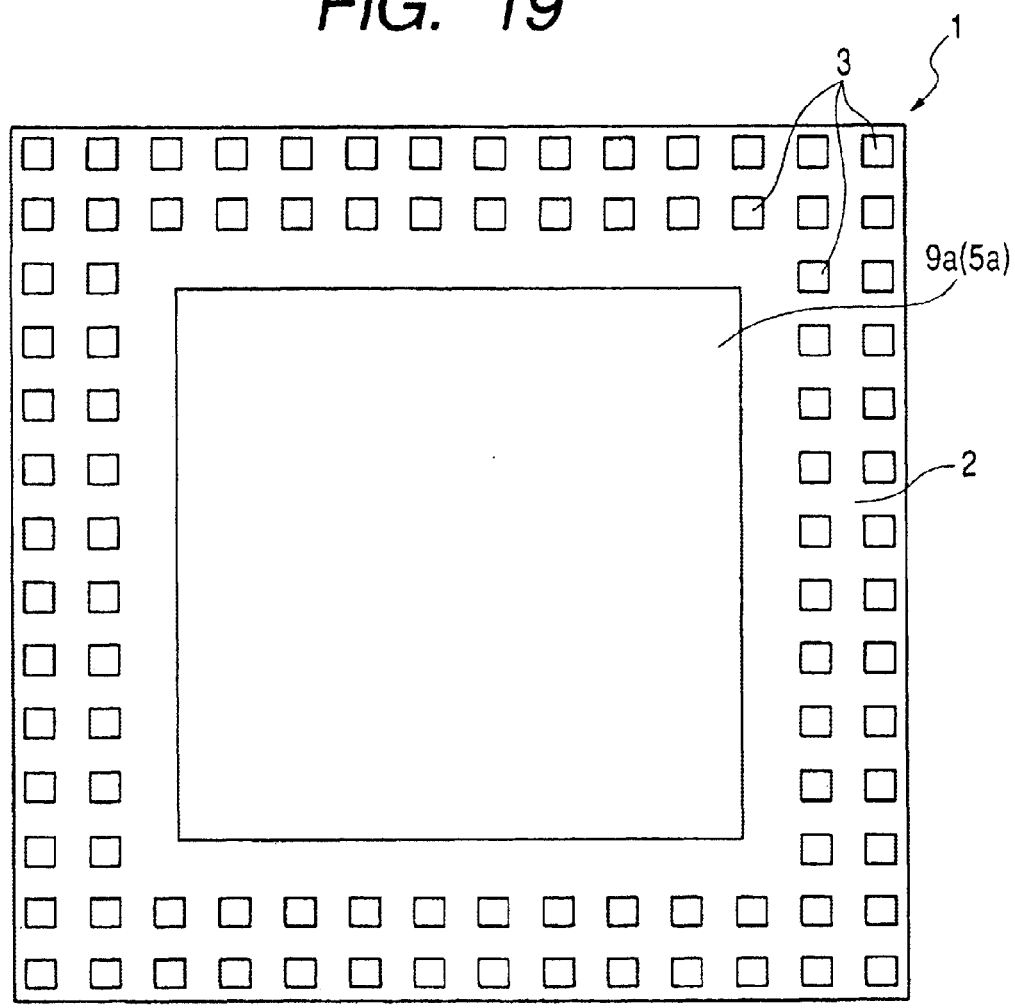
FIG. 19 is a bottom view of the semiconductor device of the fourth embodiment.
Figure 20:
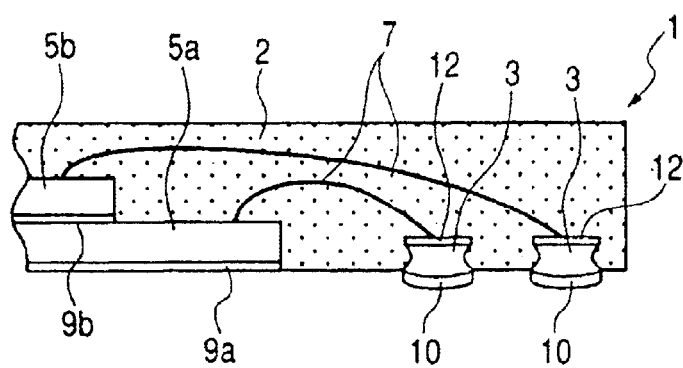
FIG. 20 is an enlarged sectional view of a part of the semiconductor device of the fourth embodiment.

FIGS. 17 to 21 illustrate a semiconductor device according to a fourth embodiment of the present invention, of which FIG. 17 is a schematic sectional view of the semiconductor device, FIG. 18 is a schematic plan view of the semiconductor device in which external electrode terminals, etc. are seen through, FIG. 19 is a bottom view of the semiconductor device, FIG. 20 is an enlarged sectional view of a part of the semiconductor device, and FIGS. 21(a) to 21(h) are sectional views showing, step by step, a method of manufacturing the semiconductor device.

This fourth embodiment is different from the first embodiment in that, in the semiconductor manufacturing method of the first embodiment, plural semiconductor devices are stacked in plural stages on a depressed bottom and electrodes exposed to surfaces of the semiconductor elements and compartments are connected together through conductive wires, and the thickness of the resin layer which covers the semiconductor elements, etc. is a little larger by such a multi-stage stacking of semiconductor elements. Other points are the same as in the first embodiment. FIGS. 21(a) to (h) are sectional views showing, step by step, a method of manufacturing the semiconductor device of this fourth embodiment, which corresponds to FIGS. 6(a) to 6(h) in the first embodiment. In FIGS. 21(a) to 21(h), adhesives 9a and 9b are omitted.

In this fourth embodiment, in the chip bonding step (b), a semiconductor element 5a is mounted through an adhesive 9a onto a depressed bottom of each of recesses 25 formed in a substrate 20 and a semiconductor element 5b is mounted on an upper surface of the semiconductor element 5a through an insulating adhesive 9b (not shown) (see FIG. 20). As shown in FIG. 18, the semiconductor element 5b is smaller than the semiconductor element 5a and it is mounted so as to allow electrodes 6 of the semiconductor element 5a to be exposed. Electrodes of the semiconductor element 5b are also exposed to an upper surface of the same semiconductor element.

Figure 21A:
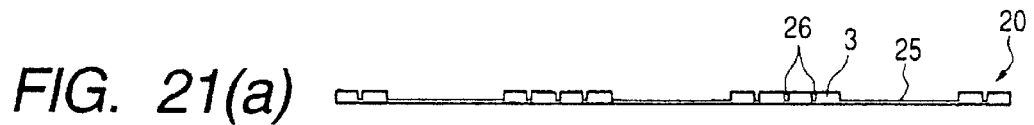
FIGS. 21(a) to 21(h) are sectional views showing, step by step, a method of manufacturing the semiconductor device of the fourth embodiment.
Figure 21B:
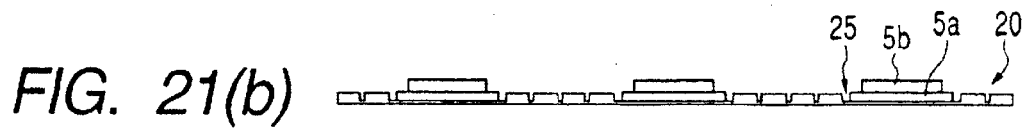
Figure 21C:
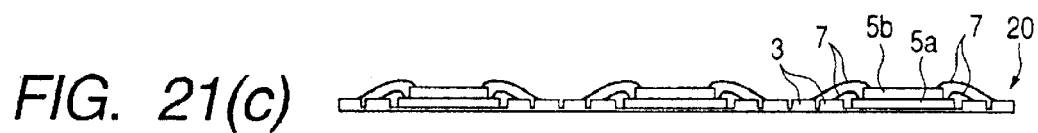

Next, as shown in FIG. 21(c), the electrodes 6 on the semiconductor elements 5a and 5b and compartments 3 are connected together through conductive wires 7 by means of a conventional wire bonder (not shown) (see FIGS. 18 and 20).

Figure 21D:
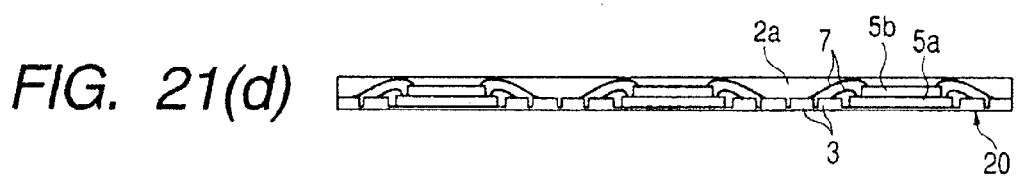
Figure 21E:
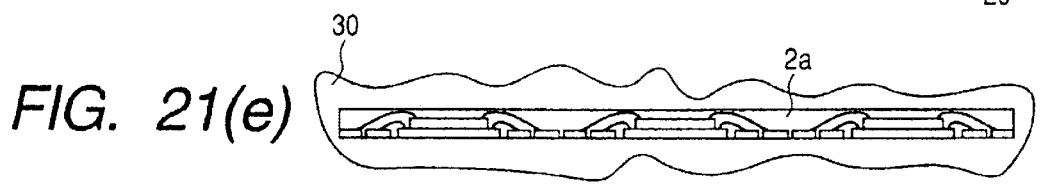
Figure 21F:
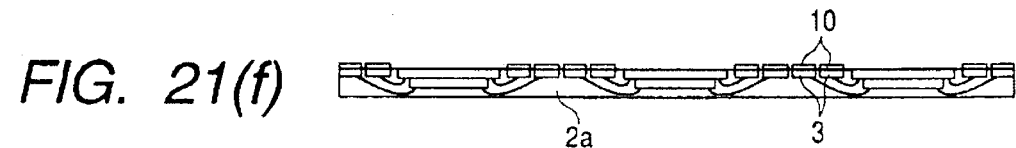
Figure 21G:
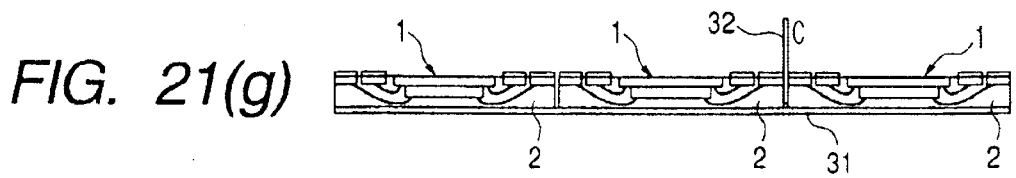
Figure 21H:
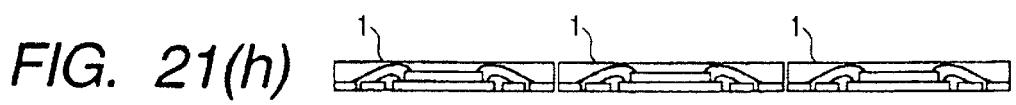

Then, as shown in FIG. 21(d), a resin layer 2a is formed on a main surface of a substrate 20 so as to cover the compartments 3, semiconductor elements 5a, 5b and wires 7 by means of a transfer molding apparatus (not shown). The resin layer 2a is formed in uniform thickness, whereby the semiconductor elements 5a, 5b and wires 7 are covered with resin closely without any clearance. In this fourth embodiment, in comparison with the first embodiment, the thickness of the resin layer 2a is a litter larger because the semiconductor elements are stacked in two stages. However, as shown in FIG. 17, even when assembled to the semiconductor device 1, the thickness of the semiconductor device 1 can be kept to 0.7 mm or so, assuming that the semiconductor elements 5a and 5b are each 280 μm in thickness. Thus, it is possible to attain the reduction in thickness of the semiconductor device. Step (e) and subsequent steps are the same as in the first embodiment.

In case of stacking semiconductor elements in two stages, it is necessary to make each semiconductor element thin in order to keep small the thickness of the resulting semiconductor device.

According to the semiconductor device manufacturing method of this fourth embodiment, not only the same effects as in the first embodiment can be obtained, but also it is possible to attain high integration. Further, semiconductor elements can be stacked in plural stages.

Figure 58:
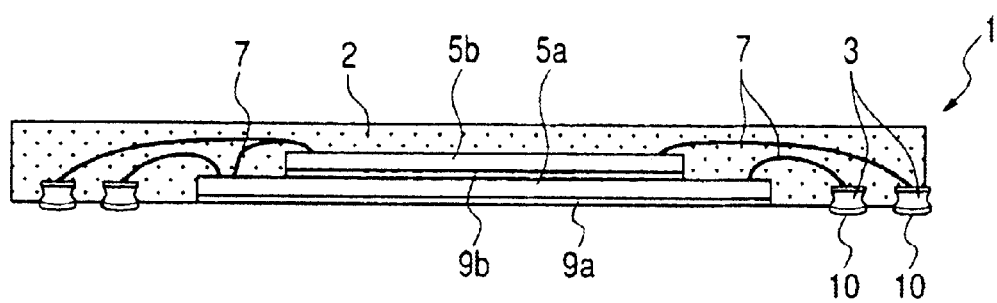
FIG. 58 is a schematic sectional view of a semiconductor device according to a modification of the fourth embodiment.
Figure 59:
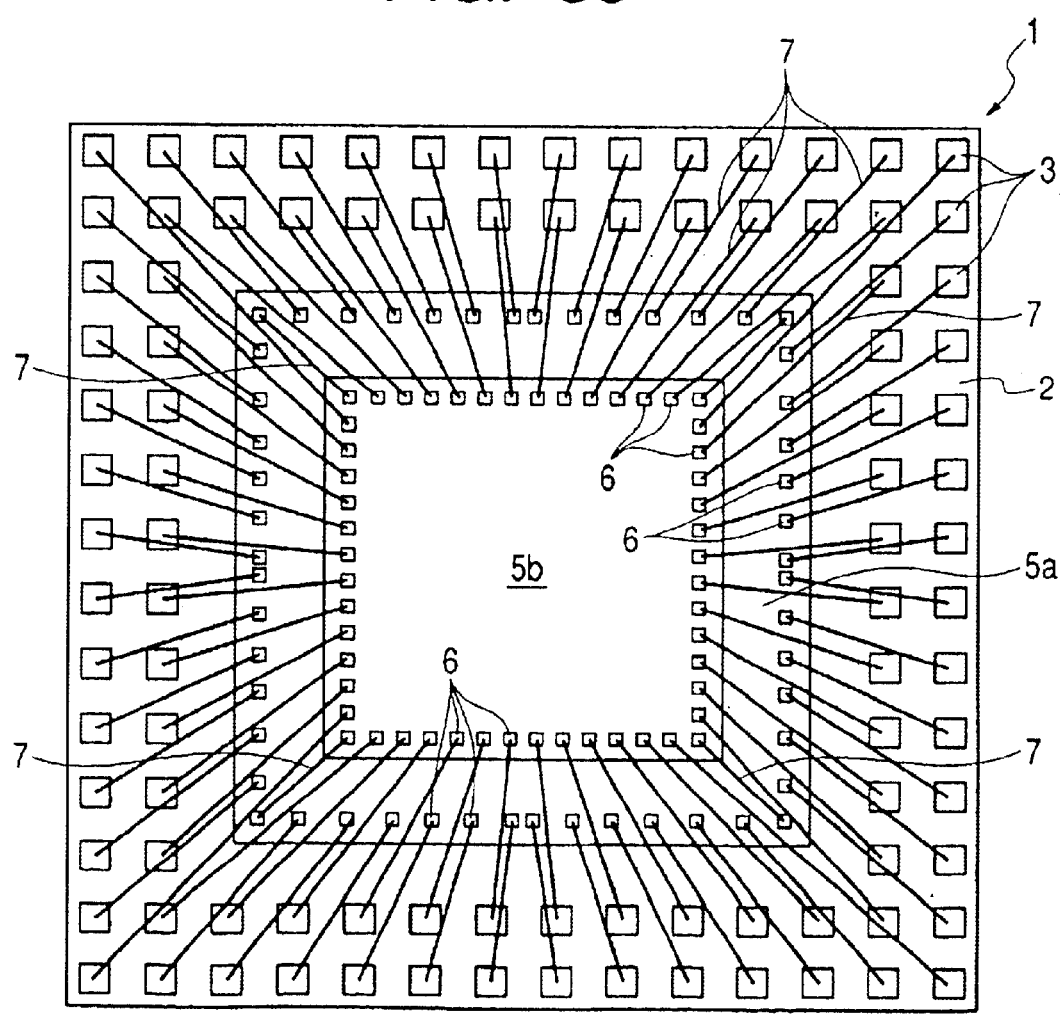
Figure 60:
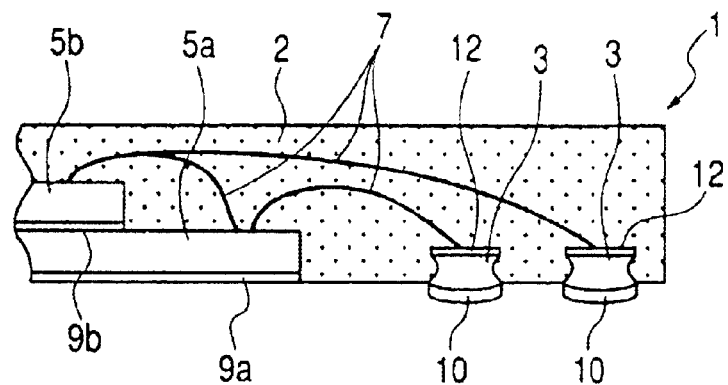
FIG. 60 is an enlarged sectional view of a part of the semiconductor device according to the modification of the fourth embodiment.

In this fourth embodiment reference has been made to an example in which each semiconductor element and compartments 3 are electrically connected with each other, but in case of stacking memory and a memory controlling microcomputer, semiconductor elements may be interconnected using wires 7, as shown in FIGS. 58, 59, and 60. In this case, not only the same effects as in the first embodiment can be obtained, but also wiring lines on a packaging substrate can be diminished because wiring lines to be formed on the packaging substrate are substituted by wires.

[Fifth Embodiment]

Figure 22:
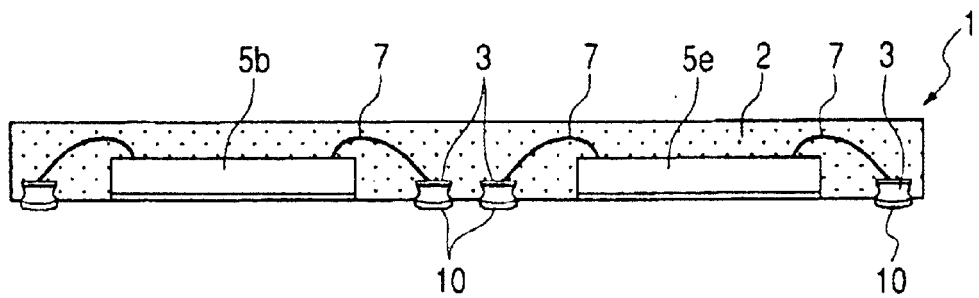
FIG. 22 is a schematic sectional view of a semiconductor device according to a fifth embodiment of the present invention.
Figure 23:
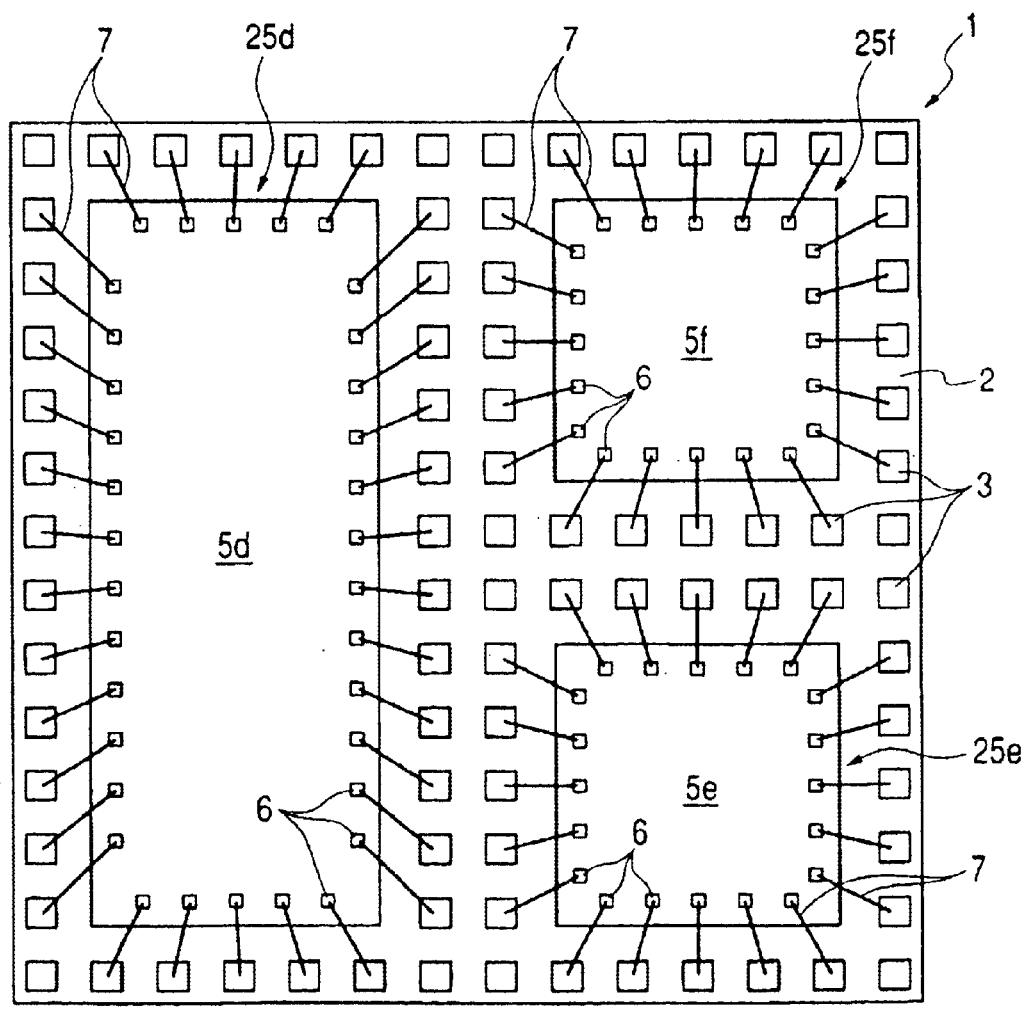
Figure 24:
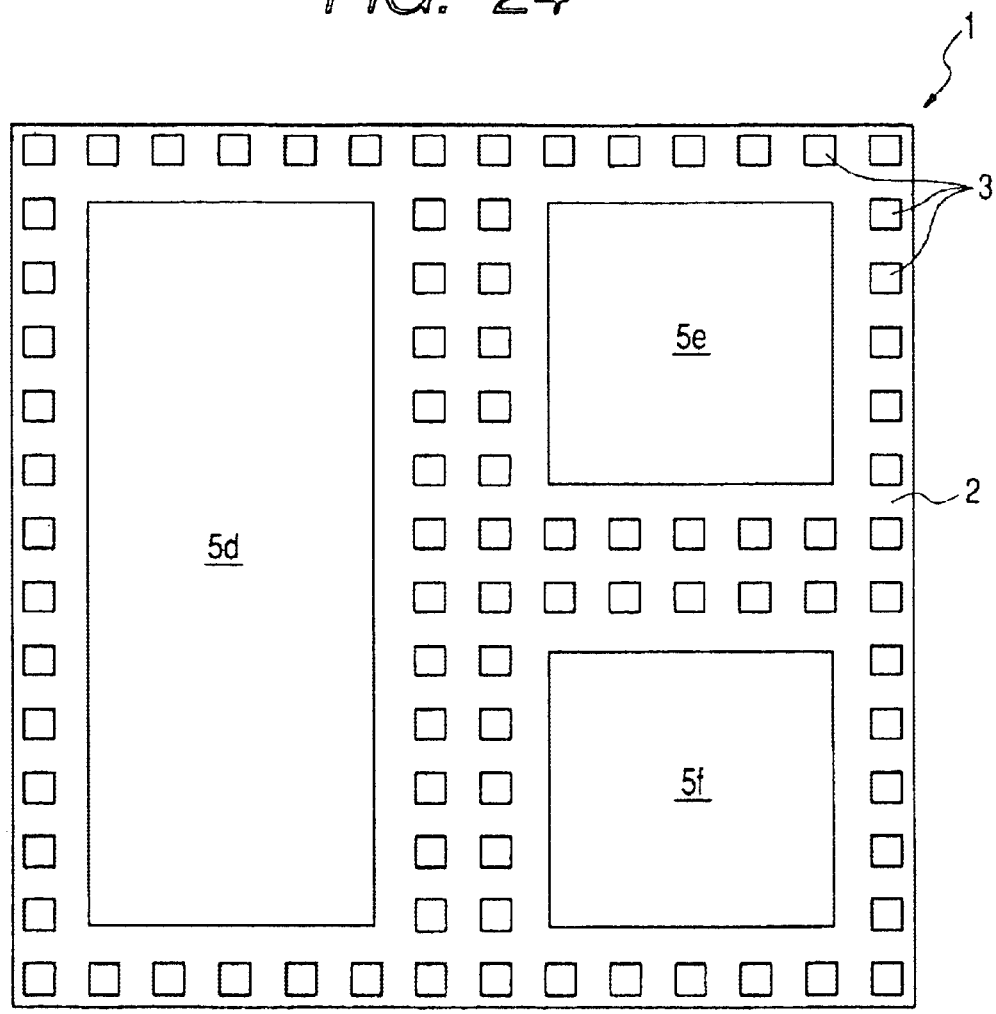
FIG. 24 is a bottom view of the semiconductor device of the fifth embodiment.
Figure 25:
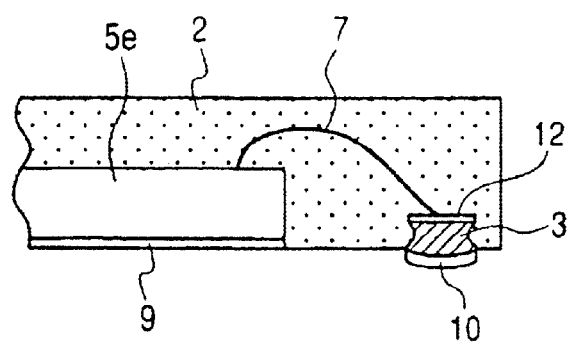
FIG. 25 is an enlarged sectional view of a part of the semiconductor device of the fifth embodiment.

FIGS. 22 to 26 are related to a semiconductor device according to a fifth embodiment of the present invention, of which FIG. 22 is a schematic sectional view of the semiconductor device, FIG. 23 is a schematic plan view of the semiconductor device in which external electrode terminals, etc. are seen through, FIG. 24 is a bottom view of the semiconductor device, FIG. 25 is an enlarged sectional view of a part of the semiconductor device, and FIGS. 26(a) to 26(h) are sectional views showing, step by step, a method of manufacturing the semiconductor device.

In the semiconductor device manufacturing method of the fourth embodiment, semiconductor elements are stacked to attain high integration, but in this fifth embodiment the present invention is applied to an example in which plural semiconductor elements are arranged planarly to attain high integration.

This fifth embodiment is different from the first embodiment in that, in the semiconductor manufacturing method of the first embodiment, at the stage of forming product-forming portions 21 on the substrate 20 in step (a), plural recesses are formed, then predetermined semiconductor elements are fixed respectively to bottoms of the plural recesses, and electrodes on each of the semiconductor elements and compartments arranged around the associated recess are connected together through conductive wires, as shown in FIG. 23. Subsequent steps are the same as in the first embodiment. As a result, as shown in FIGS. 22 to 25, there is produced a semiconductor device 1 on which are mounted a large, rectangular semiconductor element 5d and two square semiconductor elements 5e and 5f.

FIGS. 26(a) to (h) are sectional views showing, step by step, a method of manufacturing the semiconductor device of this fifth embodiment, which correspond to FIGS. 6(a) to (h) in the first embodiment. In FIGS. 26(a) to 26(h), adhesives 9a and 9b are omitted.

Figure 26A:
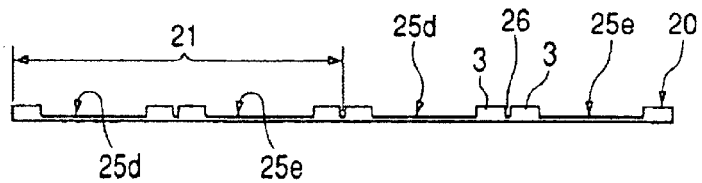
FIGS. 26(a) to 26(h) are sectional views showing, step by step, a method of manufacturing the semiconductor device of the fifth embodiment.

In this fifth embodiment, in step (a) for forming product-forming portions 21, plural recesses, for example three recesses 25d to 25f, are formed in a substrate 20, and plural compartments 3 are formed around each of the recesses. In FIG. 26(a) there are shown two recesses 25d and 25f, while in FIG. 23 there are shown three recesses 25d, 25e, and 25f. Compartments 3 are arranged in a row around each of the recesses.

Figure 26B:
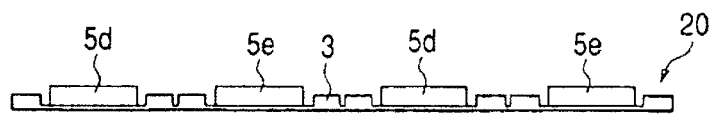

Next, in step (b) for chip bonding, as shown in FIG. 26(b), the semiconductor elements 5d to 5f are fixed to depressed bottoms of the recesses 25d to 25f respectively through an adhesive (not shown) as in the first embodiment.

Figure 26C:
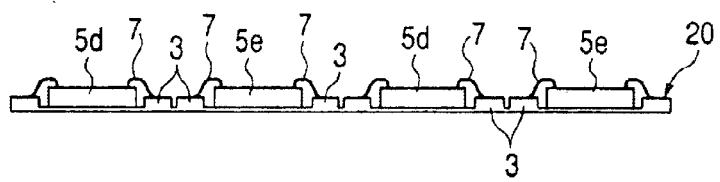

Then, in step (c) for wire bonding, as shown in FIG. 26(c), electrodes 6 on the semiconductor elements 5d to 5f and the compartments 3 are connected together through conductive wires 7 as in the first embodiment (see FIG. 23).

Figure 26D:
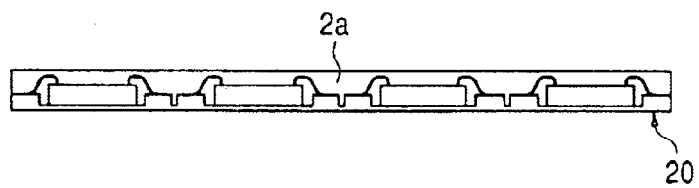
Figure 26E:
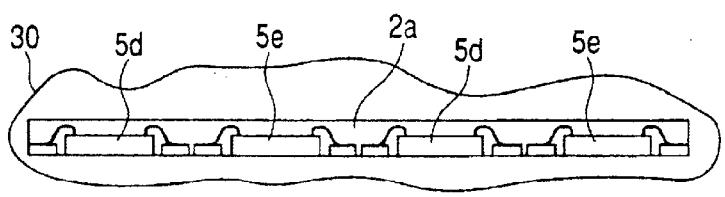
Figure 26F:
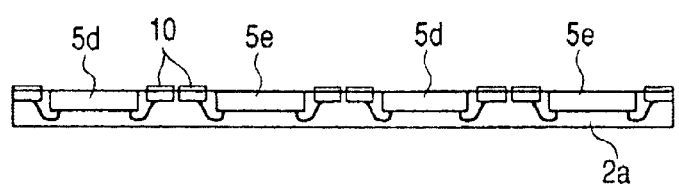
Figure 26G:
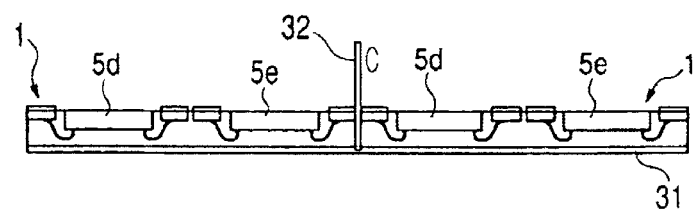
Figure 26H:
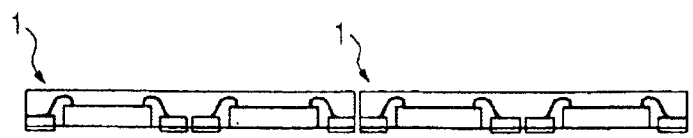

Next, in step (d) for forming a resin layer 2a, as shown in FIG. 26(d), a resin layer 2a is formed, using an insulating resin, on a main surface of the substrate 20 at a uniform thickness as in the first embodiment by means of a transfer molding apparatus (not shown). As a result, the semiconductor elements 5 and wires 7 are covered with resin closely without any clearance. Step (e) and subsequent steps are the same as in the first embodiment. In step (g), dicing is performed along boundaries of product-forming portions 21 by means of a dicing blade 32.

According to the semiconductor device manufacturing method of this fifth embodiment, not only there can be obtained the same effects as in the first embodiment, but also high integration can be attained by mounting plural semiconductor elements 5d to 5f.

Figure 61:
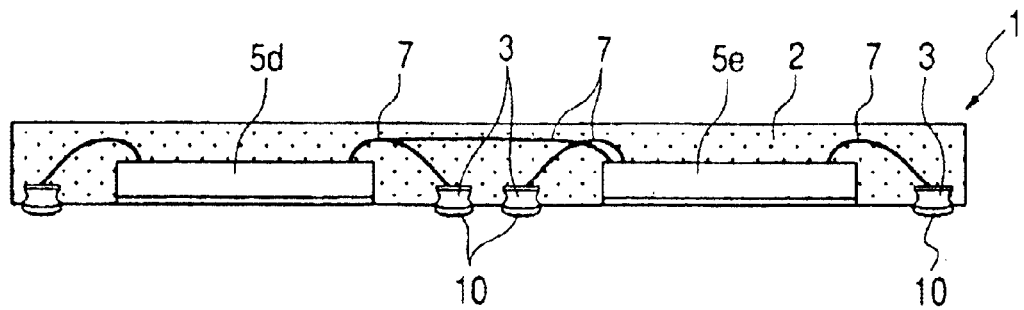
FIG. 61 is a schematic sectional view of a semiconductor device according to a modification of the fifth embodiment.
Figure 62:
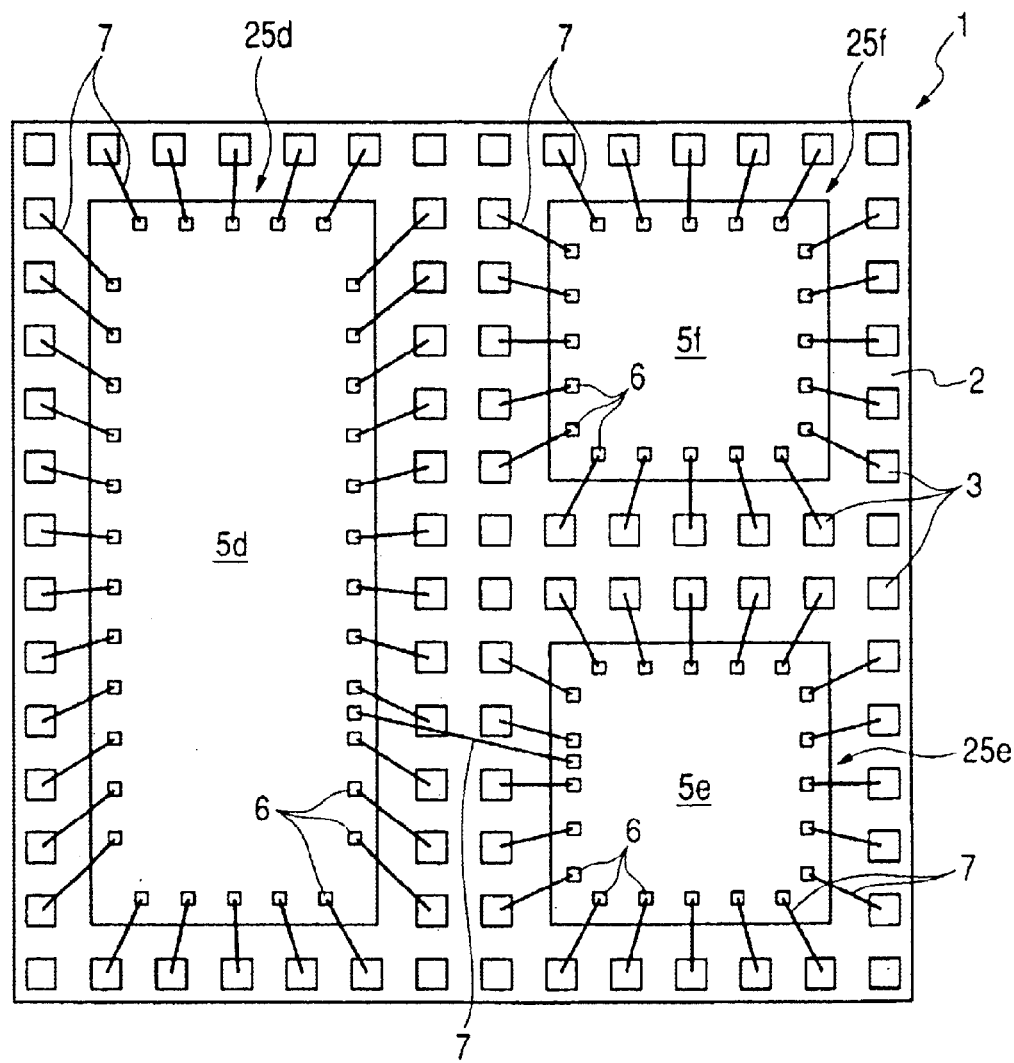
Figure 63:
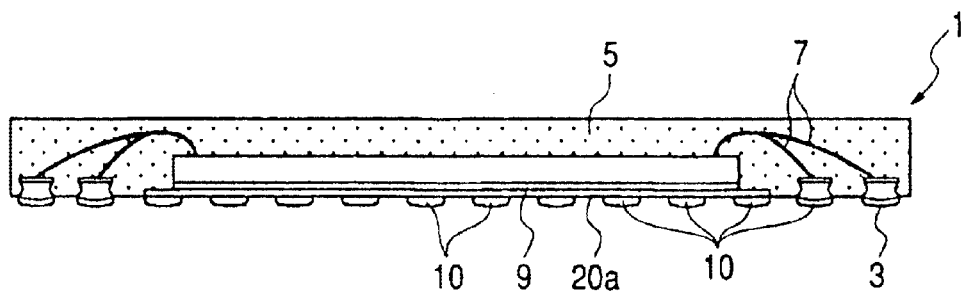
FIG. 63 is a schematic sectional view of a semiconductor device according to a modification of the seventh embodiment.

In this fifth embodiment reference has been made to an example in which semiconductor elements and compartments 3 are connected together electrically, but in case of arranging memory and a memory controlling microcomputer planarly, the semiconductor elements may be interconnected using wires 7, as shown in FIGS. 61 and 62. In this case, not only the same effects as in the first embodiment can be obtained, but also it is possible to diminish wiring lines on a packaging substrate because wiring lines to be formed on the packaging substrate are substituted by wires.

[Sixth Embodiment]

Figure 27:
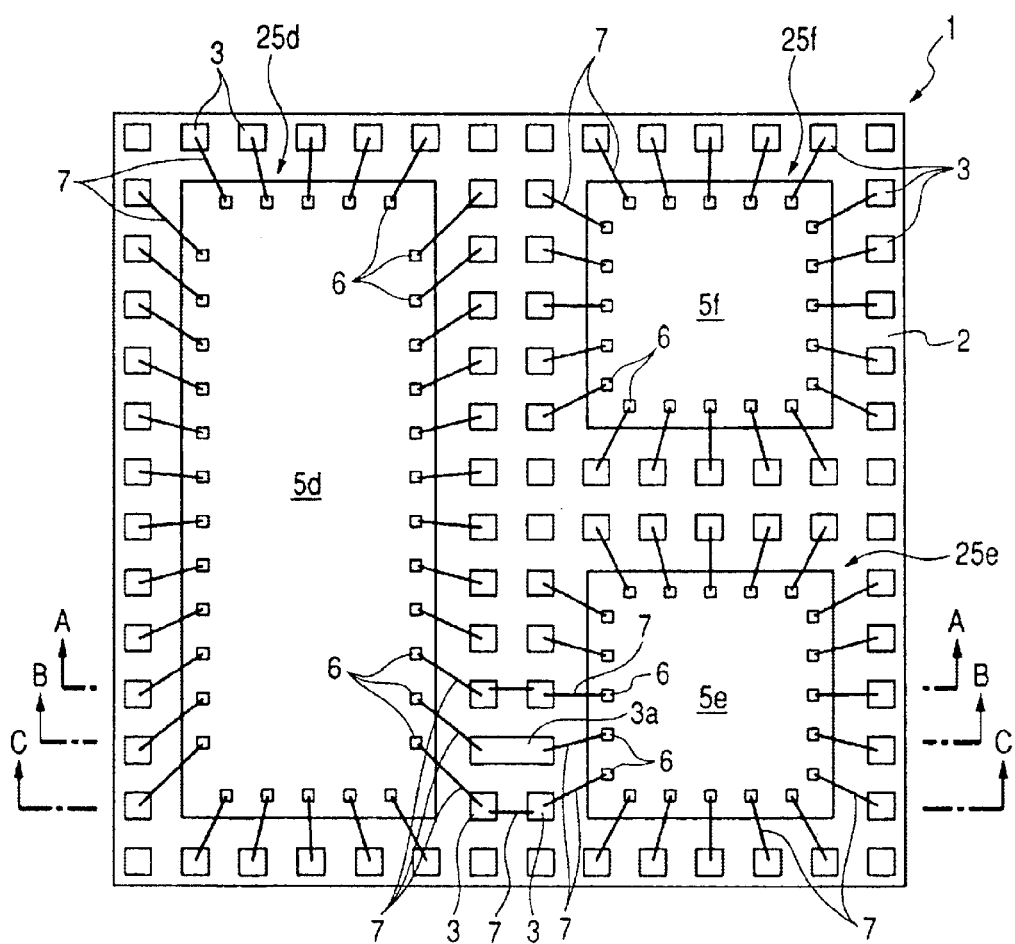
Figure 28:
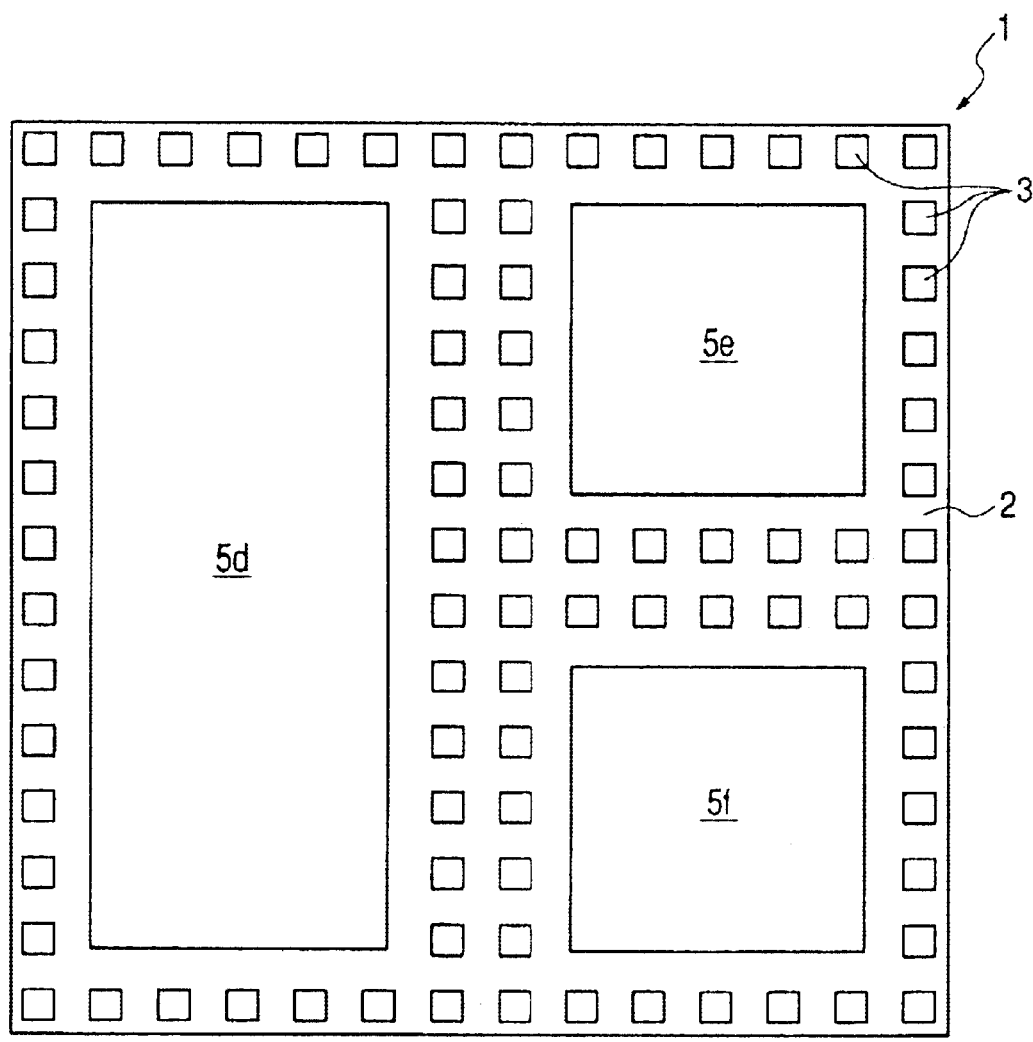
FIG. 28 is a bottom view of the semiconductor device of the sixth embodiment.
Figure 29A:
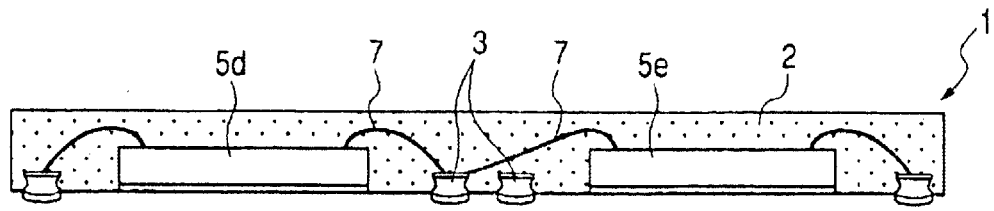
FIGS. 29(a) to 29(c) are schematic sectional views of the semiconductor device of the sixth embodiment.
Figure 29B:
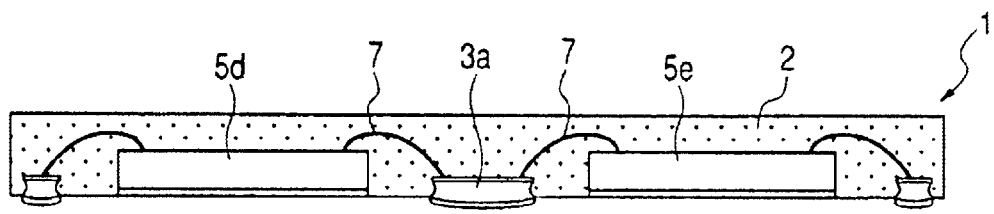
Figure 29C:
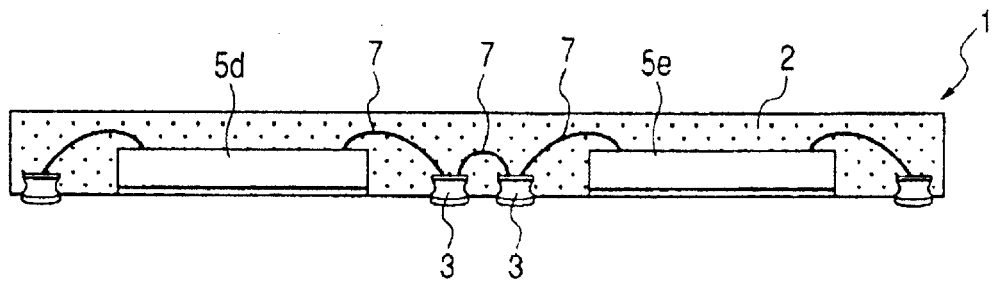

FIGS. 27 to 29 are related to a semiconductor device according to a sixth embodiment of the present invention, of which FIG. 27 is a schematic plan view of the semiconductor device wherein external electrode terminals, etc. are seen through, FIG. 28 is a bottom view of the semiconductor device, and FIGS. 29(a) to 29(c) are schematic sectional views of the semiconductor device.

According to this sixth embodiment, in a semiconductor device 1 with plural semiconductor elements mounted thereon, a wiring connection path can be selected freely by selecting compartments to which wires are to be connected, or compartments can be formed freely into a desired shape, for example, can be formed into a long or large or bent shape and a wiring connection path, including connecting wires, can be selected freely. It is this sixth embodiment that these techniques are applied to the semiconductor device 1 of the fifth embodiment.

In this sixth embodiment, as shown in FIG. 27, a partitioning portion between semiconductor elements 5d and 5e is formed as an elongated compartment 3a, and a wire 7, which is connected at one end thereof to electrodes 6 of the semiconductor elements 5d and 5e, is connected at an opposite end thereof to the elongated compartment 3a. It is also possible to pattern the compartment merely into a large compartment or a bent and extending compartment.

In FIG. 27, the connection of wires to compartments 3 located above and below the elongated compartment 3a takes a form such that a wiring connection path is selected freely by selecting compartments to which wires are to be connected.

FIGS. 29(a) to 29(c) comprises sectional views taken along lines A—A, B—B, and C—C in FIG. 27 which correspond to the above characteristic portions. FIG. 29(a) is a sectional view taken along line A—A in FIG. 27, showing a state in which plural wires 7 are connected to a predetermined compartment 3. More specifically, a wire 7 is connected at one end thereof to an electrode 6 on the semiconductor element 5d and another wire 7 is connected at one end thereof to an electrode 6 on the semiconductor element 5e, then opposite ends of both wires 7 are connected to a single compartment 3, whereby it becomes possible to make an electric connection of electrodes between different semiconductor elements mounted in the interior of the semiconductor device 1 and thus the freedom of wiring design increases.

FIG. 29(b) is a sectional view taken along line B—B in FIG. 27, showing a state in which a wire 7 is connected at one end thereof to an electrode on the semiconductor element 5d and another wire 7 is connected to an electrode 6 on the semiconductor element 5e, then opposite ends of both wires are connected respectively to ends of the elongated compartment 3a. With this arrangement, it is possible to make an electric connection of electrodes between different semiconductor elements mounted in the interior of the semiconductor device 1 and hence the freedom of wiring design increases.

According to the illustrated example, in the semiconductor device manufacturing method of the first embodiment and in step (a) for forming product-forming portions, a compartment located at a predetermined position is formed longer or larger than other compartments or is formed in a bent shape, then in the wire connecting step (c), plural wires are connected to the long or large or bent compartment (special compartment). The wires connected to the special compartment may be wires connected to one and same semiconductor element or may include wire connected to a different semiconductor element. In FIG. 27, wires connected to different semiconductor elements are connected to a single special compartment, i.e., the elongated compartment 3a.

FIG. 29(c) is a sectional view taken along line C—C in FIG. 27, in which a wire 7 is connected at one end thereof to an electrode 6 on the semiconductor element 5d and is connected at an opposite end thereof to a compartment 3, likewise, a wire 7 is connected at one end thereof to an electrode 6 on the semiconductor element 5e and is connected at an opposite end thereof to a compartment, then both such compartments 3 are connected with each other through a conductive wire (relay wire). With this arrangement, it is possible to make an electric connection of electrodes between different semiconductor elements mounted in the interior of the semiconductor device 1 and hence the freedom of wiring design increases.

According to this sixth embodiment, in addition to the effects obtained in the fifth embodiment, there is obtained an effect such that the freedom of wiring design increases and a standard substrate (lead frame) is employable as it is.

[Seventh Embodiment]

Figure 30:
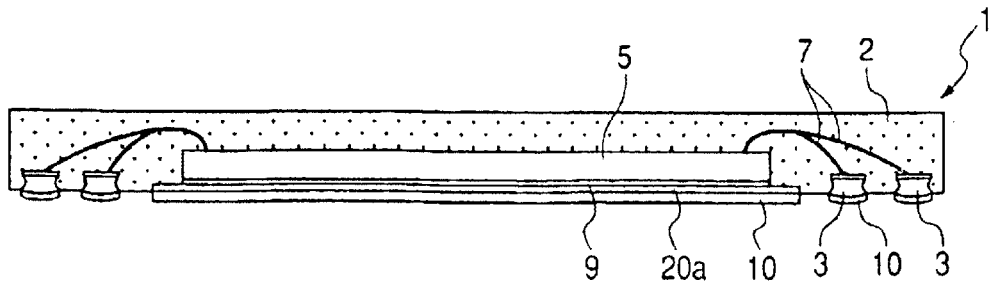
FIG. 30 is a schematic sectional view of a semiconductor device according to a seventh embodiment of the present invention.
Figure 31:
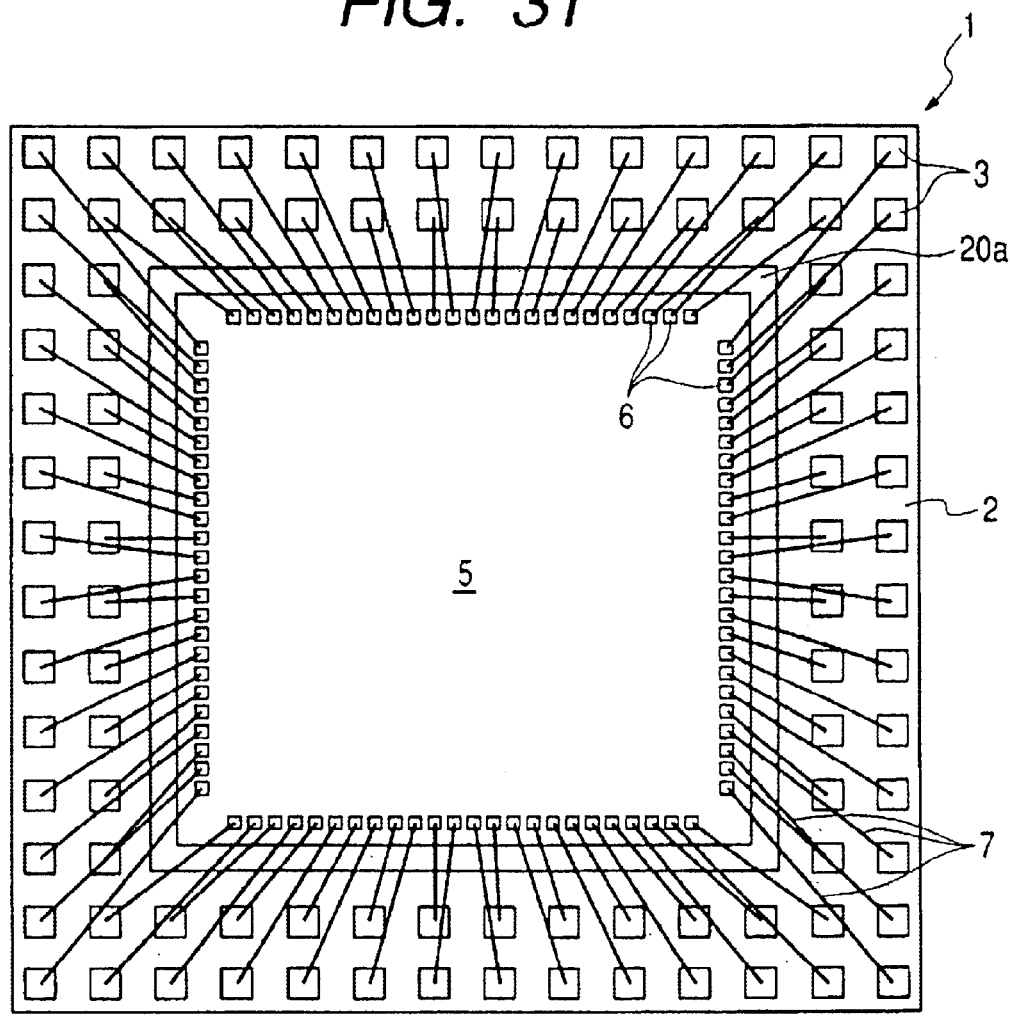
Figure 32:
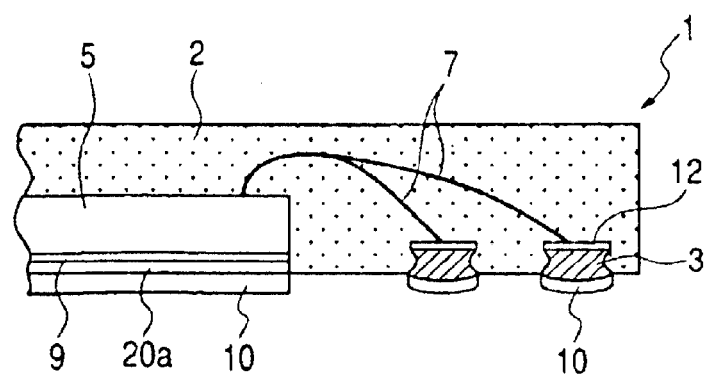
FIG. 32 is an enlarged sectional view of a part of the semiconductor device of the seventh embodiment.
Figure 33A:
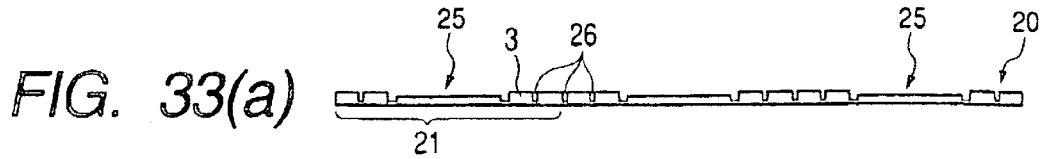
FIGS. 33(a) to 33(h) are sectional views showing, step by step, a method of manufacturing the semiconductor device of the seventh embodiment.
Figure 33B:
Figure 33C:
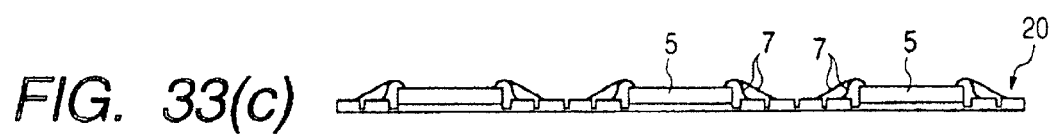
Figure 33D:
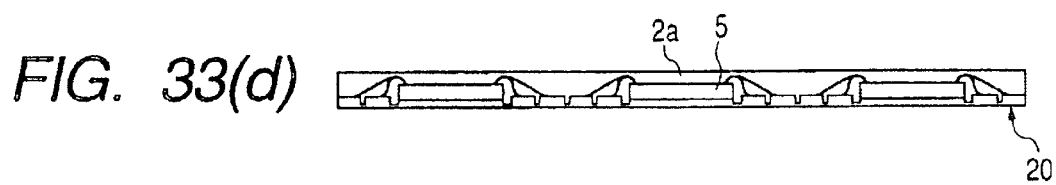
Figure 33E:
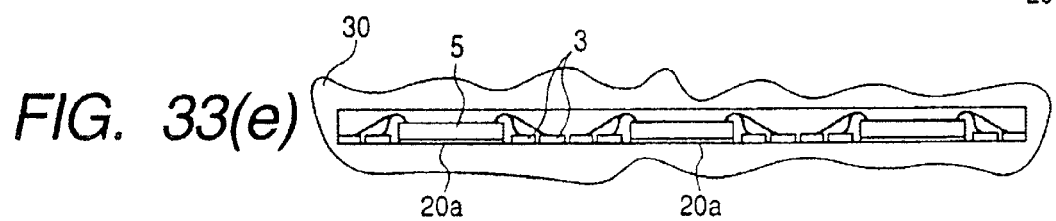
Figure 33F:
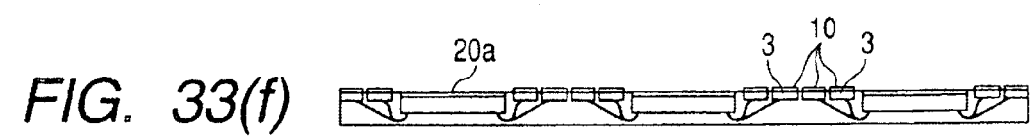
Figure 33G:
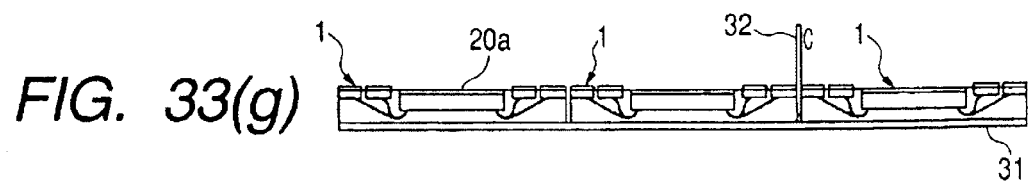
Figure 33H:
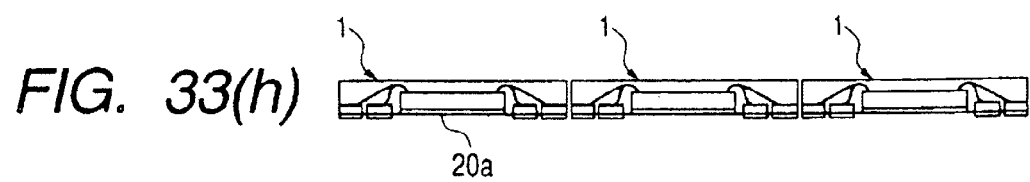
Figure 34:
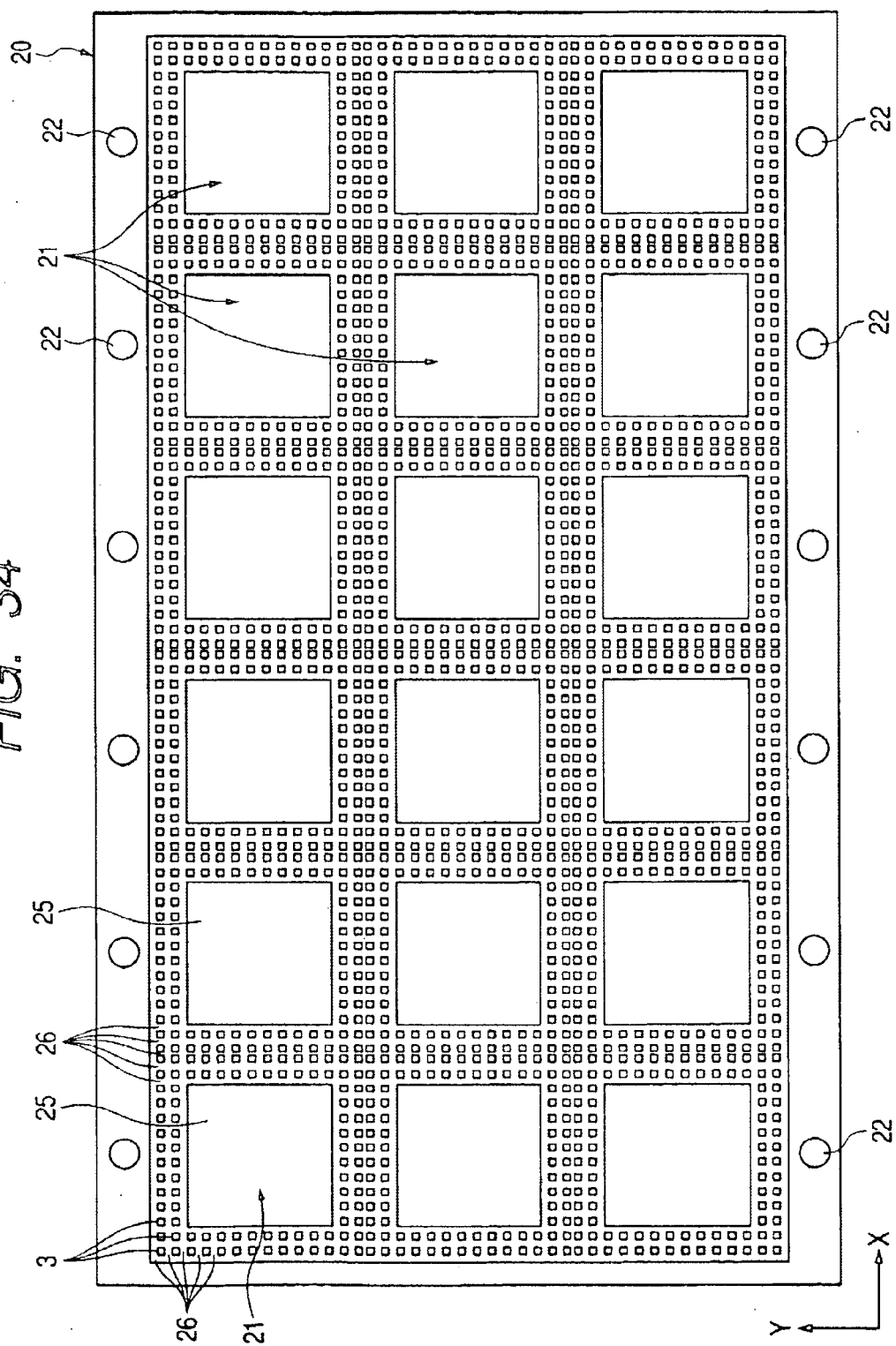
FIG. 34 is a plan view of a substrate used in manufacturing the semiconductor device of the seventh embodiment.

FIGS. 30 to 34 are related to a semiconductor device according to a seventh embodiment of the present invention, of which FIG. 30 is a schematic sectional view of the semiconductor device, FIG. 31 is a schematic plan view of the semiconductor device wherein external electrode terminals, etc. are seen through, FIG. 32 is an enlarged sectional view of a part of the semiconductor device, FIGS. 33(a) to 33(h) are sectional views showing, step by step, a semiconductor device manufacturing method, and FIG. 34 is a plan view of a substrate used in manufacturing the semiconductor device.

In this seventh embodiment there is produced a semiconductor device of a structure wherein a part of a substrate is allowed to remain thin on a back surface of a semiconductor element so that the back surface of the semiconductor element is covered with the remaining substrate portion. Even if a substrate portion several $\mu$m or so in thickness is allowed to remain on the back surface of a semiconductor element, the thickness thereof is smaller that the thickness of each compartment serving as an external electrode terminal. Therefore, even if there is a great difference in thermal expansion coefficient among the substrate portion which is a metallic portion, the semiconductor substrate such as a silicon substrate, and the resin which forms a resin layer, it is possible to diminish an internal stress induced between the substrate portion and the semiconductor element because the strength of the substrate portion is low. Further, in the case where the semiconductor element bonding adhesive present on a depressed bottom of the substrate is an electrically conductive adhesive, the substrate portion in question also serves as a heat spreader for dissipating heat generated from the semiconductor element to the exterior, thus permitting connection to pads on a packaging substrate.

The semiconductor device 1 of this seventh embodiment can be fabricated by modifying the semiconductor device manufacturing method of the first embodiment. FIGS. 33(a) to (h) are sectional views showing, step by step, a method of manufacturing the semiconductor device of this seventh embodiment, which correspond to FIGS. 6(a) to (h) in the first embodiment. In FIGS. 33(a) to 33(h), adhesives 9a and 9b are omitted.

In this seventh embodiment, in step (a) for forming product-forming portions 21, the depth of each recess 25 formed on the main surface of the substrate 20 is made smaller than the depth of each groove 26, and in step (e) for removing a predetermined thickness of the substrate back surface, compartments 3 are isolated from one another and are made independent electrically and a substrate portion 20a is allowed to remain thinner than each compartment 3 on the back surface of the semiconductor element 5, whereby there can be produced such a semiconductor device 1 as shown in FIGS. 30 to 32. The substrate portion 20a is bonded to the back surface of the semiconductor element 5 through the adhesive 9. The substrate portion 20a also serves as a protective plate for protecting the semiconductor element 5.

Figure 64:
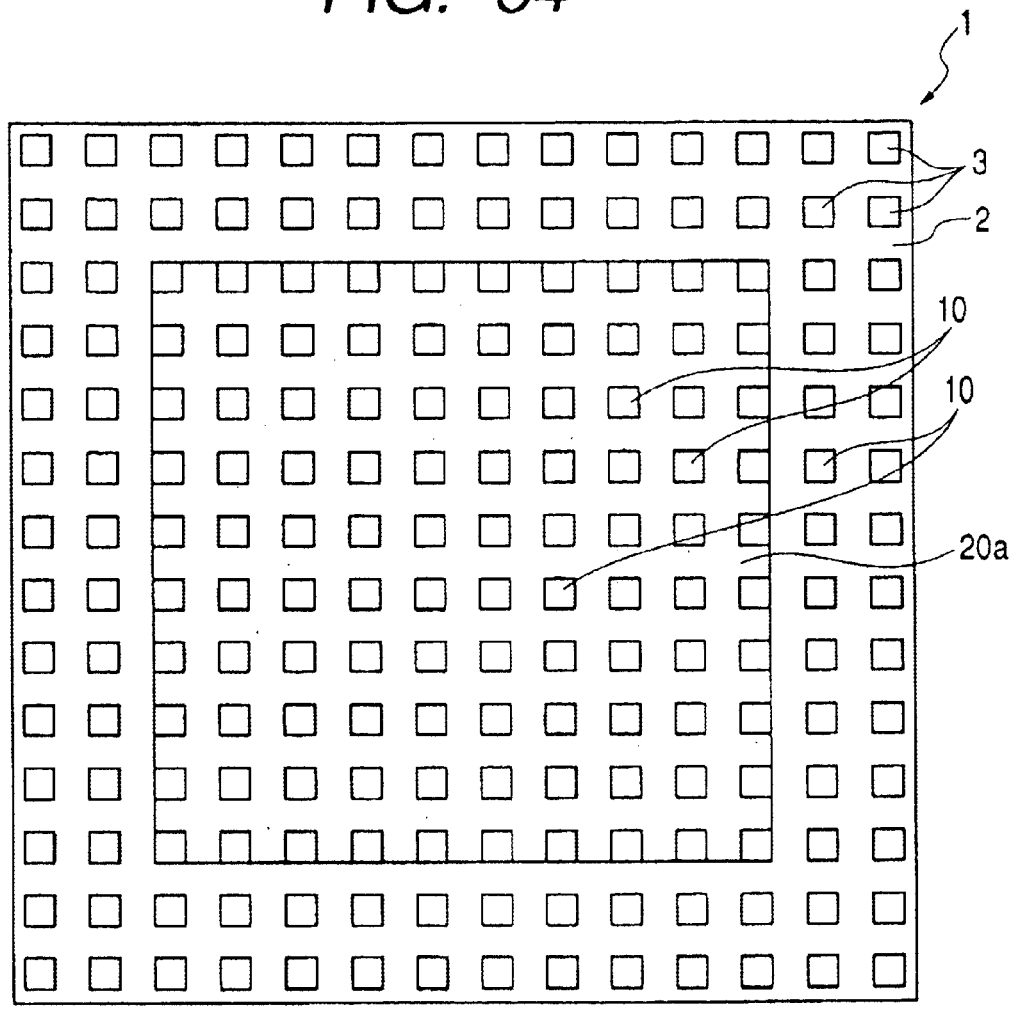
FIG. 64 is a bottom view of the semiconductor device of the modification of the seventh embodiment.
Figure 65:
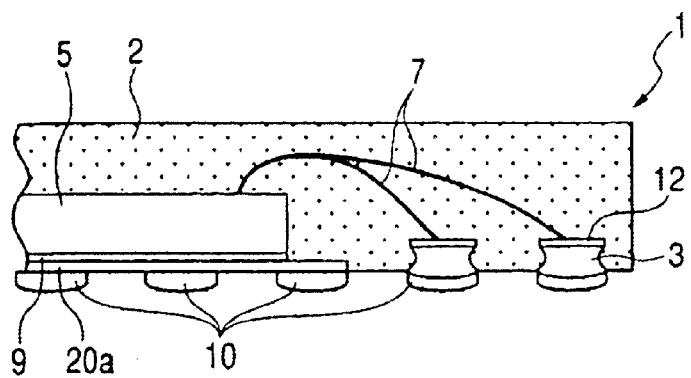
FIG. 65 is an enlarged sectional view of a part of the semiconductor device according to the modification of the seventh embodiment.

Although in this seventh embodiment the plating film 10 is formed on the whole surface of the substrate portion 20a, the plating film 10 on the substrate portion 20a may be formed in a lattice-like divided shape, as shown in FIGS. 64 and 65. If the plating film 10 is formed on the whole surface, there is a fear that the central portion of the plating film 10 may become thicker than the peripheral edge portion of the plating film due to a surface tension. But if the plating film 10 is formed in a lattice-like divided shape, it becomes possible to stabilize the thickness of the plating film. In the case where the plating film 10 is divided, it is preferable from the standpoint of improving the packaging reliability that land patterns on a packaging substrate on which the semiconductor device 1 is mounted through solder be also divided in accordance with the division of the plating film 10. More particularly, if on the whole surface of the substrate portion 20a there is disposed a land of a corresponding size, solder provided on the land becomes thicker at its central portion than at its peripheral portion due to a surface tension, resulting in that the soldering reliability is deteriorated. But the occurrence of such a problem can be prevented by dividing a land pattern on a packaging substrate.

[Eighth Embodiment]

Figure 35:
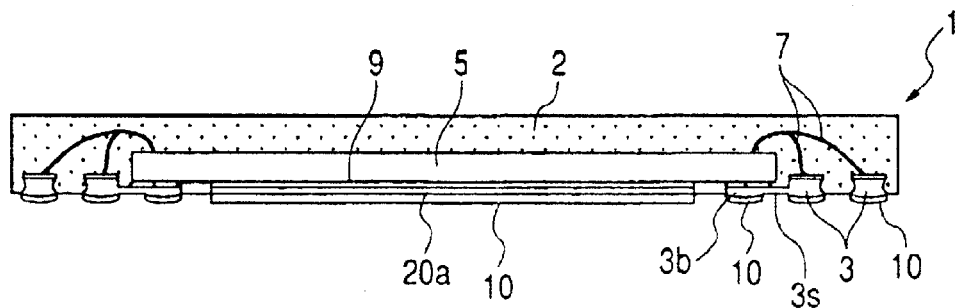
FIG. 35 is a schematic sectional view of a semiconductor device according to an eighth embodiment of the present invention.
Figure 36:
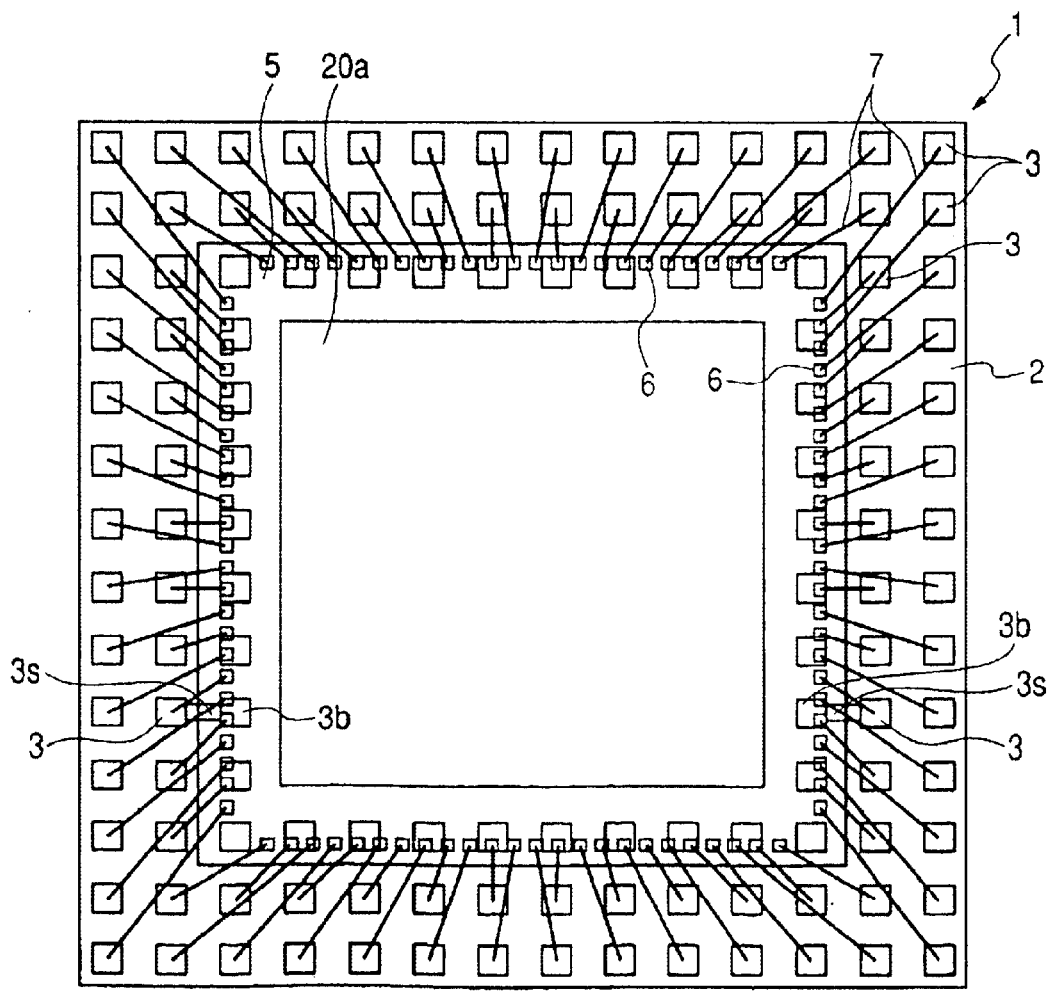
Figure 37:
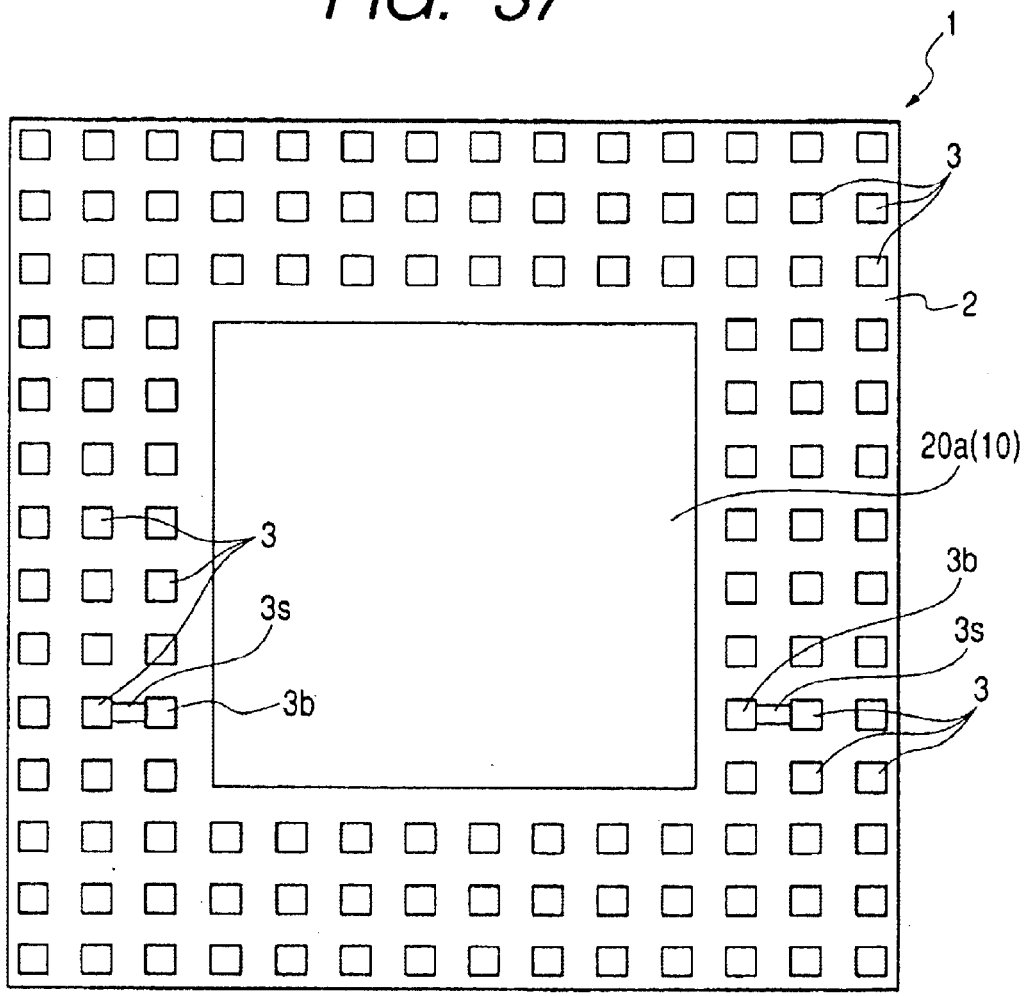
FIG. 37 is a bottom view of the semiconductor device of the eighth embodiment.
Figure 38:
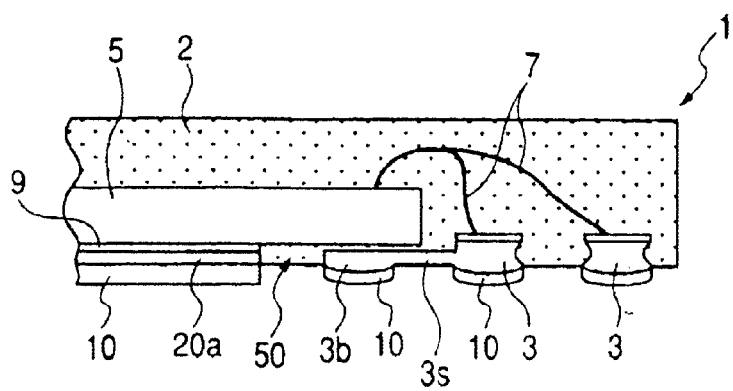
FIG. 38 is an enlarged sectional view of a part of the semiconductor device of the eighth embodiment.
Figure 39A:
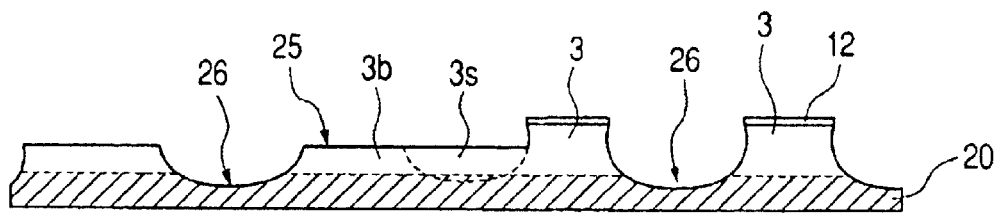
FIGS. 39(a) to 39(c) are sectional views showing, step by step, a method of manufacturing the semiconductor device of the eighth embodiment.
Figure 39B:
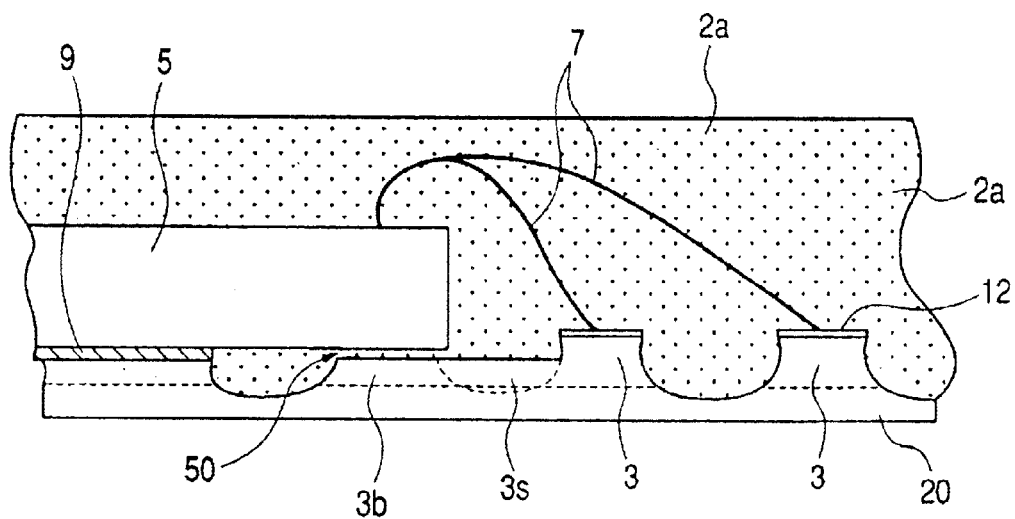
Figure 39C:
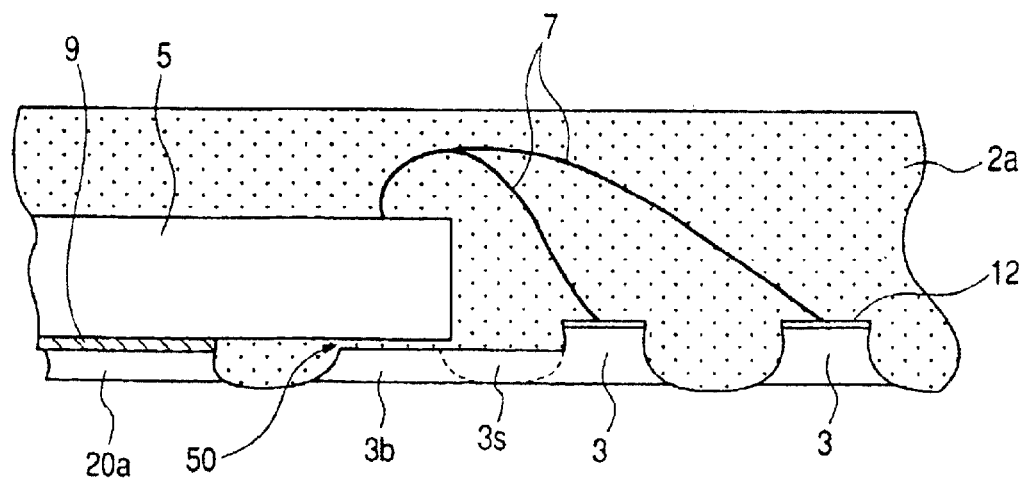

FIGS. 35 to 39 are related to a semiconductor device according to an eighth embodiment of the present invention, of which FIG. 35 is a schematic sectional view of the semiconductor device, FIG. 36 is a schematic plan view of the semiconductor device in which external electrode terminals, etc. are seen through, FIG. 38 is an enlarged sectional view of a part of the semiconductor device, and FIGS. 39(a) to 39(c) are sectional views showing, step by step, a method of manufacturing the semiconductor device.

In the semiconductor device of this eighth embodiment, as shown in FIGS. 35, 36, and 38, external electrode terminals are arranged on a back surface of a semiconductor element 5. Therefore, as shown in FIG. 37, compartments 3 are arranged (intra-region compartments 3b) also in the fixing (mounting) region of the semiconductor element, and the intra-region compartments 3b and compartments 3 deviated from the fixing region of the semiconductor element are connected with each other through connections 3s. As shown in FIG. 37, the intra-region compartments 3b and the compartments 3 interconnected through the connections 3s are provided one set on each of right and left sides. Upper surfaces of the portions extending from the connections 3s to the intra-region compartments 3b form a depressed bottom, as shown in FIG. 38.

FIGS. 39(a) to (c) are schematic sectional views showing, step by step, a portion of a semiconductor device manufacturing method. In step (a) for forming product-forming portions 21 in the semiconductor device manufacturing method of this eighth embodiment, as shown in FIG. 39(a), intra-region partitions 3b are formed also in a bottom portion of a recess 25 which serves as a fixing region of the semiconductor element 5, and there are formed connections 3s for connecting the intra-region compartments 3b with compartments 3 deviated from the semiconductor element fixing region. In other words, a portion of compartments deviated from the semiconductor element fixing region are formed so as to extent up to the inside of the semiconductor element fixing region. Additionally, a surface portion of the semiconductor element fixing region is flush with the depressed bottom. A planar pattern of each integral set of intra-region compartment 3b, connection 3s, and compartment 3 is as shown in FIG. 37. The hatched region in FIG. 39(a) is a portion to be removed by etching.

Next, as shown in FIG. 39(b), the semiconductor element 5 is fixed to the depressed bottom through an adhesive 9. In this state a gap 50 is developed between the depressed bottom and the semiconductor element 5 because the adhesive 9 is not interposed between the intra-region compartments 3b and the semiconductor element 5. In FIG. 39(b), the portion below the dotted line is a portion to be removed by etching.

Next, as shown in FIG. 39(b), electrodes on the semiconductor element 5 and compartments 3 are connected together through conductive wires. In this wire connecting step, wires 7 are connected also to the compartments 3 which are connected through connections 3s to the intra-region compartments 3b.

Then, as shown in FIG. 39(b), a resin layer 2a is formed on a main surface of a substrate 20 by transfer molding so as to cover the semiconductor element 5 and wires 7. The resin layer 2a is injected also into the gap 50 and the semiconductor element 5 is isolated from the intra-region compartments 3b and connections 3s through the resin layer 2a.

Next, as shown in FIG. 39(c), a back surface of the substrate 20 is removed a predetermined thickness by etching. As a result, each compartment 3 is separated and a substrate portion 20a remains thin also on the back surface of the semiconductor element 5. At this time, the intra-region compartments 3b and predetermined compartments 3 remain connected by connections 3s. Subsequent steps are the same as in the seventh embodiment. In this way there can be produced a semiconductor device 1 of the structure shown in FIGS. 35 to 38 in which external electrode terminals are arranged also on the back surface of the semiconductor element.

In the semiconductor device 1 of this eighth embodiment there is an actual advantage that the wiring design of a packaging substrate becomes easier. Besides, it is possible to reduce the package size.

Figure 66:
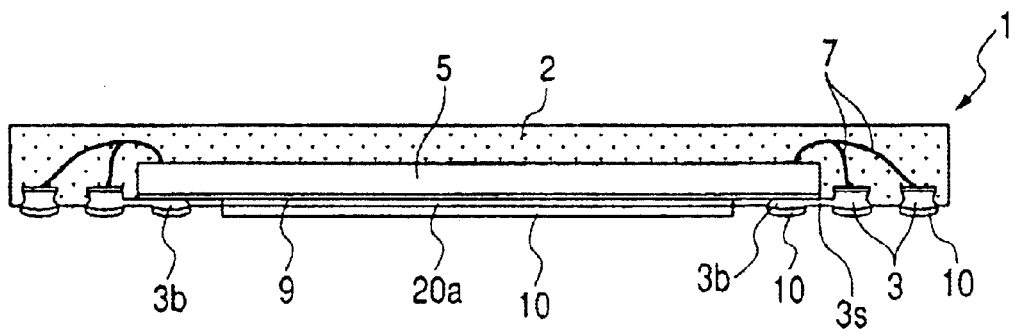
FIG. 66 is a schematic sectional view of a semiconductor device according to a first modification of the eighth embodiment.
Figure 67:
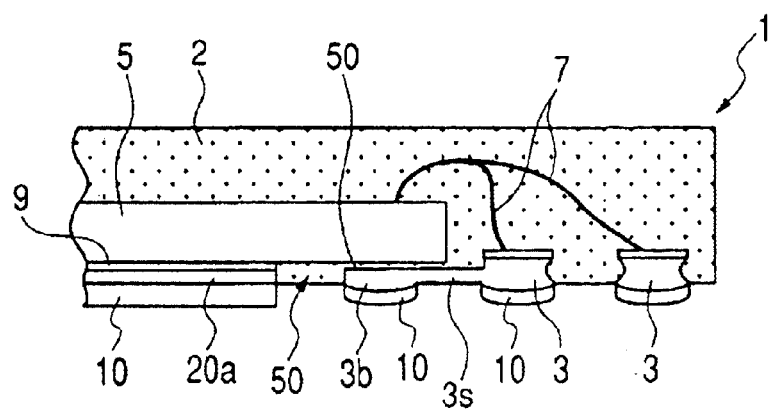
FIG. 67 is an enlarged sectional view of a part of the semiconductor device according to the first modification of the eighth embodiment.
Figure 68:
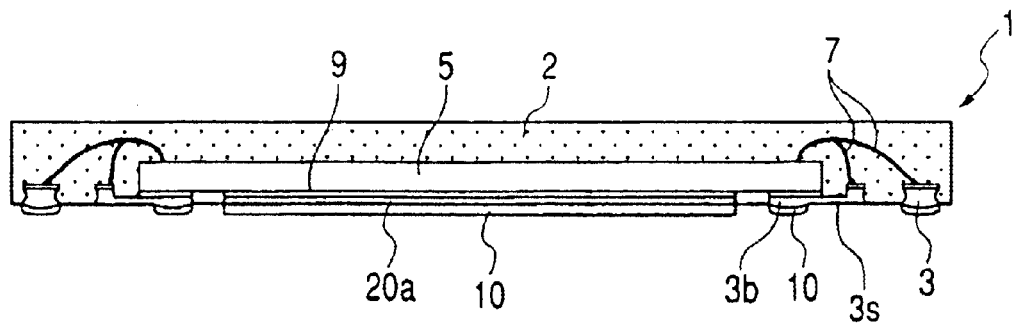
FIG. 68 is a schematic sectional view of a semiconductor device according to a second modification of the eighth embodiment.
Figure 69:
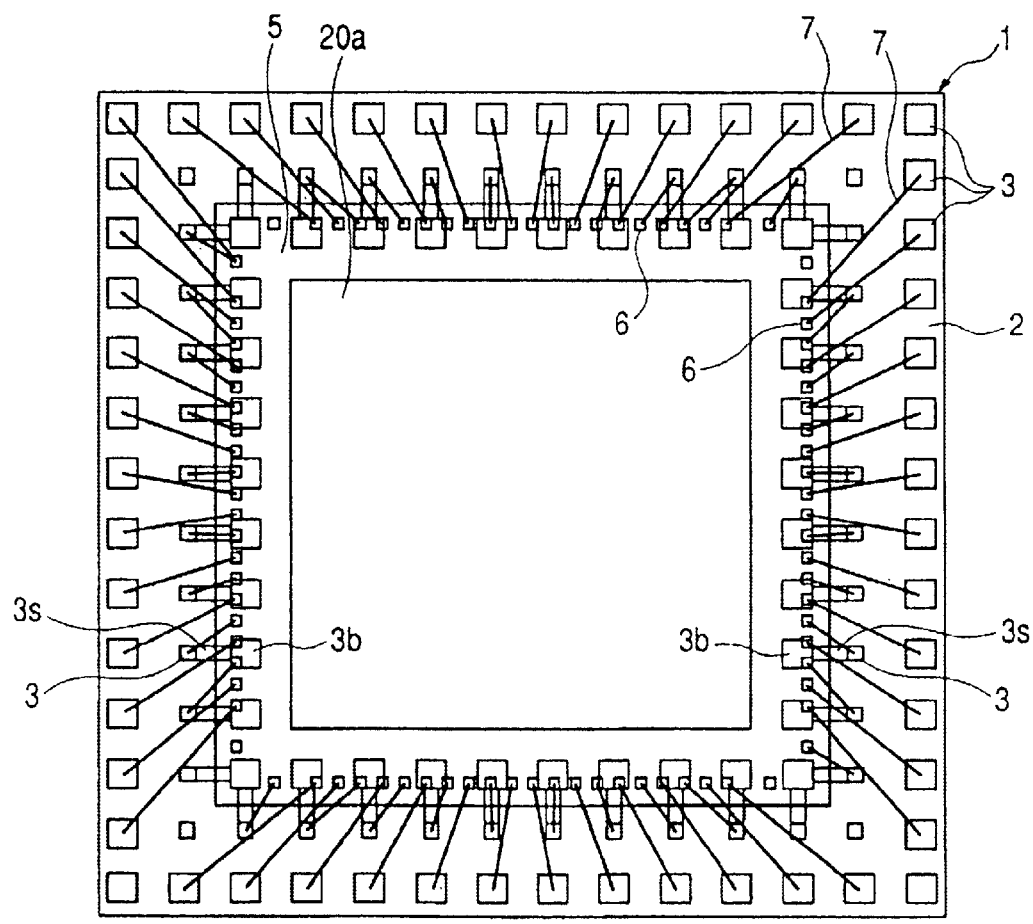
FIG. 69 is a schematic plan view of the semiconductor device of the second modification of the eighth embodiment.
Figure 70:
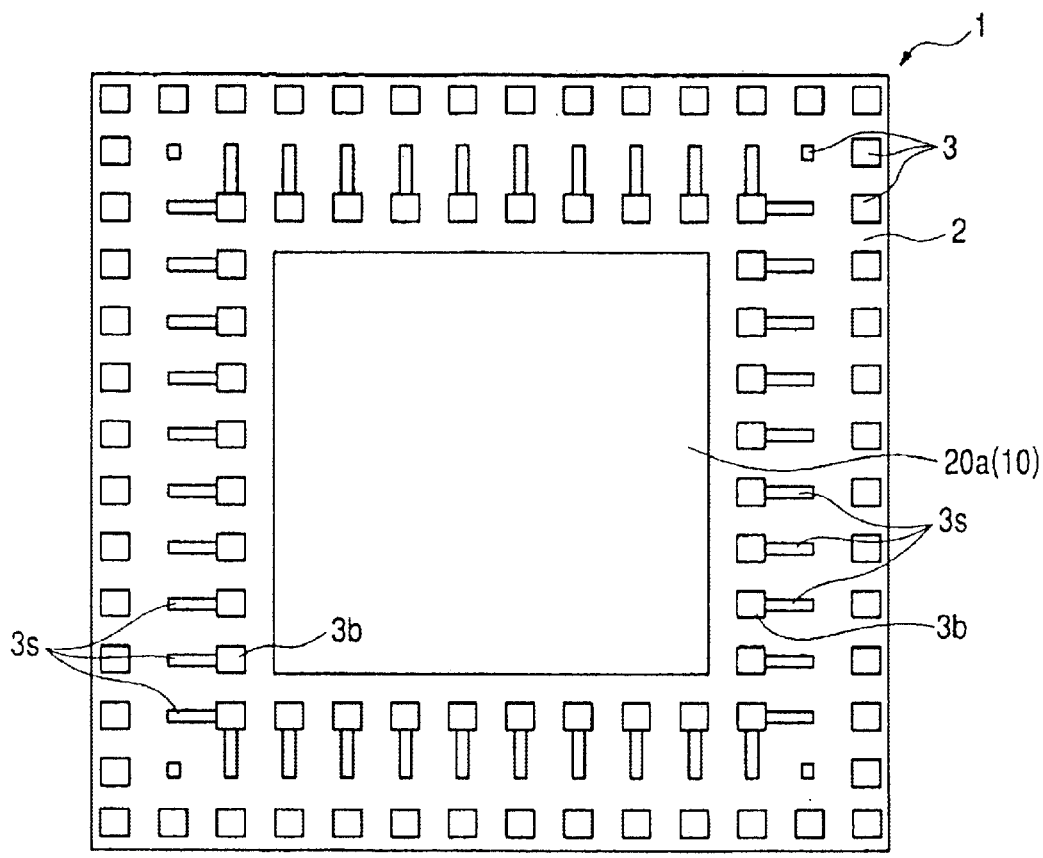
FIG. 70 is a bottom view of the semiconductor device of the second modification of the eighth embodiment.
Figure 71:
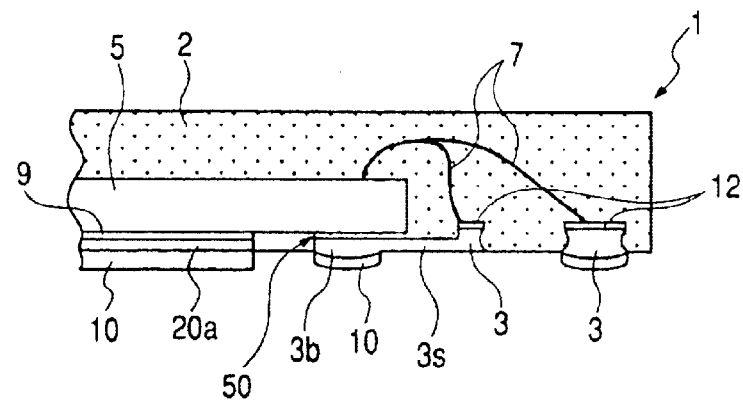
FIG. 71 is an enlarged sectional view of a part of the semiconductor device according to the second modification of the eighth embodiment.
Figure 72:
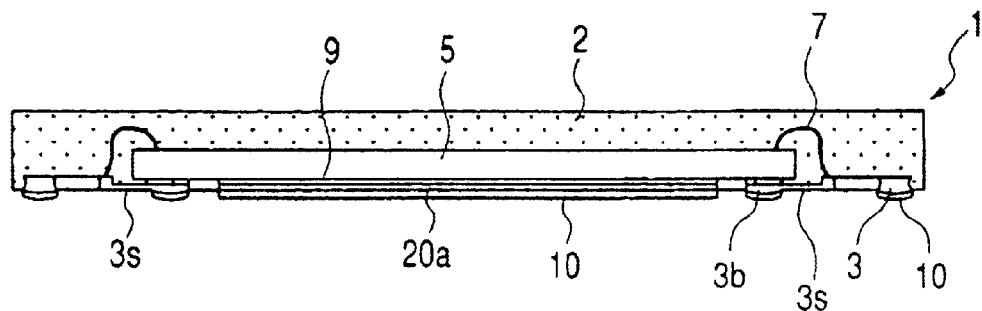
FIG. 72 is a schematic sectional view of a semiconductor device according to a third modification of the eighth embodiment.
Figure 73:
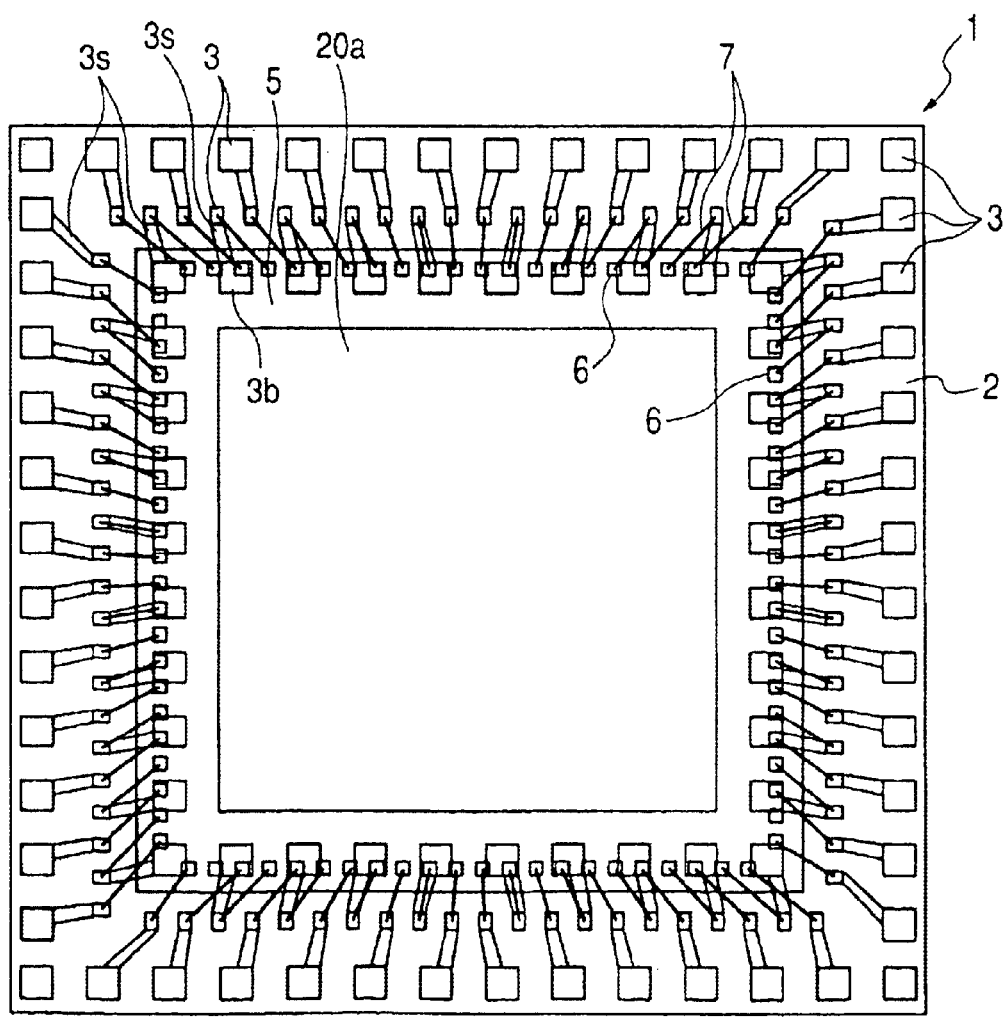
Figure 74:
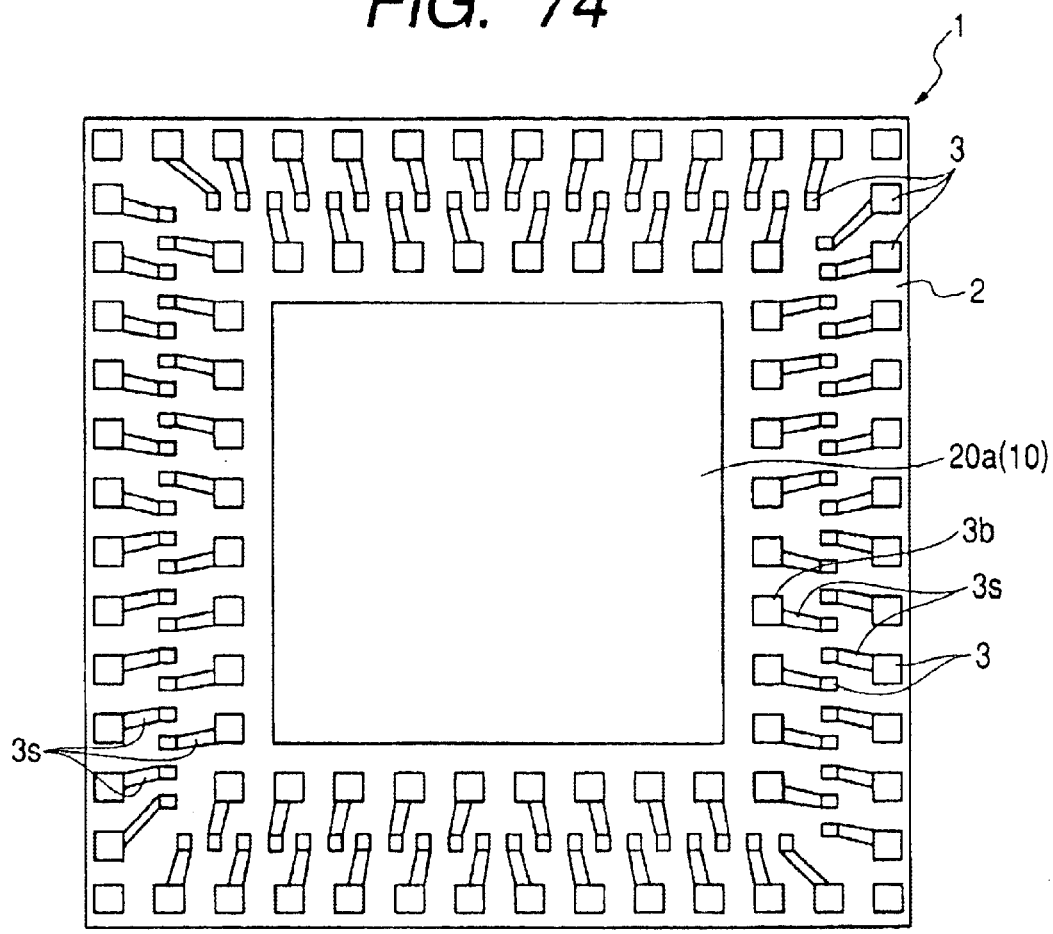
FIG. 74 is a bottom view of the semiconductor device of the third modification of the eighth embodiment.
Figure 75:
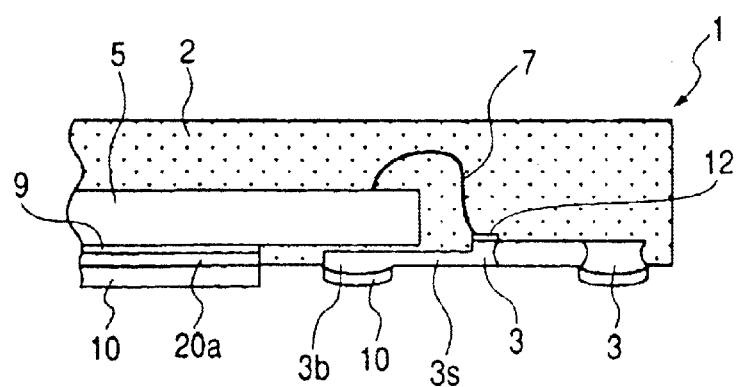
FIG. 75 is an enlarged sectional view of a part of the semiconductor device according to the third modification of the eighth embodiment.

In this eighth embodiment the semiconductor element 5 is isolated from the intra-region compartments 3b and connections 3s through the resin layer 2a, but if an insulating adhesive (e.g., tape) is used as the adhesive 9, as shown in FIGS. 66 and 67, the intra-region compartments 3b and the substrate portion 20a may be bonded at a time. In this case, the semiconductor element 5 is supported b the intra-region compartments 3b, so that the substrate portion 20a may be omitted if a high heat dissipating property is not required.

Although in this eighth embodiment reference has been made to such an example as shown in FIG. 37 wherein the intra-region compartments 3b and compartments 3 interconnected through connections 3s are provided one set on each of right and left sides, as shown in FIG. 37, the portion just under the portion of each compartment 3 to which wire 7 is connected may be formed to have a size permitting connection thereto of wire 7 without utilizing it for connection with a packaging substrate, as shown in FIGS. 68 to 71, whereby it is possible to shrink a plane area of the semiconductor device 1.

Figure 76:
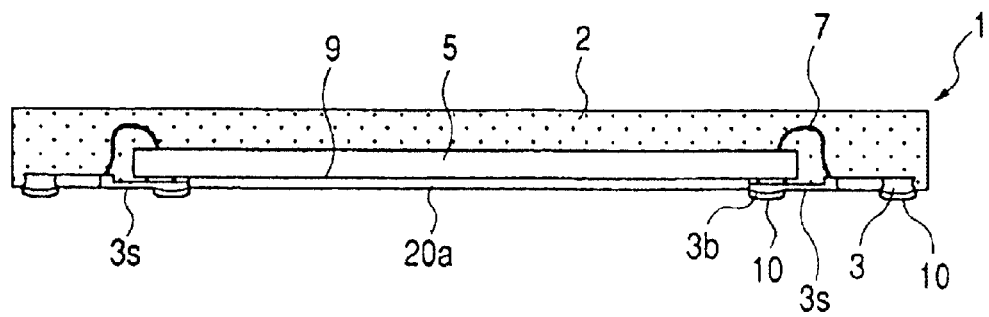
FIG. 76 is a schematic sectional view of a semiconductor device according to a fourth modification of the eighth embodiment.
Figure 77:
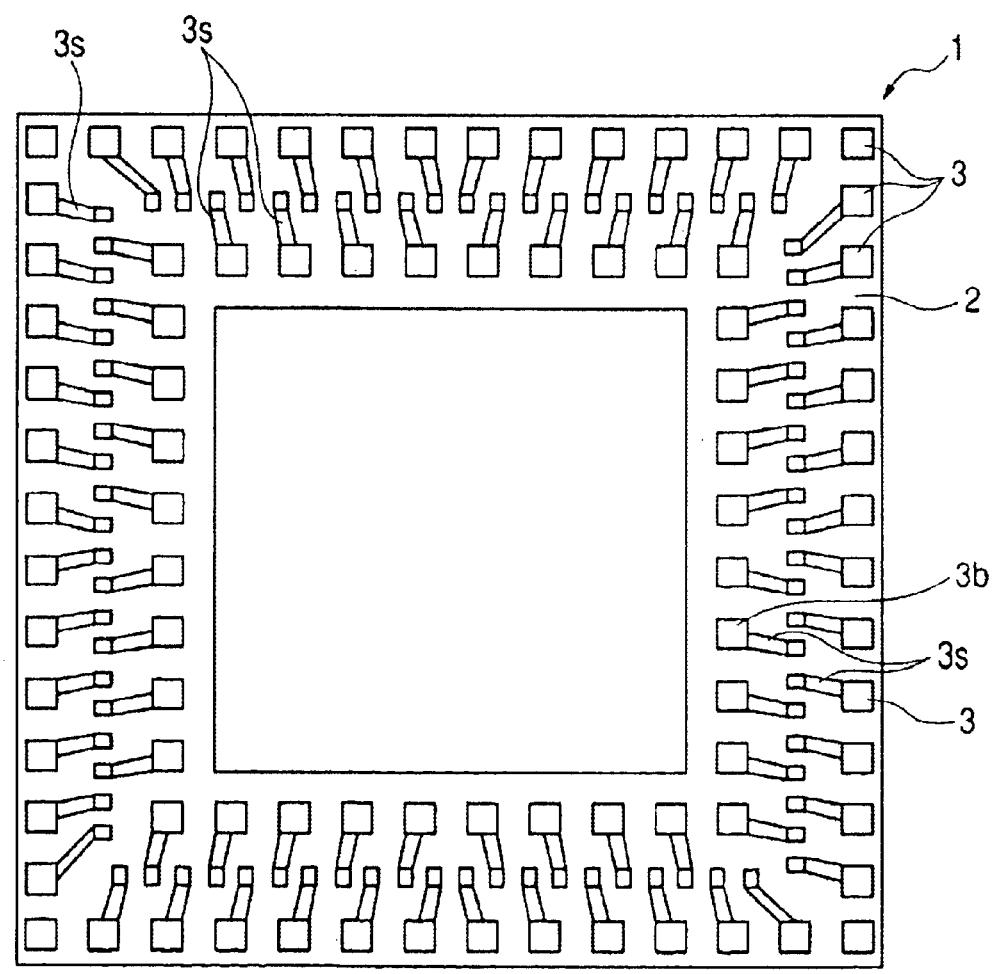
FIG. 77 is a bottom view of the semiconductor device of the fourth modification of the eighth embodiment.
Figure 78:
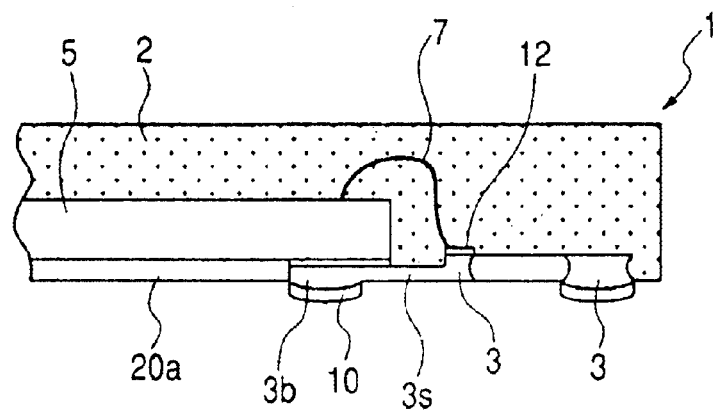
FIG. 78 is an enlarged sectional view of a part of the semiconductor device according to the fourth modification of the eighth embodiment.
Figure 79:
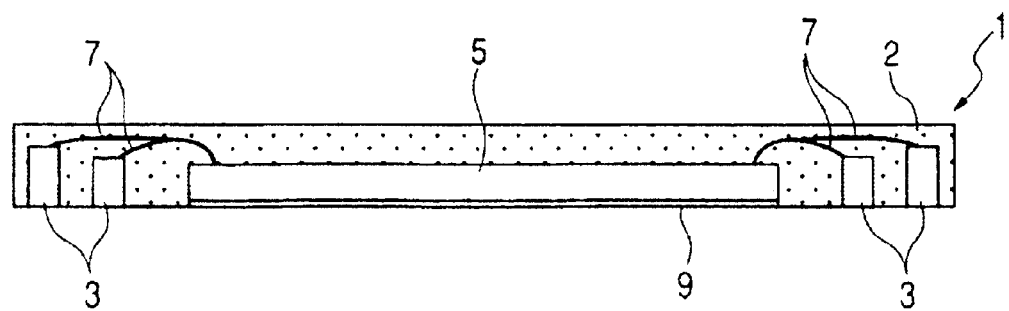
FIG. 79 is a schematic sectional view of a semiconductor device according to a modification of a thirteenth embodiment.
Figure 80:
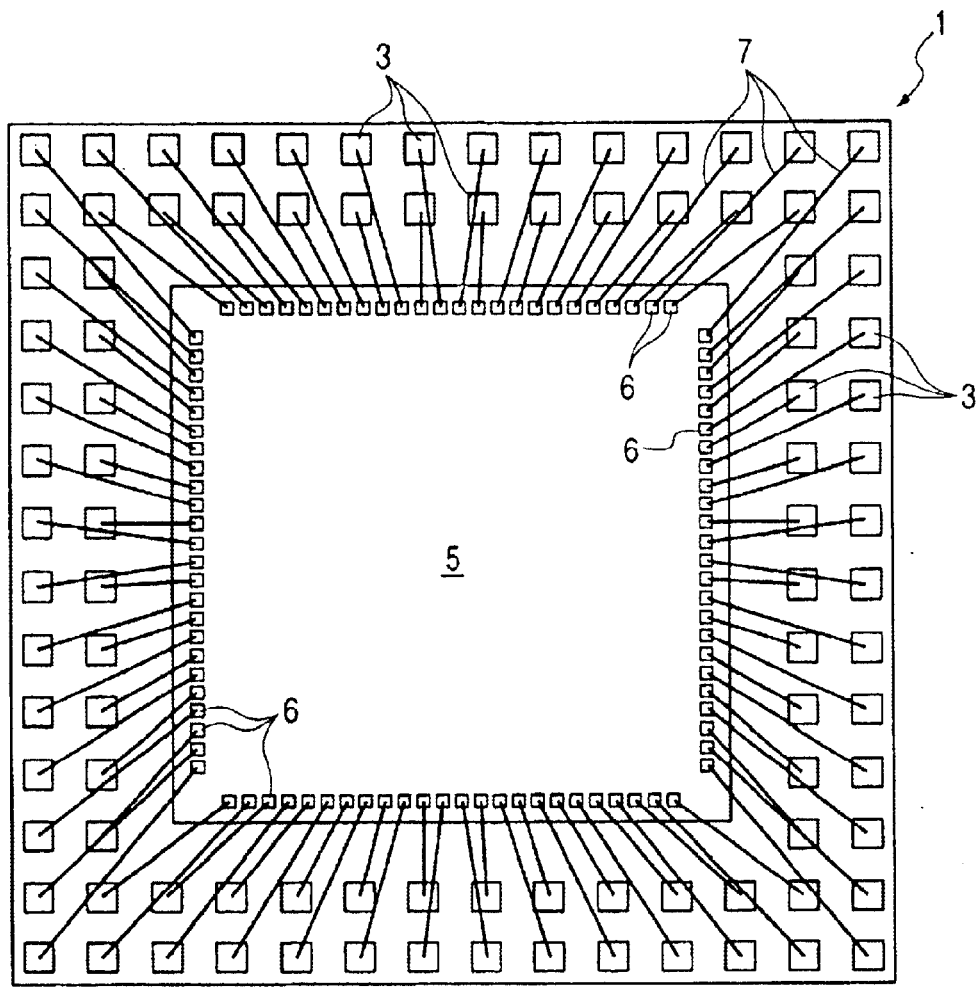
Figure 81:
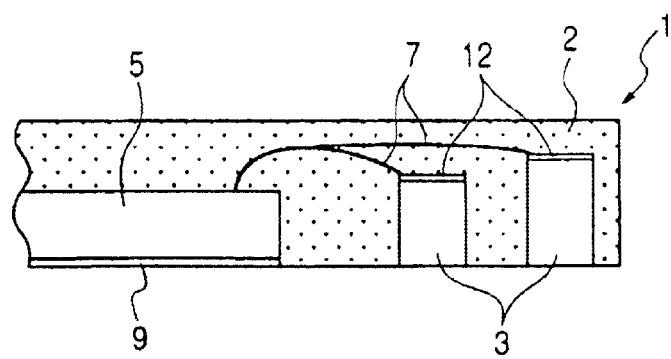
FIG. 81 is an enlarged sectional view of a part of the semiconductor device according to the modification of the thirteenth embodiment.

Moreover, as shown in FIGS. 72 to 75, if the wire-connected portions are extended from the outer compartments 3 toward the semiconductor device 5, the wires 7 become almost uniform in length and hence it is possible to stabilize wiring. FIGS. 76 to 78 show a like example in which the substrate portion 20a is omitted.

[Ninth Embodiment]

Figure 40:
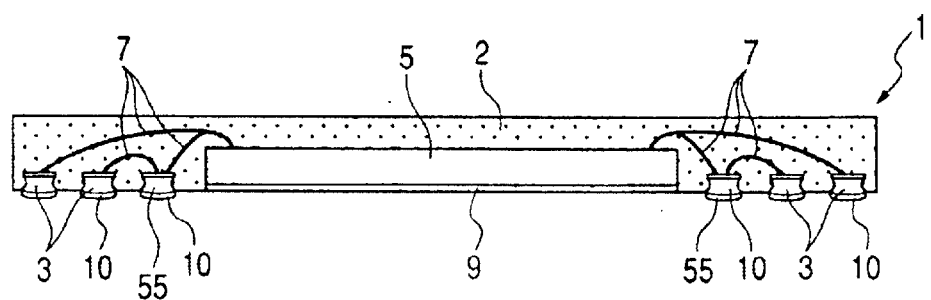
FIG. 40 is a schematic sectional view of a semiconductor device according to an ninth embodiment of the present invention.
Figure 41:
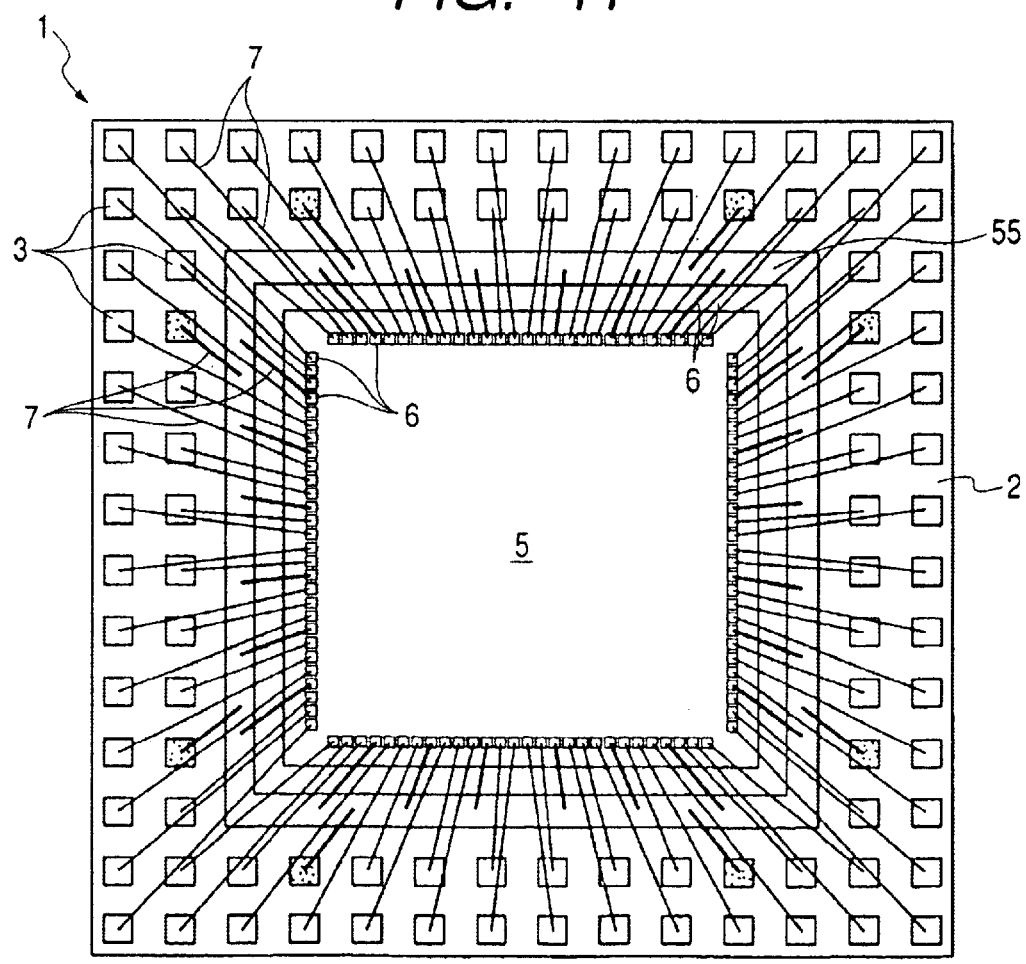
Figure 42:
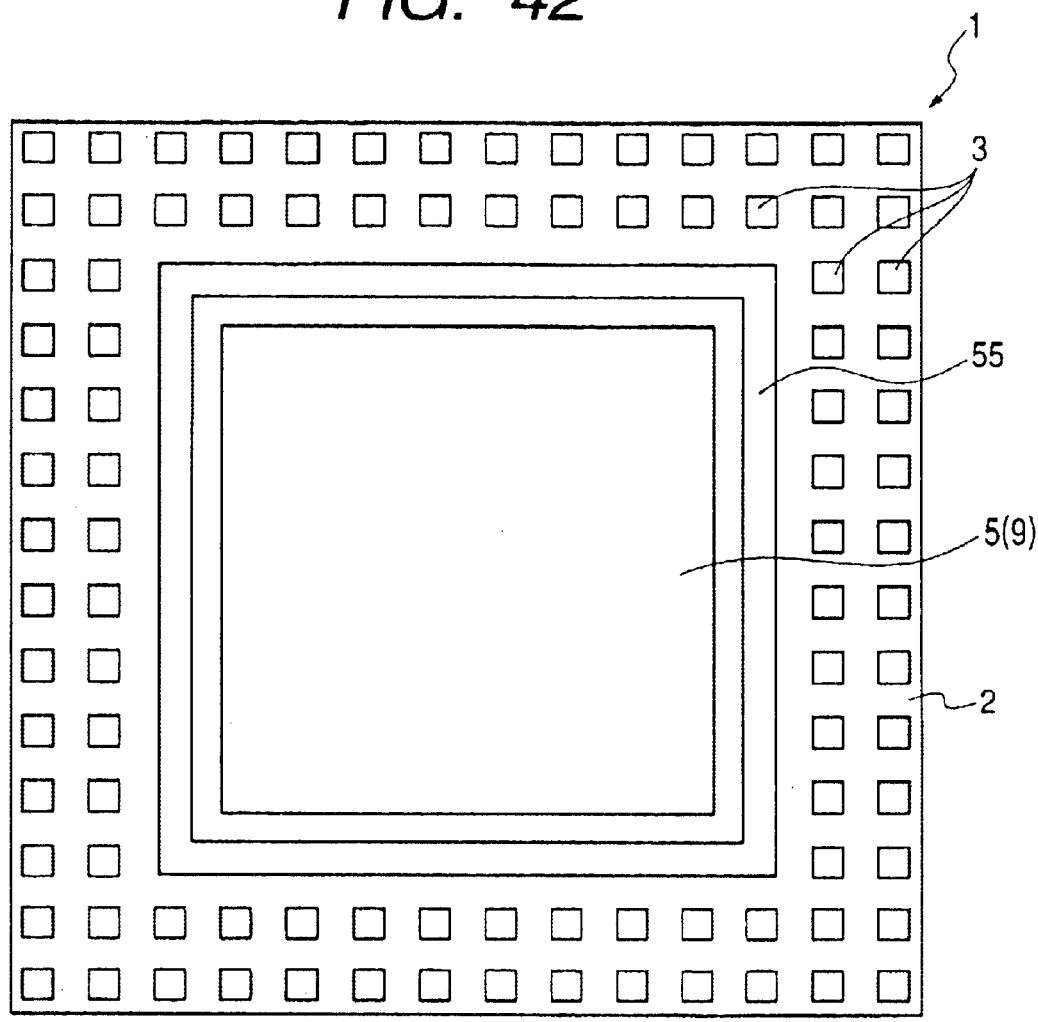
FIG. 42 is a bottom view of the semiconductor device of the ninth embodiment.
Figure 43:
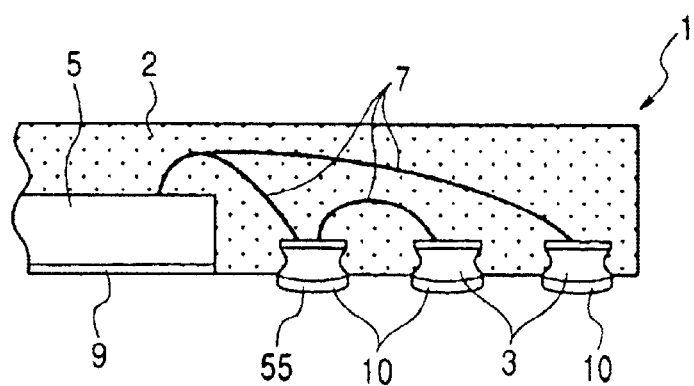
FIG. 43 is an enlarged sectional view of a part of the semiconductor device of the ninth embodiment.

FIGS. 40 to 43 are related to a semiconductor device according to a ninth embodiment of the present invention, of which FIG. 40 is a schematic sectional view of the semiconductor device, FIG. 41 is a schematic plan view of the semiconductor device in which external electrode terminals, etc. are seen through, FIG. 42 is a bottom view of the semiconductor device, and FIG. 43 is an enlarged sectional view of a part of the semiconductor device.

According to a method of manufacturing the semiconductor device of this ninth embodiment, in the semiconductor device manufacturing method of the first embodiment and in step (a) for forming product-forming portions, an elongated bus bar lead is formed outside the semiconductor element fixing region so as to surround the semiconductor element, which bus bar lead is positioned between each side of the semiconductor element and compartments arranged outside. The bus bar lead is employable as a common electrode, so, for example, electrodes 6 of the semiconductor element equal in potential to the ground potential and compartments 3 are connected together through wires 7. The semiconductor device 1 of this ninth embodiment is fabricated through the same steps as in the first embodiment except that product-forming portions are formed in accordance with a different pattern design and that wire connection is made for the bus lead in wire bonding.

The semiconductor device shown in FIGS. 40 to 43 is produced in this way. In FIG. 41, compartments 3 used at the ground potential are dotted, and a plating film 10 is formed also on the back surface of the bus bar lead 55.

The semiconductor device 1 of this ninth embodiment has a bus bar lead 55 of a square shape extending around the outside of the semiconductor device 5. The bus bar lead 55 is used as an external electrode terminal, and the bus bar lead and any electrode 6 on the semiconductor element 5 can be connected with each other using wire 7, so that it is possible to stabilize the grounding of the semiconductor device.

[Tenth Embodiment]

Figure 44:
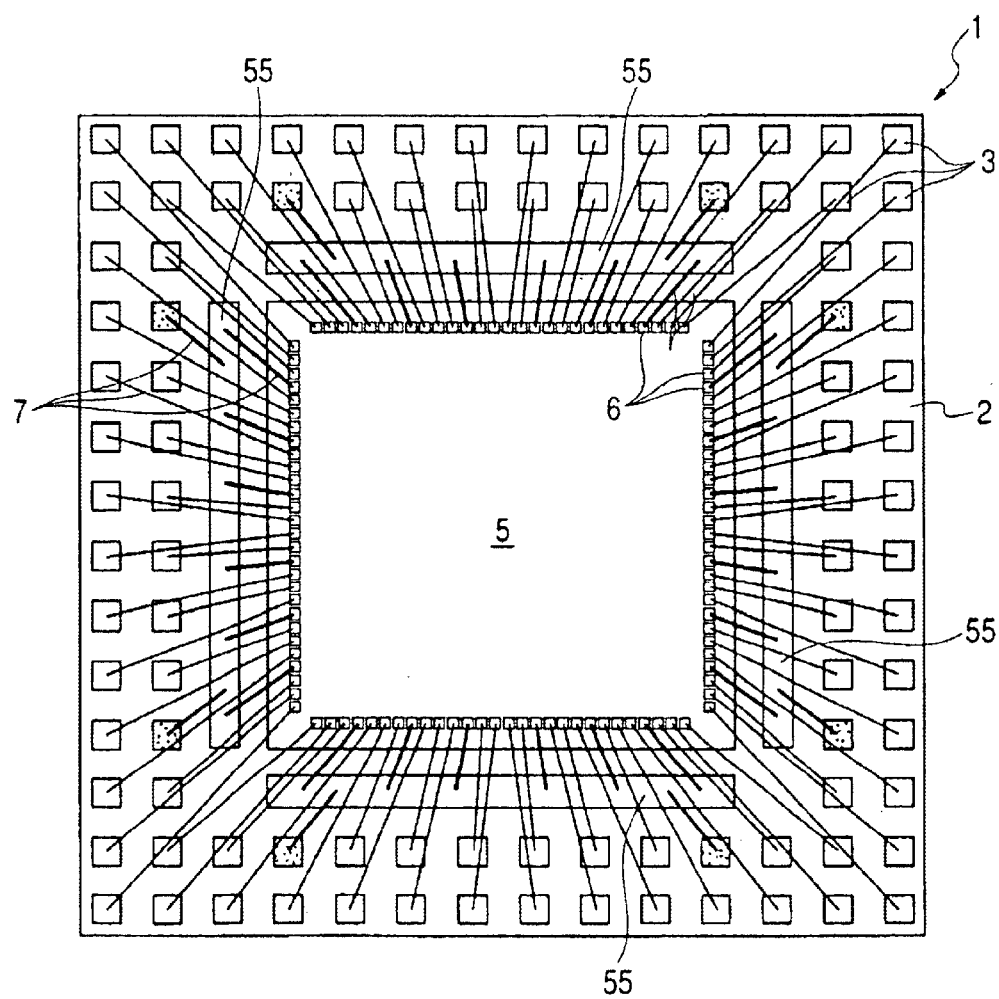
Figure 45:
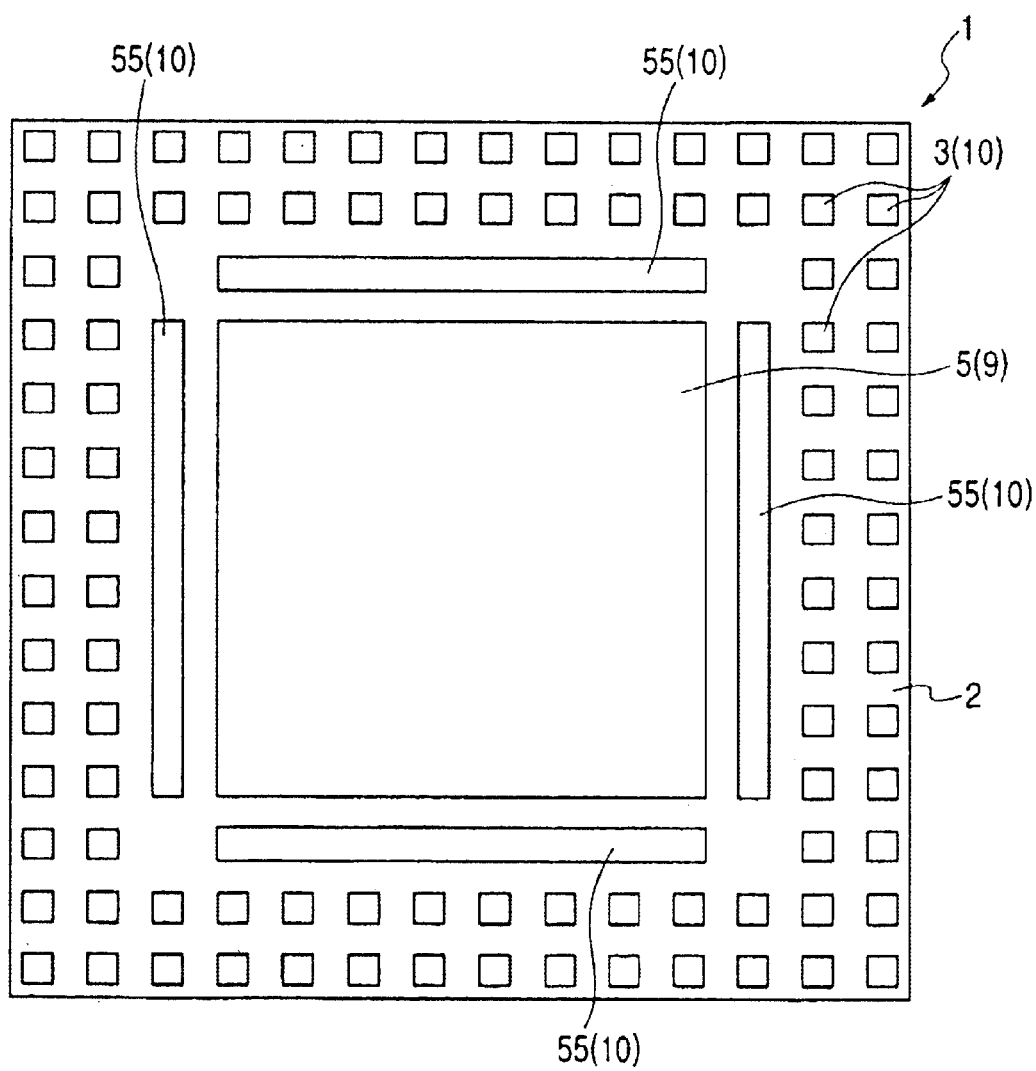
FIG. 45 is a bottom view of the semiconductor device of the tenth embodiment.

FIG. 44 is a schematic plan view of a semiconductor device according to a tenth embodiment of the present invention in which external electrode terminals, etc. are seen through, and FIG. 45 is a bottom view of the semiconductor device.

According to a method of manufacturing the semiconductor device of this tenth embodiment, in the semiconductor device manufacturing method of the ninth embodiment and in step (a) for forming product-forming portions, elongated bus bar leads are formed outside the semiconductor element fixing region so as to surround the semiconductor element, but a difference from the ninth embodiment resides in that the elongated bus bar leads 55 used in this tenth embodiment linearly extend respectively along the sides of the semiconductor element. More specifically, as shown in FIGS. 44 and 45, the bus bar leads 55 in this tenth embodiment are formed discontinuously. Other points are the same as in the semiconductor device 1 of the ninth embodiment and the semiconductor device manufacturing method in this tenth embodiment is also the same as in the ninth embodiment.

According to the semiconductor device manufacturing method of this tenth embodiment it is possible to prevent the generation of noise and the action as an antenna caused by ring-like portions, including power-supply terminals and ground terminals (e.g., Vcc, Vss).

[Eleventh Embodiment]

Figure 46:
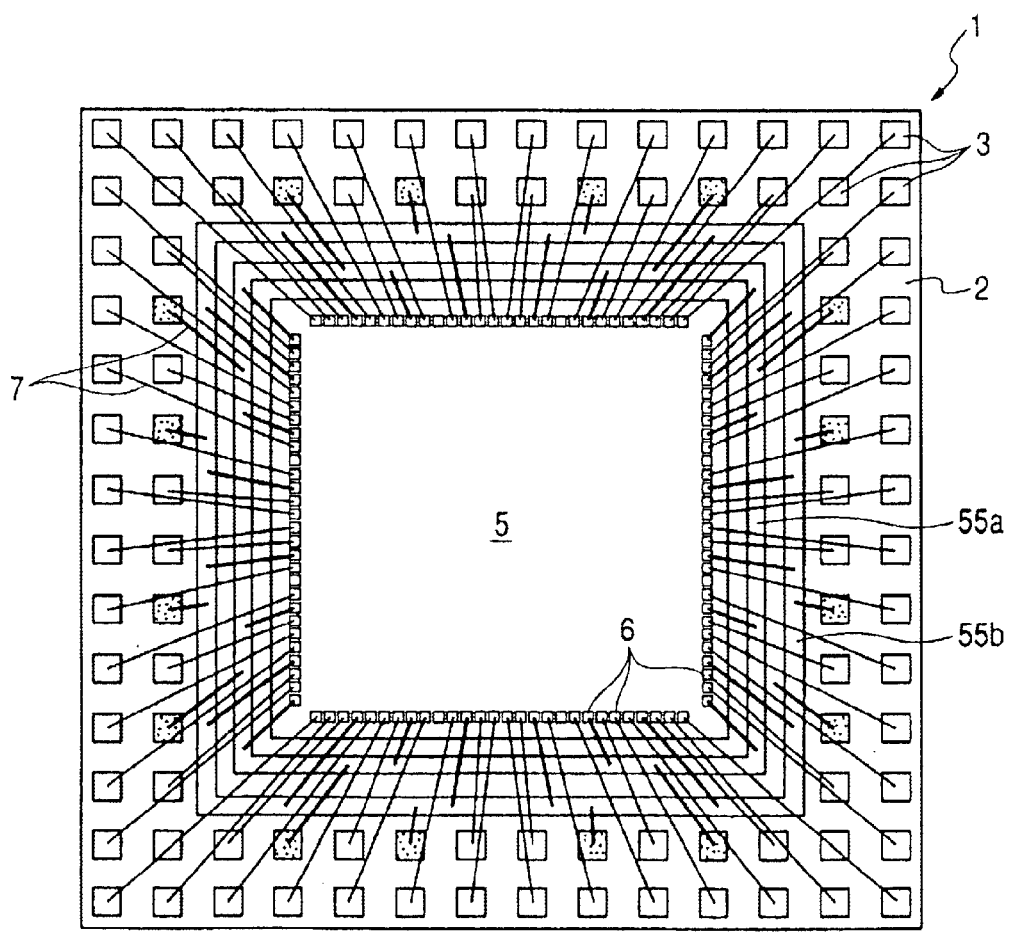
Figure 47:
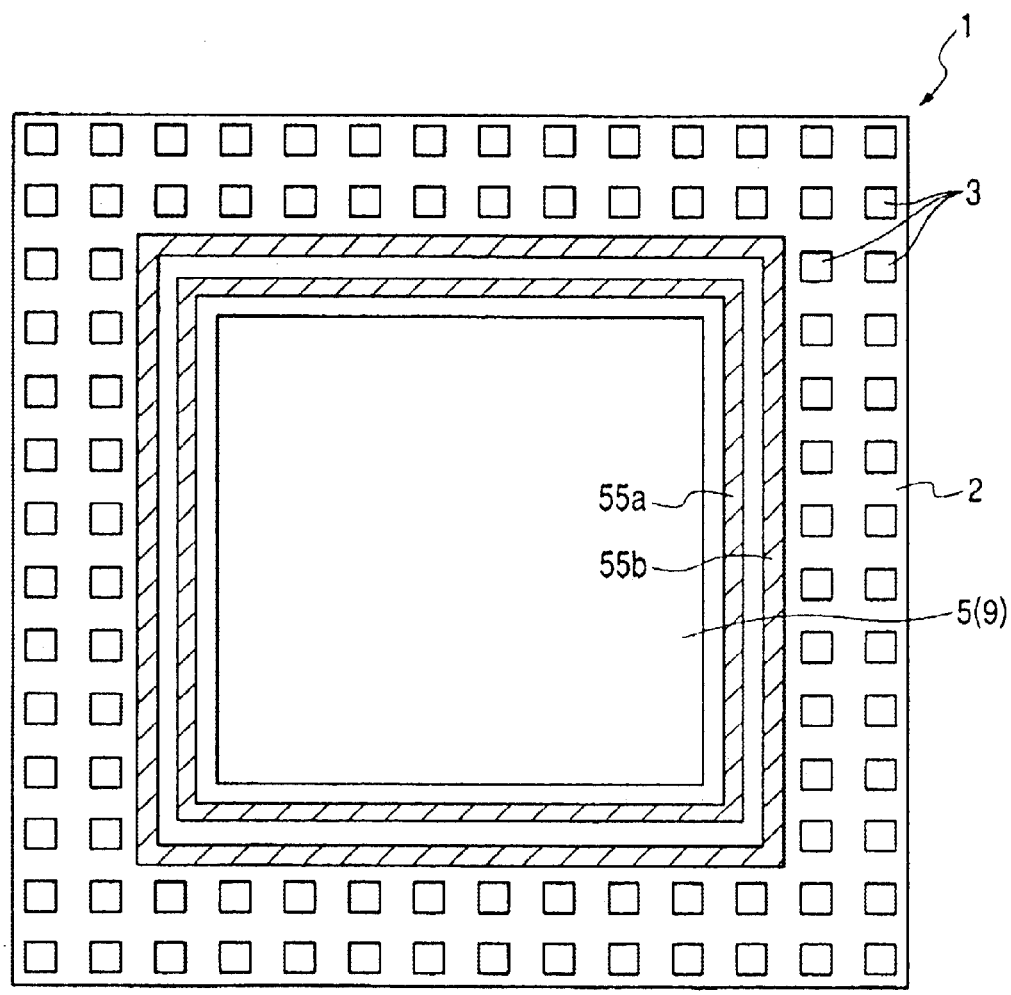
FIG. 47 is a bottom view of a semiconductor device according to an eleventh embodiment of the present invention.
Figure 48:
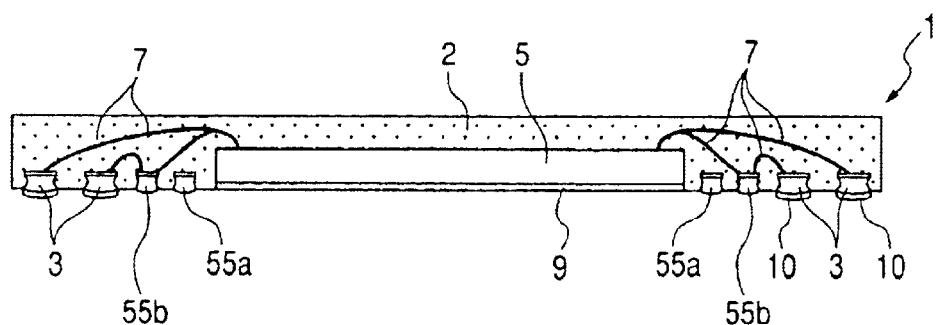
FIG. 48 is a sectional view of the semiconductor device of the eleventh embodiment.
Figure 49:
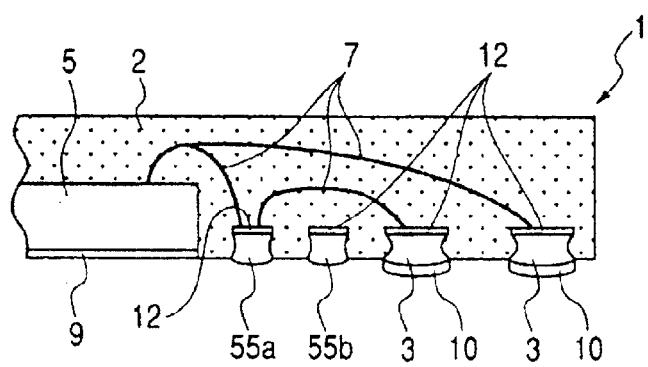
FIG. 49 is an enlarged sectional view of a part of the semiconductor device of the eleventh embodiment.

FIGS. 46 to 49 are related to a semiconductor device according to an eleventh embodiment of the present invention, of which FIG. 46 is a schematic plan view of the semiconductor device wherein external electrode terminals, etc. are seen through, FIG. 47 is a bottom view of the semiconductor device, FIG. 48 is a sectional view of the semiconductor device, and FIG. 49 is an enlarged sectional view of a part of the semiconductor device.

According to a method of manufacturing the semiconductor device of this eleventh embodiment, in the semiconductor device manufacturing method of the ninth embodiment and in step (a) for forming product-forming portions, bus bar leads are formed as plural enclosures outside the semiconductor element fixing region so as to surround the semiconductor element, and at the time of forming a plating film, back surfaces of the bus bar leads are masked to prevent the formation of a plating film thereon. These points are different from the ninth embodiment. Other structural points are the same as in the semiconductor device 1 of the ninth embodiment and so is the semiconductor device manufacturing method. In this eleventh embodiment, bus bar leads are formed double. In the bottom view of the semiconductor device 1 shown in FIG. 47, bus bar leads 55a and 55b are hatched so as to be seen easily.

In the semiconductor device 1 fabricated by the semiconductor device manufacturing method of this eleventh embodiment, as shown in FIGS. 48 and 49, back surfaces of the bus bar leads 55a and 55b are merely exposed to the back surface of the resin sealing member 2.

In such a semiconductor device 1, the number of outer terminals can be reduced by concentrating plural terminals (e.g., GND, Vcc, Vss) having the same purpose.

[Twelfth Embodiment]

Figure 50:
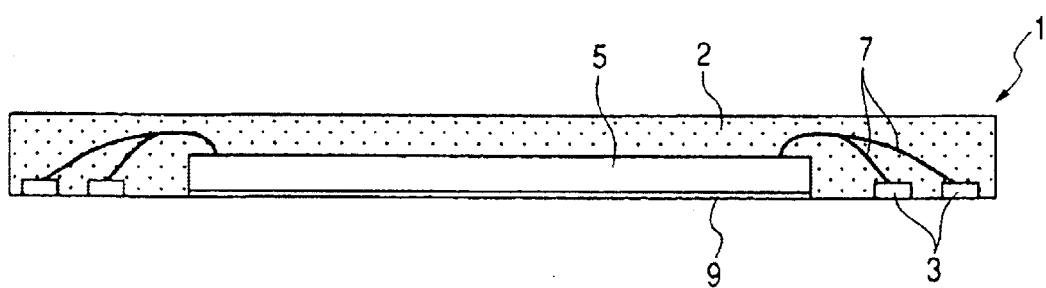
FIG. 50 is a schematic sectional view of a semiconductor device according to a twelfth embodiment of the present invention.
Figure 51:
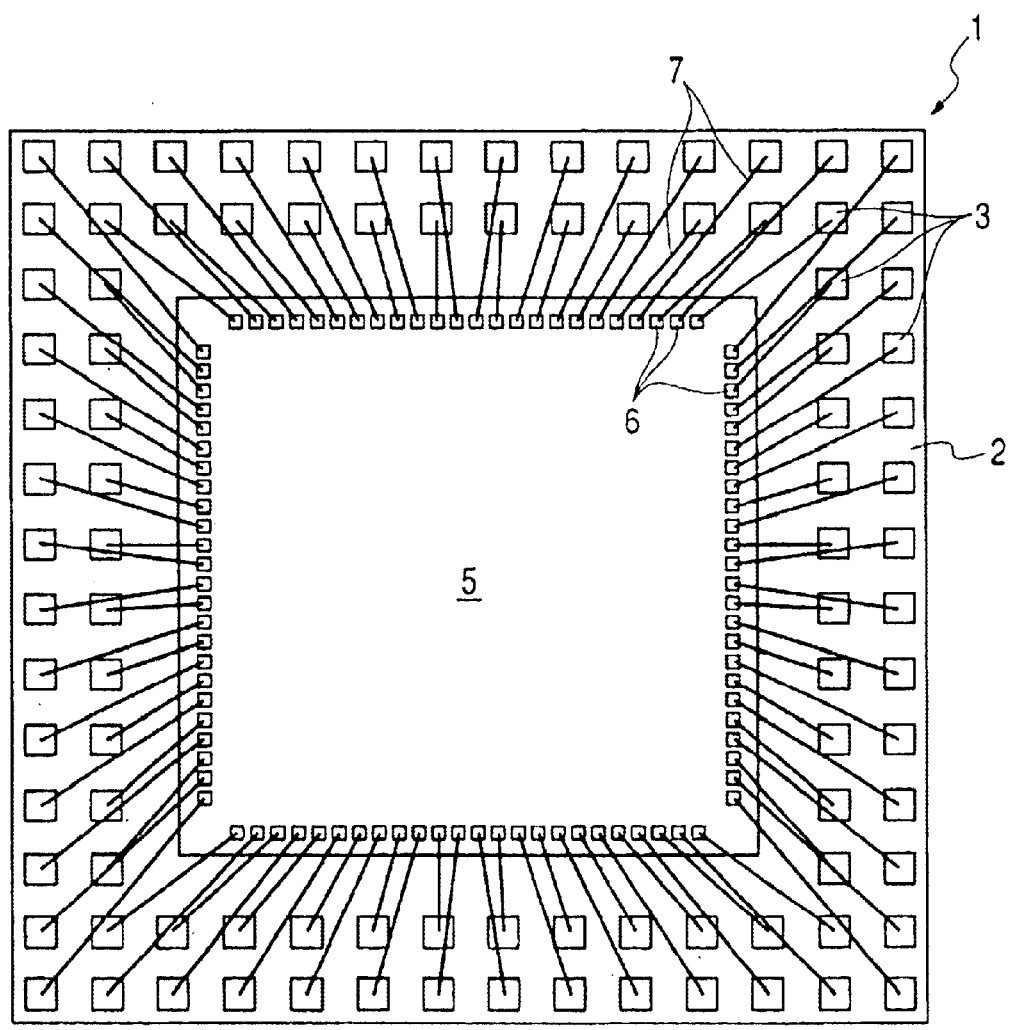
Figure 52:
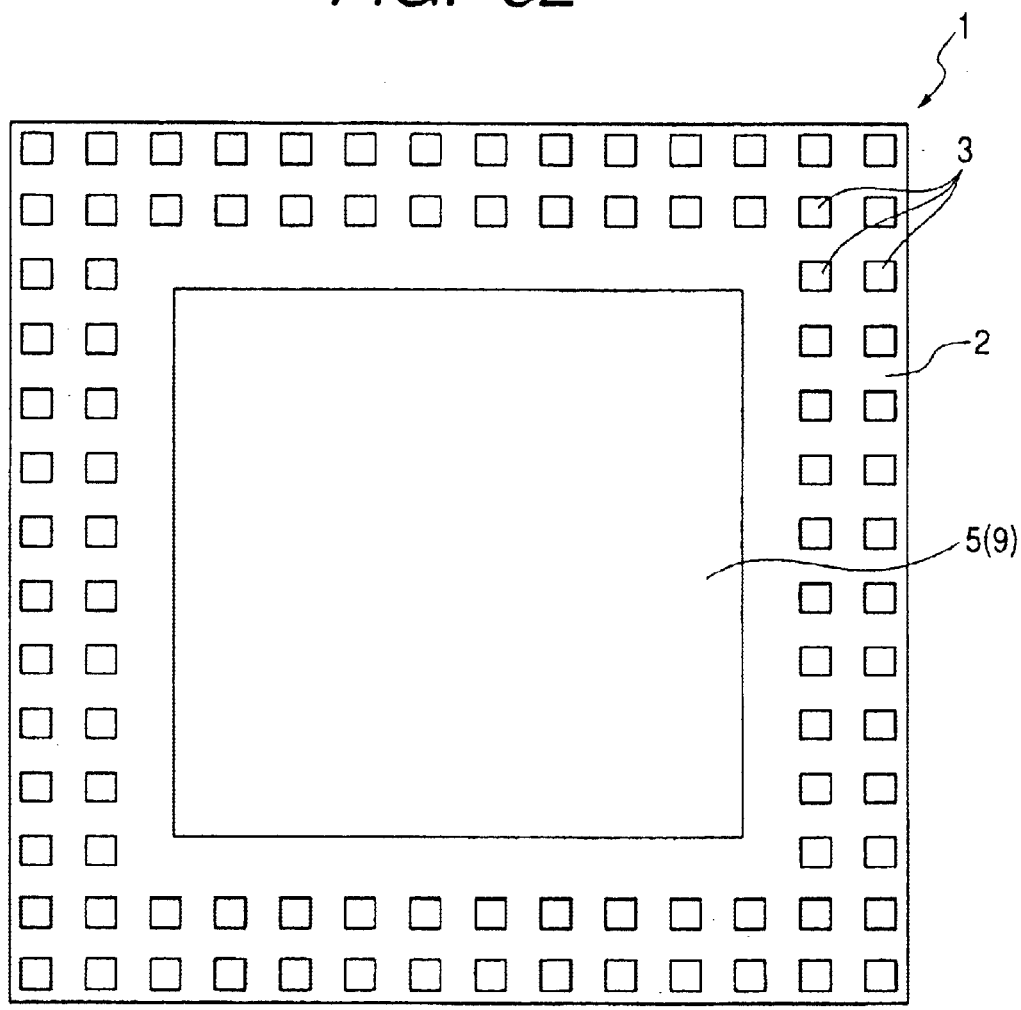
FIG. 52 is a bottom view of the semiconductor device of the twelfth embodiment.
Figure 53:
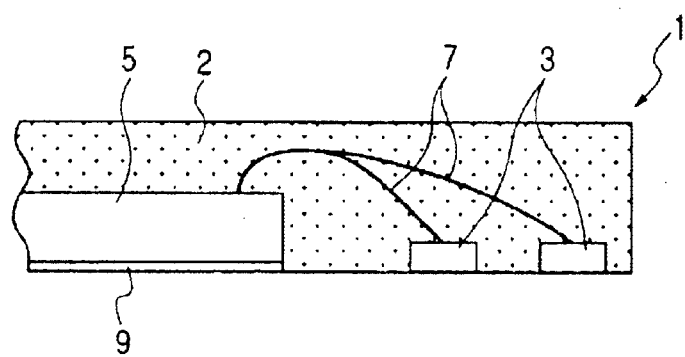
FIG. 53 is an enlarged sectional view of a part of the semiconductor device of the twelfth embodiment.

FIGS. 50 to 54 are related to a semiconductor device according to a twelfth embodiment of the present invention, of which FIG. 50 is a schematic sectional view of a semiconductor device according to a twelfth embodiment of the present invention, FIG. 51 is a schematic plan view of the semiconductor device wherein external electrode terminals, etc. are seen through, FIG. 53 is an enlarged sectional view of a part of the semiconductor device, and FIGS. 54(a) to 54(g) are sectional view showing, step by step, a method of manufacturing the semiconductor device.

In the semiconductor device manufacturing method according to this twelfth embodiment, a plating film is formed selectively on a main surface of a metallic sheet to constitute a substrate and then, using the substrate, there is produced the semiconductor device. According to the semiconductor device manufacturing method of this twelfth embodiment, in the semiconductor device manufacturing method of the first embodiment, there is adopted a different method for forming product-forming portions, and the step of forming a plating film on the back surface of each compartment is not needed. Other points are the same as in the method of the first embodiment.

Figure 54A:
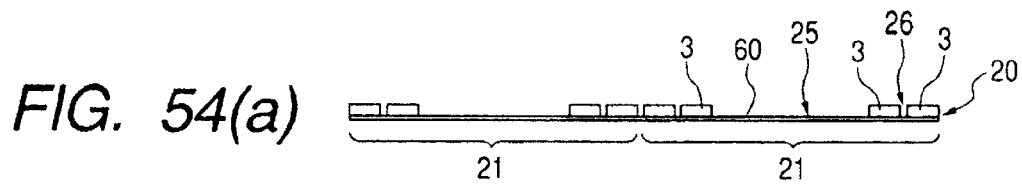
FIGS. 54(a) to 54(g) are sectional views showing, step by step, a method of manufacturing the semiconductor device of the twelfth embodiment.

In the semiconductor device manufacturing method of this twelfth embodiment and in step (a) for forming product-forming portions, as shown in FIG. 54(a), a plating film of a predetermined thickness is formed selectively on a main surface of a flat metallic sheet 60, and in the same way as in the first embodiment there are formed a recess 25 and grooves 26 to define plural compartments 3 enclosed with the recess 25 and grooves 26. A product-forming portion 21 is constituted by one or plural recesses 25, plural grooves 26 and plural compartments 3.

Plural such product-forming portions 21 are arrayed on the main surface of the metallic sheet 60 in the same manner as in the first embodiment, thereby affording a substrate 20 which permits the manufacture of a large number of semiconductor devices 1 at a time.

According to this twelfth embodiment, in each product-forming portion 21 there are arranged one quadrangular recess 25 and compartments 3 which are arranged double so as to surround the recess 25. The same patterns as in the first embodiment are used. In this twelfth embodiment, as shown in FIGS. 54(a) and 53, side walls of the compartments 3 are formed by plating method and are therefore substantially vertical walls unlike the first embodiment wherein the compartments 3 are formed by etching.

In this twelfth embodiment, a 125 to 200 μm thick copper alloy sheet or iron-nickel copper alloy sheet is used as the metallic sheet 60 and the partitions 3 and recess 25 are formed by plating which has a solder plating film (Pb—Sn), or Pd, or plural layers (e.g., Pd/Ni). A suitable plating film thickness can be selected by suitably selecting a plating time and is set, for example, at 10 to 50 μm. The selection is made taking metal diffusion in substrate packaging into account.

Figure 54B:
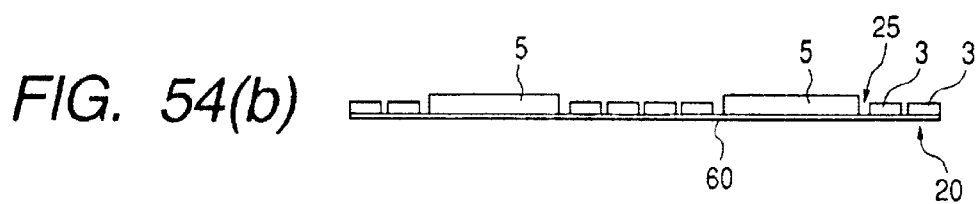

In the semiconductor device manufacturing method of this twelfth embodiment, as shown in FIG. 54(a), there is provided a substrate 20 having compartments 3 and recesses 25 formed by PbSn plating film on the main surface of the metallic sheet 60 and thereafter, as shown in FIG. 54(b), a semiconductor device 5 is fixed to a depressed bottom (main surface of the metallic sheet 60) of each recess 25 through an adhesive 9 (see FIG. 53).

Figure 54C:
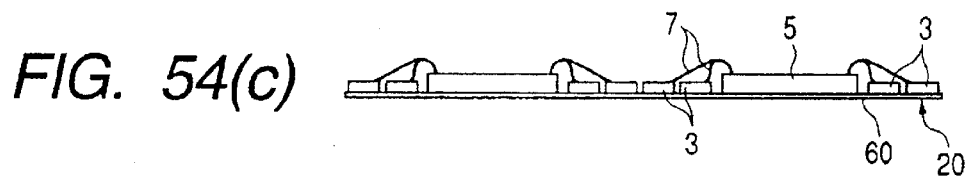

Next, as shown in FIG. 54(c), electrodes 6 of the semiconductor element 5 and compartments 3 are connected together through conductive wires 7 (see FIG. 51).

Figure 54D:
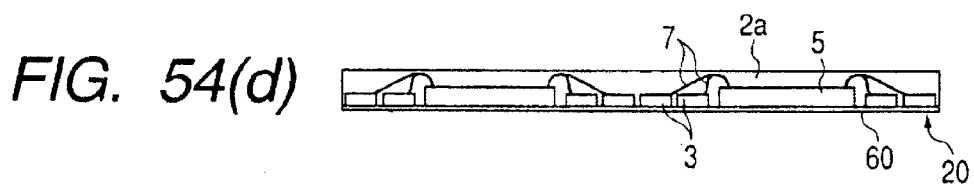

Then, as shown in FIG. 54(d), a resin layer 2a is formed on a main surface of the substrate 20 to cover the semiconductor element 5 and wires 7 by means of a transfer molding apparatus.

Figure 54E:
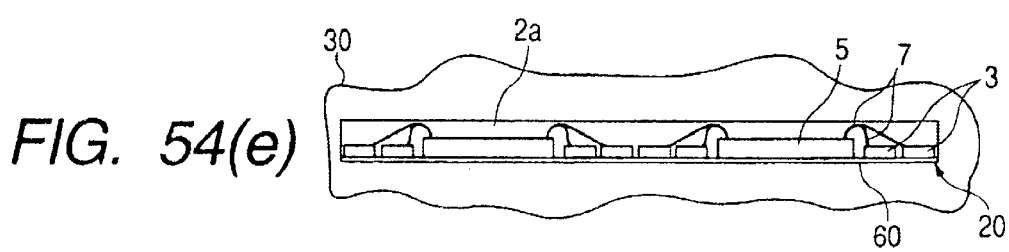

Next, as shown in FIG. 54(e), a back surface of the substrate 20, i.e., the metallic sheet 60, is removed by etching with use of an etching solution 30, whereby the adhesive 9 bonded to a back surface of the semiconductor element 5 and back surfaces of the compartments 3 formed by PbSn plating film are exposed to a back surface of the resin layer 2a. Since the metallic plate 60 is removed, the compartments 3 become separated.

Figure 54F:
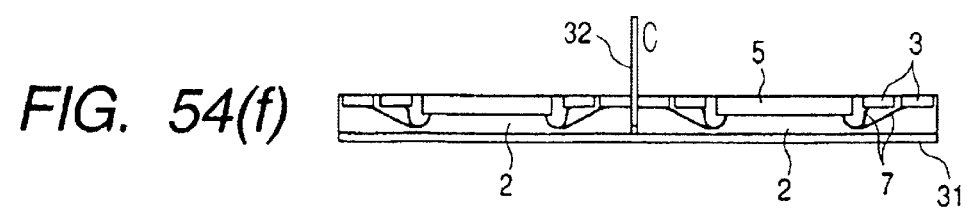

Then, as shown in FIG. 54(f), a tape 31 as a support member is affixed to the entire surface of the resin layer 2a. Thereafter, the resin layer 2a is diced longitudinally and transversely with a dicing blade 32 in such a manner that the resin layer overlies the tape 31 to form quadrangular semiconductor devices 1. The resin layer 2 is cut into resin sealing members 2. The semiconductor devices 1 thus separated remain affixed to the tape 31.

Figure 54G:
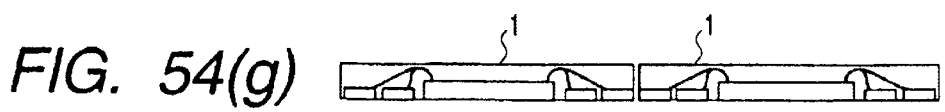

Next, as shown in FIG. 54(g), the tape 31 is peeled off from the semiconductor devices 1 to afford plural semiconductor devices 1.

In each of the semiconductor devices 1 fabricated by the semiconductor device manufacturing method of this twelfth embodiment, the compartments 3 serving as external electrode terminals are formed by PbSn plating film and therefore the semiconductor device 1 can be mounted as it is onto a packaging substrate by relow. According to this twelfth embodiment, in addition to the effects obtained in the first embodiment, there can be obtained an effect that a lead frame can be fabricated less expensively because it is not necessary to make the lead frame surface (section) uneven.

[Thirteenth Embodiment]

Figure 55:
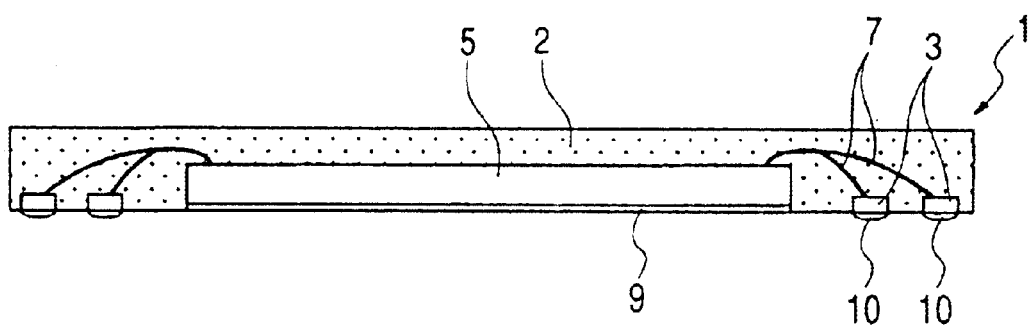
FIG. 55 is a schematic sectional view of a semiconductor device according to a thirteenth embodiment of the present invention.
Figure 56:
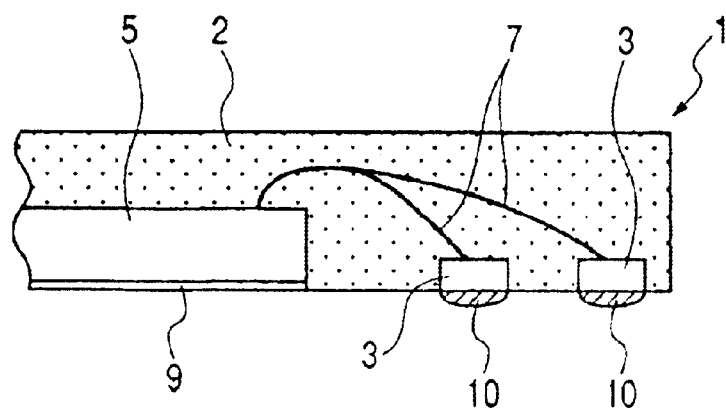
FIG. 56 is an enlarged sectional view of a part of the semiconductor device of the thirteenth embodiment.

FIGS. 55 to 57 are related to a semiconductor device according to a twelfth embodiment of the present invention, of which FIG. 55 is a schematic sectional view of the semiconductor device, FIG. 56 is an enlarged sectional view of a part of the semiconductor device, and FIGS. 57(a) to 57(h) are sectional views showing, step by step, a method of manufacturing the semiconductor device.

According to a method of manufacturing the semiconductor device of this thirteenth embodiment, in the semiconductor device manufacturing method of the twelfth embodiment, after removal of the metallic sheet 60 by etching, an outer plating film is formed on the back surface of each of the compartments exposed to the back surface of the resin layer, affording a stand-off structure of external electrode terminals, followed by cutting of the resin layer. Through the same process as in the twelfth embodiment there is produced the semiconductor device 1.

Figure 57A:
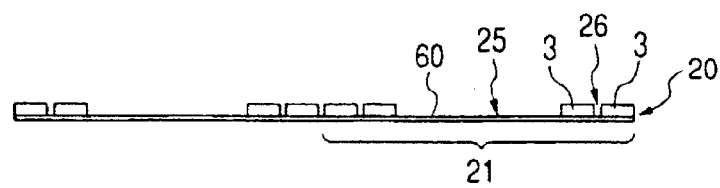
FIGS. 57(a) to 57(h) are sectional views showing, step by step, a method of manufacturing the semiconductor device of the thirteenth embodiment.
Figure 57B:
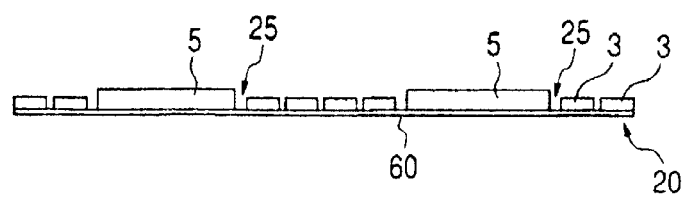

In the semiconductor device manufacturing method of this thirteenth embodiment, there is provided the substrate 20 used in the twelfth embodiment. That is, as shown in FIG. 57(a), there is provided the substrate 20 with compartments 3 and recesses 25 formed by PbSn plating film on a main surface of a metallic sheet 60, as shown in FIG. 57(a), and then a semiconductor element 5 is fixed to a depressed bottom (main surface of the metallic sheet 60) of each of the recesses 25 through an adhesive 9 (see FIG. 56).

Figure 57C:
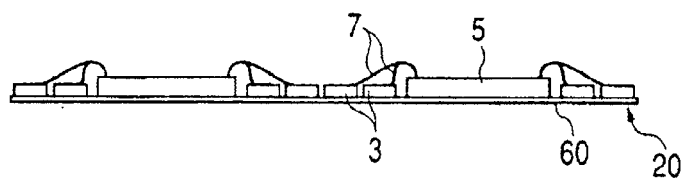

Next, as shown in FIG. 57(c), electrodes (not shown) formed on the semiconductor element 5 and the compartments 3 are connected with each other through conductive wires 7.

Figure 57D:
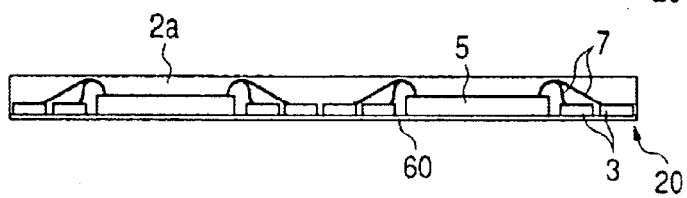

Then, as shown in FIG. 57(d), a resin layer 2a is formed on the main surface of the substrate 20, i.e., metallic sheet 60, by means of a transfer molding apparatus to cover the semiconductor element 5 and the wires 7.

Figure 57E:
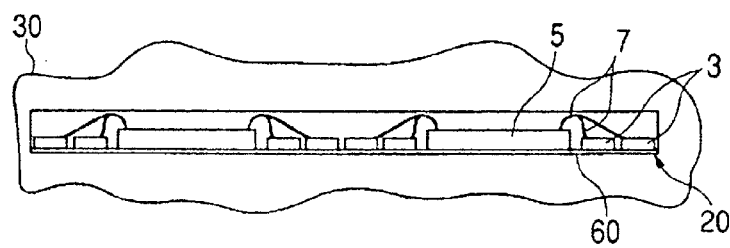

Next, as shown in FIG. 57(e), the back surface of the substrate 20, i.e., the metallic sheet 60, is removed by etching with use of an etching solution 30. As a result, the adhesive 9 bonded to the back surface of the semiconductor element 5 and the back surfaces of the compartments 3 formed by PbSn plating film are exposed to the back surface of the resin layer 2a. The compartments 3 assume a separated state because the metallic sheet 60 has been removed.

Figure 57F:
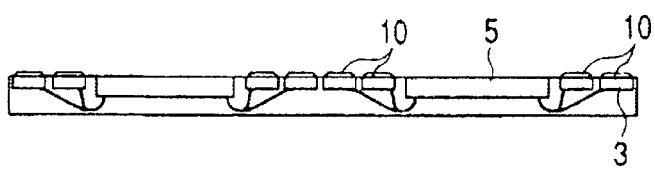

Then, as shown in FIG. 57(f), a plating film 10 is formed by an outer plating process. In this thirteenth embodiment, the plating film 10 is formed to a thickness of about 50 μm with PbSn solder. For the plating there is adopted a printing plating method or an electroless plating method. According to the electroless plating, if the adhesive bonded to the back surface of the semiconductor element 5 is a conductor, the plating film 10 is formed also on the surface of the adhesive 9, but if the adhesive 9 is an insulating resin, the plating film 10 is not formed on the adhesive surface. In this thirteenth embodiment, the following description is now provided, assuming that the plating film 10 is not formed on the surface of the adhesive 9 in subsequent steps.

Figure 57G:
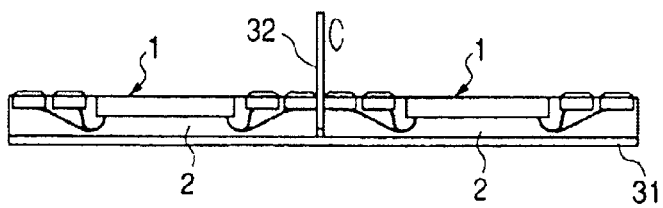
Figure 57H:

Nest, as shown in FIG. 57(g), a tape 31 as a support member is affixed to the entire surface of the resin layer 2a.

Thereafter, the resin layer 2a is cut longitudinally and transversely with a dicing blade 32 in such a manner that the resin layer 2a overlies the tape 31 to afford quadrangular semiconductor devices 1. The separated semiconductor devices 1 remain affixed to the tape 31. The resin layer 2a is cut into resin sealing members 2.

Then, as shown in FIG. 57(g), the tape 31 is peeled off from the semiconductor device 1 to produce plural semiconductor devices 1.

In each of the semiconductor devices 1 fabricated by the semiconductor device manufacturing method of this thirteenth embodiment, the outer plating film 10 is further formed on each of the compartments constituted by PbSn plating film and serving as external electrode terminals, so that the external electrode terminals are provided as a stand-off structure.

According to this thirteenth embodiment, in addition to the effects obtained in the twelfth embodiment, there is obtained an effect that a stand-off structure is ensured (the substrate packaging performance is improved).

[Fourteenth Embodiment]

Figure 82:
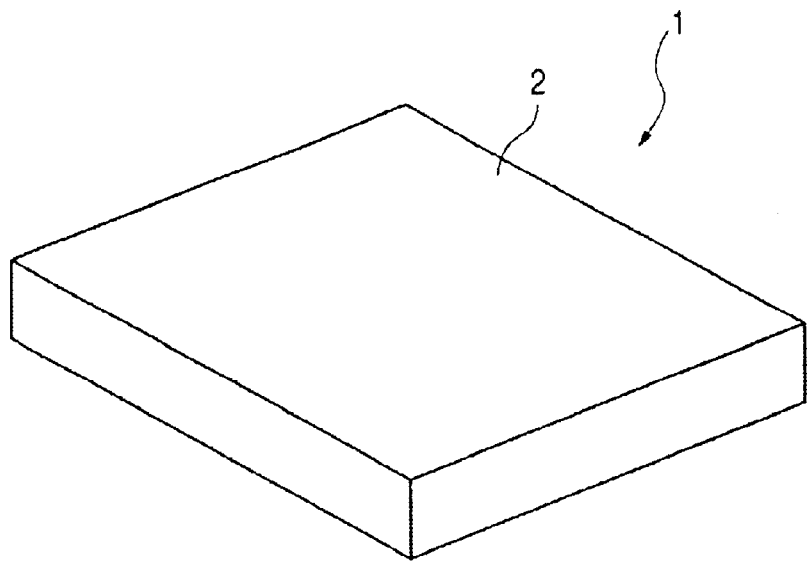
FIG. 82 is a perspective view showing an appearance of a semiconductor device according to a fourteenth embodiment of the present invention.
Figure 83:
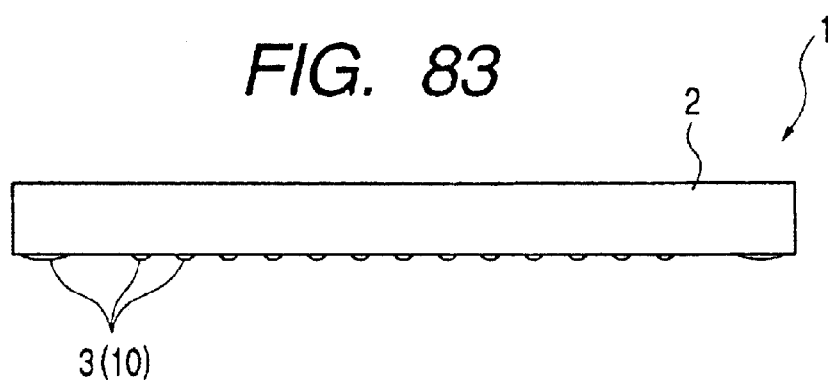
FIG. 83 is a front view of the semiconductor device of the fourteenth embodiment.
Figure 84:
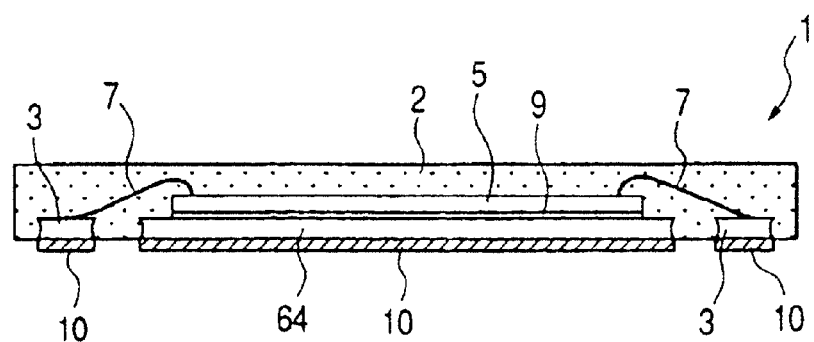
FIG. 84 is a schematic sectional view of the semiconductor device of the fourteenth embodiment.
Figure 85:
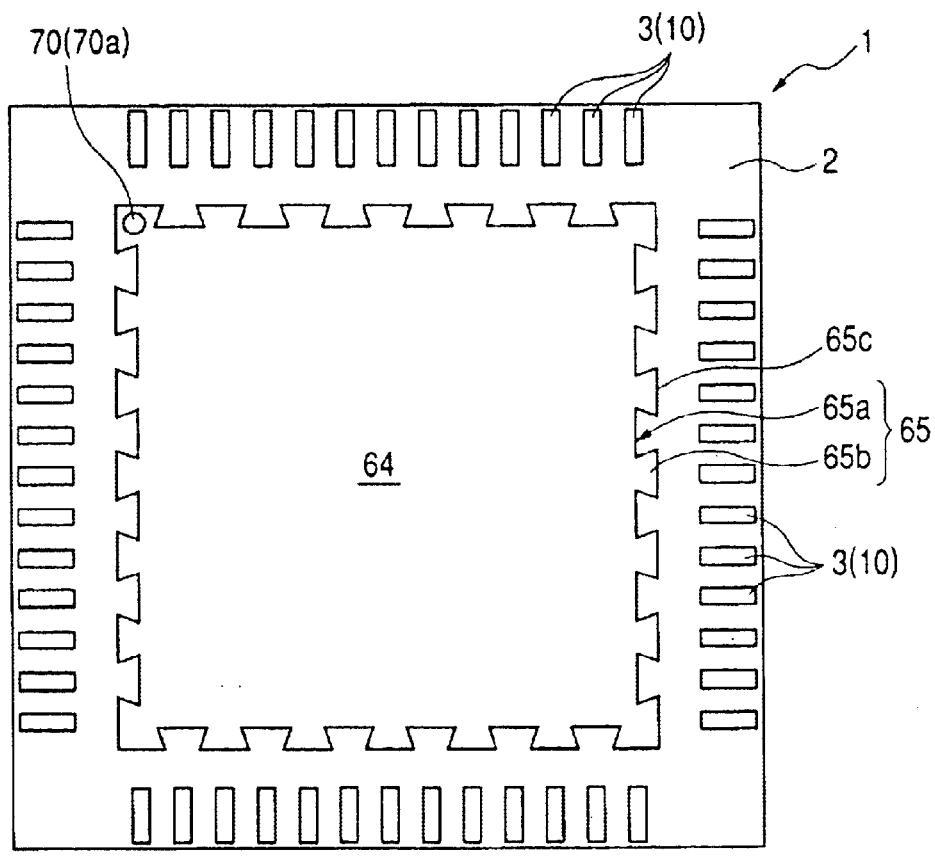
FIG. 85 is a bottom view of the semiconductor device of the fourteenth embodiment.
Figure 86:
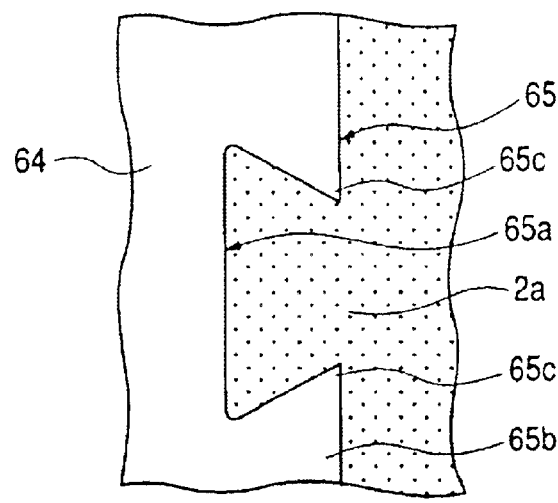
FIG. 86 is a schematic diagram showing a state of engagement between a resin portion which forms a sealing member and a chip mounting portion in the semiconductor device of the fourteenth embodiment.

FIGS. 82 to 90 are related to a method of manufacturing a semiconductor device according to a fourteenth embodiment of the present invention, of which FIG. 82 is a perspective view showing an appearance of the semiconductor device, FIG. 83 is a front view of the semiconductor device, FIG. 84 is a schematic sectional view of the semiconductor device, FIG. 85 is a bottom view of the semiconductor device, and FIG. 86 schematically illustrates a state of engagement between a resin portion which forms a sealing member in the semiconductor device and a chip mounting portion.

Figure 87:
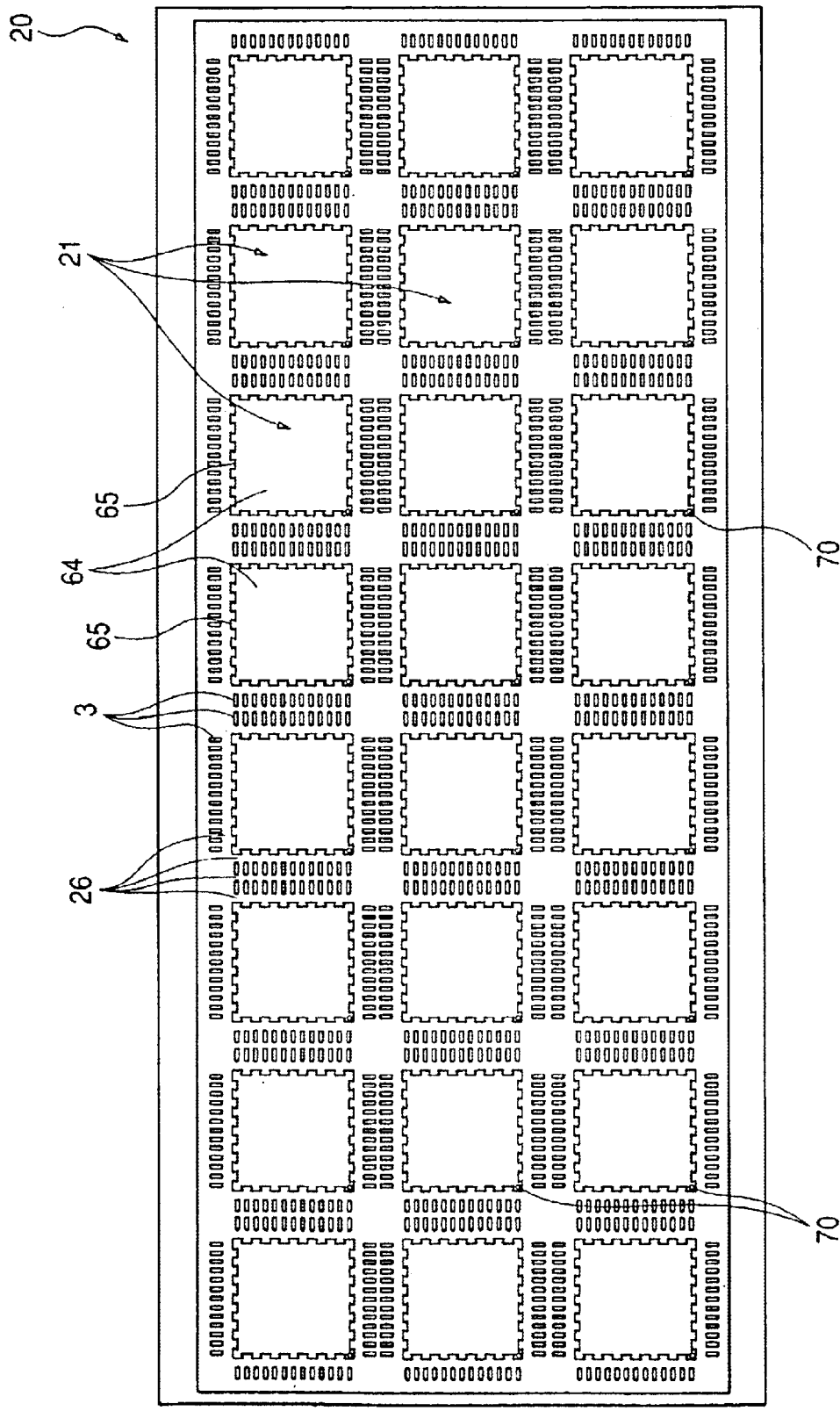
FIG. 87 is a plan view of a substrate used in manufacturing the semiconductor device of the fourteenth embodiment.
Figure 88:
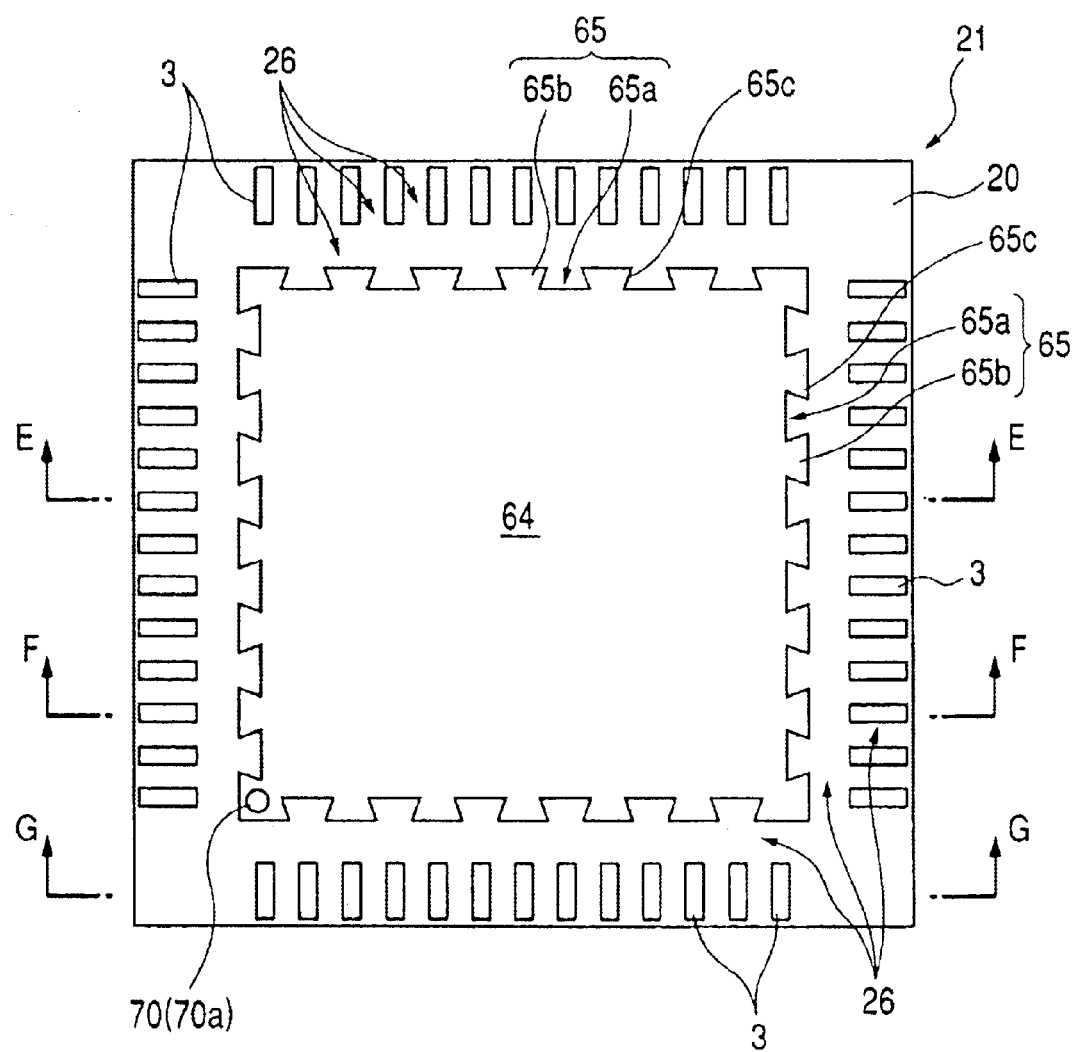
FIG. 88 is a schematic plan view showing a product-forming portion of the substrate of FIG. 87.
Figure 89A:
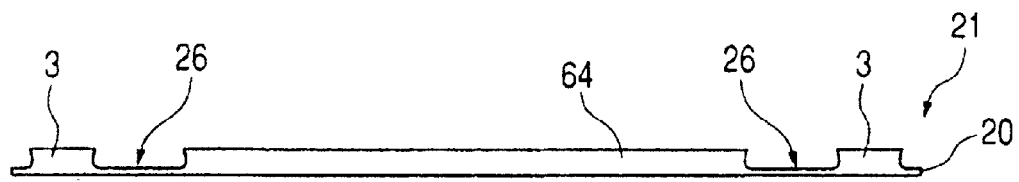
FIGS. 89(a) to 89(c) are sectional views taken along lines E—E, F—F, and G—G in FIG. 88.
Figure 89B:
Figure 89C:
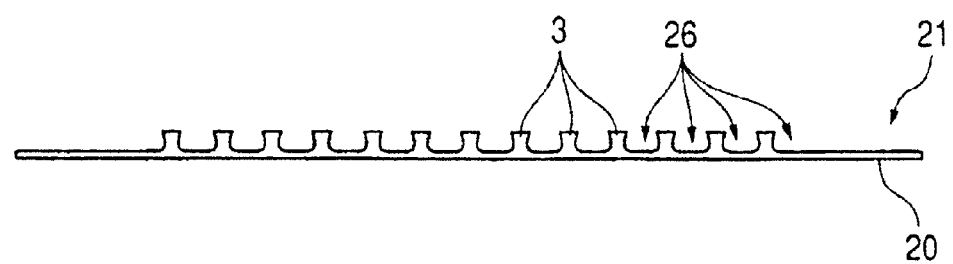

A method of producing the semiconductor device of this fourteenth embodiment is closely similar to the semiconductor device manufacturing method of the seventh embodiment. In this fourteenth embodiment, a semiconductor device 1 is produced using such a substrate 20 as shown in FIG. 87, but the pattern and structure of arrayed product-forming portions 21 are different from those of the seventh embodiment. FIG. 88 is an enlarged plan view of a product-forming portion 21 and FIGS. 89(a) to (c) are sectional views taken along lines E—E, F—F, and G—G.

In the seventh embodiment the compartments 3 are arranged in two rows along the sides of product-forming portions, while in this fourteenth embodiment compartments 3 are arranged in one row as sown in FIG. 87 and are elongated. Moreover, a chip mounting portion 64 for mounting a semiconductor chip 5 is not so thin as in the seventh embodiment, but is equal in thickness (height) to each compartment 3. The compartments 3 and the chip mounting portion 64 are surrounded with grooves 26. Since the grooves 26 are formed by etching, edges of main surfaces of the chip mounting portion 64 and the compartments 3 are burred. The burrs bite into a resin layer 2a which constitutes resin sealing members 2 in the stage of product, thus making the compartments 3 and chip mounting portion 64 difficult to fall off from the associated resin sealing member 2 (see FIG. 84).

The chip mounting portion 64 is quadrangular, but, as shown in FIG. 88, concave/convex portions 65 having a concave/convex degree of 50 μm or more are formed in all of the side faces (peripheral face) of the quadrangular chip mounting portion 64. In each of the concave/convex portions 65, a concave 65a has a shape such that an inlet side is narrow and its width becomes larger toward a bottom of the concave. Consequently, a convex 65b has a burr 65c projecting toward the concave 65a. The concave/convex portions 6 are not formed in the compartments 3, whereby machining of the compartments is made easy and the pitch of the compartments 3 is made small, thus facilitating the reduction in external size of the semiconductor chip 5. The size of the semiconductor chip 5 may be larger than that of the chip mounting portion 64.

In the stage of product (semiconductor device 1), a shown in FIG. 86, the concave/convex portions 65 are in mesh with the resin layer 2a which constitutes resin sealing members 2. That is, the portion of the resin layer 2a injected and cured in each concave 65a become difficult to come off in the presence of burr 65c, thus enhancing the bonding strength between the resin layer 2a which constitutes each resin sealing member 2 and the chip mounting portion 64. Consequently, the bonding strength between the semiconductor chip 5 mounted on the chip mounting portion 64 and the chip mounting portion 64 is not deteriorated, but is kept high.

The semiconductor chip 5 is connected to the chip mounting portion 64 through an adhesive 9. Since the bonding strength between the chip mounting portion 64 and the resin layer 2a is high, water is difficult to enter the interface between the chip mounting portion 64 and the resin layer 2a. Consequently, at the time of fixing the semiconductor device 1 onto a packaging substrate by reflow (a temporary heat treatment), it is possible to prevent the occurrence of a packaging defect caused by a thermal expansion of water.

Moreover, by forming the concave/convex portions 65 in side faces of the chip mounting portion 64, that is, by allowing concaves and convexes to divide the length, a stress induced by a difference in thermal expansion coefficient between different materials (metal and resin) can be made small (short) and a force based on expansion and contraction is dispersed, thus affording a semiconductor device 1 improved in temperature cycling resistance. It has been confirmed by stress simulation result that, by forming the concave/convex portions 65, about 20% stress relaxation for the corners of the chip mounting portion 64 can be done in comparison with the case where the concave/convex portions 65 are not formed.

Further, since the bonding strength between the semiconductor chip 5 and the chip mounting portion 64 is high, the chip mounting portion 64 is difficult to peel off and the flatness of the chip mounting portion 64 can be maintained, whereby there can be obtained a semiconductor device 1 improved in packaging performance and heat dissipating performance.

In the structure wherein the semiconductor substrate of the semiconductor chip 5 connected to the chip mounting portion 64 is used as one electrode and a conductive adhesive is used as the adhesive 9, the chip mounting portion 64 is used as an electrode terminal. In such a case, that the bonding strength between the semiconductor chip 5 and the chip mounting portion 64 is not deteriorated makes it possible to stably use an electronic device with the semiconductor device 1 built therein. For example, in the case of a semiconductor chip with an IC for a hard disk driver formed therein, if a gap is formed by void or crack within the adhesive 9 which connects the semiconductor chip 5 and the chip mounting portion 64 with each other, a thermal resistance increases and the heat dissipating performance for the packaging substrate is deteriorated, resulting in that a hard disk unit can no longer perform a stable operation. However, as in this embodiment, if the bonding strength of the chip mounting portion 6 for the resin layer 2a which covers the semiconductor chip 5 is high, the bonding strength between the semiconductor chip 5 and the chip mounting portion 64 is also high and there is little change in thermal resistance (heat dissipating performance) of a heat transfer path extending from the semiconductor substrate to the chip mounting portion 64 through the adhesive 9, whereby the reliability of product can be improved.

In this fourteenth embodiment there is used a substrate 20 which can form a direction index 70 so as to permit easy recognition of the direction of the semiconductor device 1. The direction index 70 is provided in the chip mounting portion 64 of each product-forming portion 21. More specifically, as shown in FIG. 88, the direction index 70 is formed by forming a hole 70a in one corner of the chip mounting portion 64 which is quadrangular in shape. In the stage of product, the resin layer 2a having a color (e.g., black) different from the color of metal is injected into the hole 70a, so that the hole 70a serves as a clearly distinguishable direction index 70. In the semiconductor device manufacturing stage, the directionality in process flow during assembly can be recognized exactly by confirming the direction index 70 formed in each product-forming portion. As the shape of the hole 70a, it is preferable to adopt a corner-free shape, e.g., a round shape, whereby the manufacture becomes easier.

The semiconductor device of this fourteenth embodiment can be fabricated by modifying the semiconductor device manufacturing method of the seventh embodiment. FIGS. 90(a) to 90(h) are sectional views showing, step by step, a method of manufacturing the semiconductor device of this fourteenth embodiment, corresponding to FIGS. 33(a) to 33(h) in the seventh embodiment. Because of fine drawings, some structural points are omitted and so are symbols.

The semiconductor device manufacturing method according to this fourteenth embodiment will now be described with reference to FIGS. 90(a) to 90(h). As shown in FIG. 90(a), a substrate 20 is provided, then, as shown in FIG. 90(b), a semiconductor chip 5 is fixed through an adhesive 9 onto a chip mounting portion 64 of each product-forming portion 21.

Next, as shown in FIG. 90(c), electrodes on a main surface of the semiconductor chip 5 and compartments 3 are connected together through conductive wires 7.

Then, as shown in FIG. 90(d), a resin layer 2a of a predetermined thickness is formed so as to cover the semiconductor chip 5 and wires 7 by means of a conventional transfer molding apparatus.

Next, as shown in FIG. 90(e), the substrate 20 is turned upside down and a back surface of the substrate 20 (metallic sheet) is polished using a polishing disc 36, whereby the chip mounting portion 64 and the compartments 3 are separated from each other electrically and mechanically as shown in FIG. 90(f). In FIG. 90(e) there is shown a polishing allowance.

Then, as shown in FIG. 90(f), plating is performed to form a plating film 10 on surfaces of the chip mounting portion 64 and compartments 3 exposed from the resin layer 2a.

Next, as shown in FIG. 90(g), a tape 31 is affixed to a surface of the resin layer 2a and thereafter the resin layer 2a is diced longitudinally and transversely from the substrate 20 side up to an intermediate depth of the tape 31 by means of a dicing blade 32, then the tape 31 is peeled off to produce plural such semiconductor devices 1 as shown in FIG. 90(g).

Figure 91:
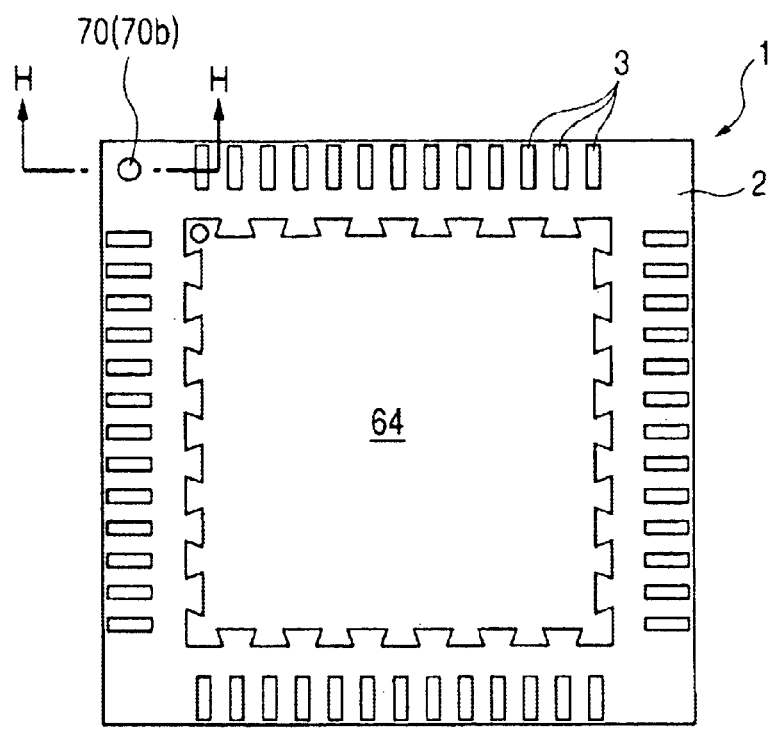
FIG. 91 is a bottom view of a semiconductor device according to a modification of the fourteenth embodiment.
Figure 92:
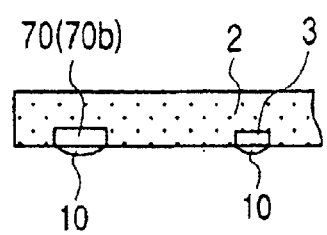
FIG. 92 is a schematic enlarged sectional view taken along line H—H in FIG. 91.

FIGS. 91 and 92 are bottom views of a semiconductor device fabricated by a semiconductor device manufacturing method according to a modification of this fourth embodiment, of which FIG. 91 is a bottom view of the semiconductor device and FIG. 92 is a schematic enlarged sectional view taken along line H—H in FIG. 91. According to this modification, in one corner of a quadrangular product-forming portion there is formed a direction index 70 which is constituted by a cylinder 70b surrounded with grooves, and a semiconductor device 1 is produced using a substrate 20 having such a product-forming portion. Also in this modification, like the fourteenth embodiment, directionality can be recognized exactly. Since the direction index 70 is cylindrical in shape, it is possible to improve plating property (wettability) such as that in printing plating and also improve the wettability of solder plating in substrate packaging.

[Fifteenth Embodiment]

Figure 93:
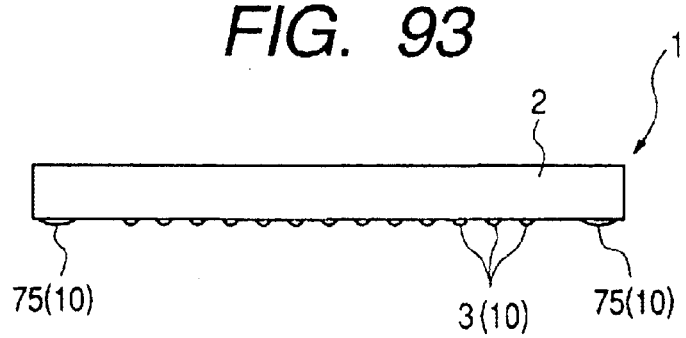
FIG. 93 is a front view of a semiconductor device according to a fifteenth embodiment of the present invention.
Figure 94:
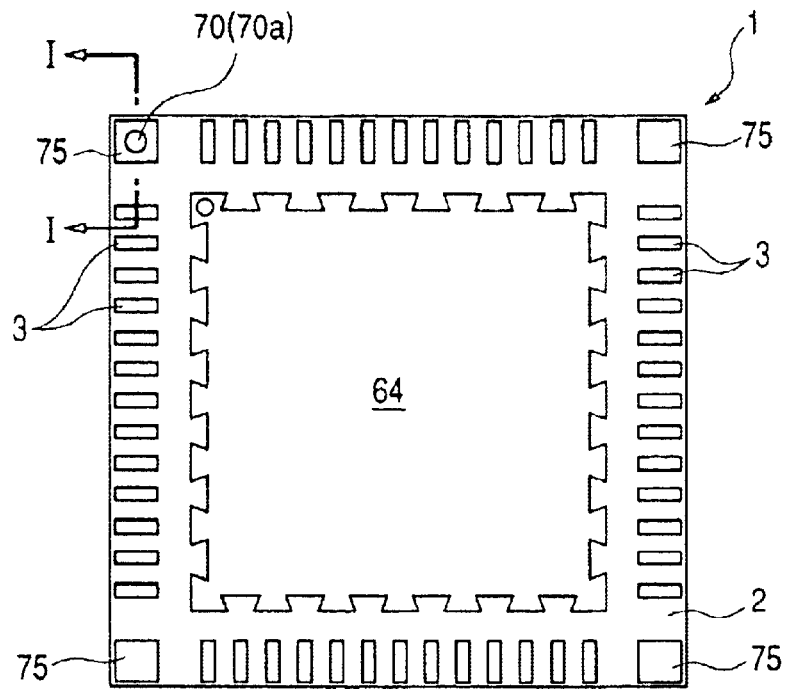
FIG. 94 is a bottom view of the semiconductor device of the fifteenth embodiment.
Figure 95:
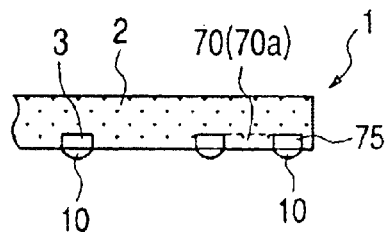
FIG. 95 is a schematic enlarged sectional view taken along line I—I in FIG. 94.

FIGS. 93 to 95 are related to a method of manufacturing a semiconductor device according to a fifteenth embodiment of the present invention, of which FIG. 93 is a front view of a semiconductor device fabricated by the method, FIG. 94 is a bottom view thereof, and FIG. 95 is a schematic enlarged sectional view taken along line I—I in FIG. 94.

In this fifteenth embodiment, pads 75 for package reinforcement are formed respectively at the corners of a quadrangular resin sealing member 2. More specifically, quadrangular pads 75 are provided respectively at the four corners of a quadrangular product-forming portion (not shown) and a semiconductor device 1 is produced using a substrate 20 having such a product-forming portion. According to this construction, if lands are formed also on a packaging substrate correspondingly to the pads 75, the package strength can be enhanced by fixing the pads 75 with solder. It is also possible to package the semiconductor device 1 without using the pads 75.

Further, in this fifteenth embodiment, a direction index 70 constituted by a hole 70a is formed in one of the pads 75 to check the directionality of the semiconductor device 1. This floating island-like pad 75 can be selected freely in a region deviated from a chip mounting portion 64 and compartments 3.

[Sixteenth Embodiment]

Figure 96:
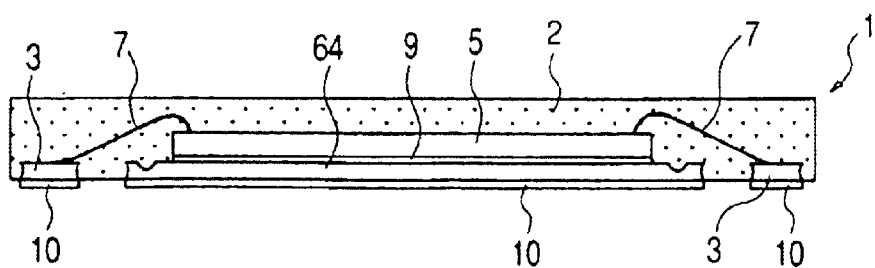
FIG. 96 is a schematic sectional view of a semiconductor device according to a sixteenth embodiment of the present invention.
Figure 97:
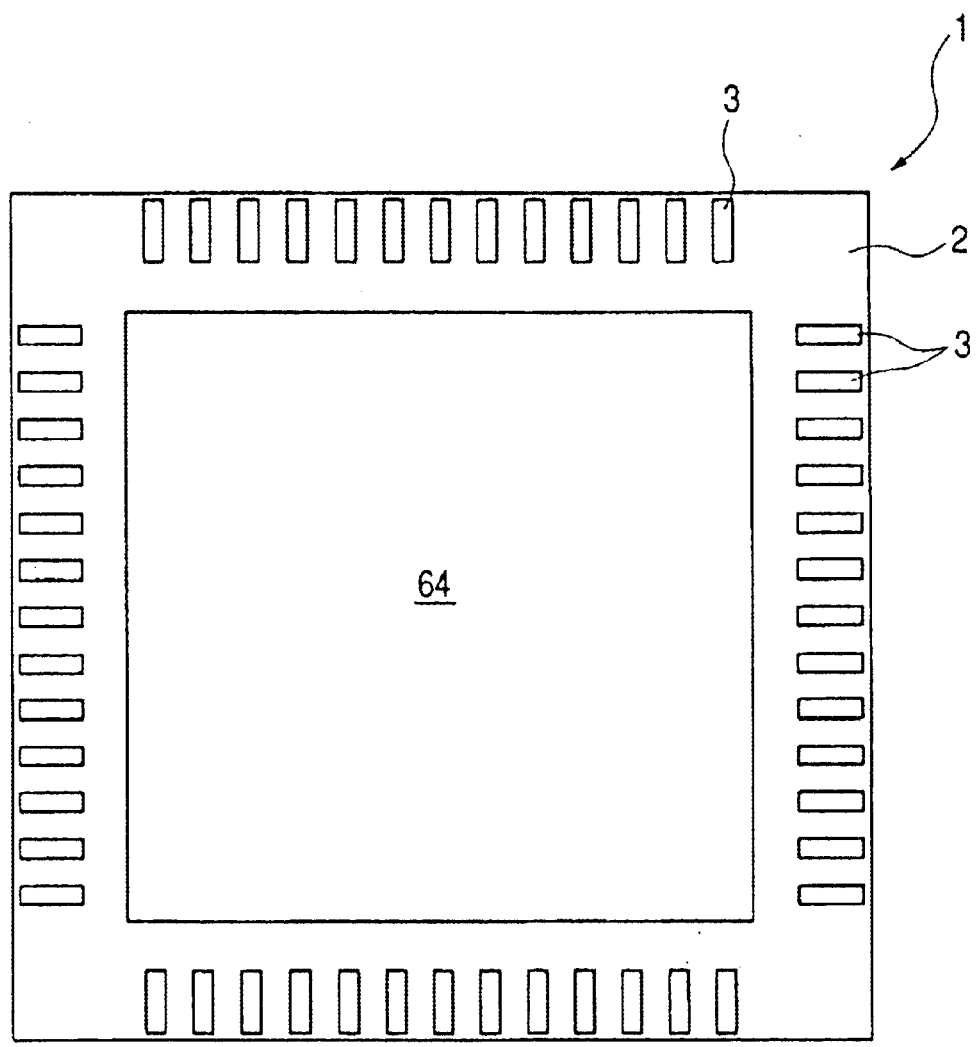
FIG. 97 is a bottom view of the semiconductor device of the sixteenth embodiment.
Figure 98:
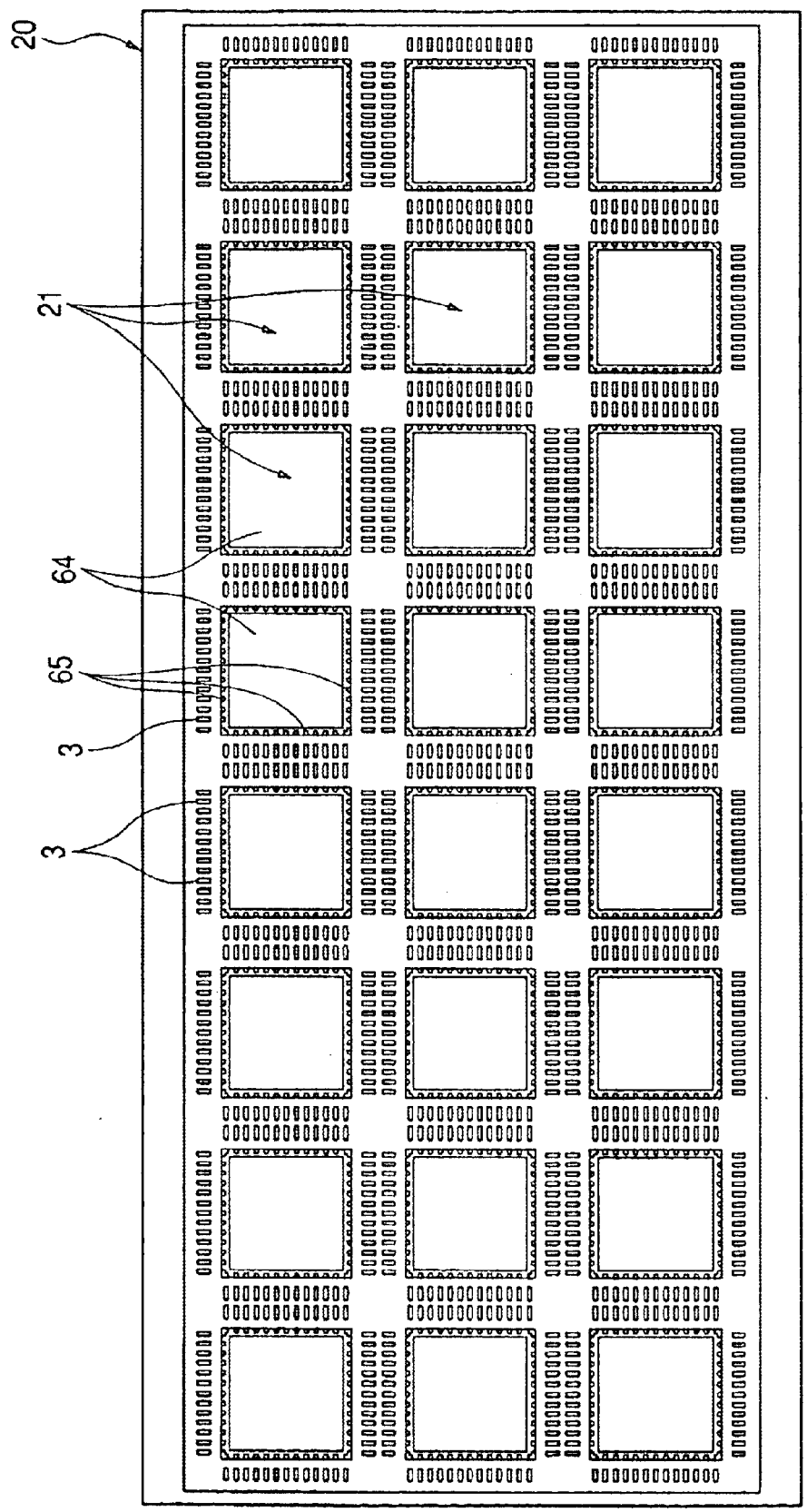
FIG. 98 is a plan view of a substrate used in manufacturing the semiconductor device of the sixteenth embodiment.
Figure 99:
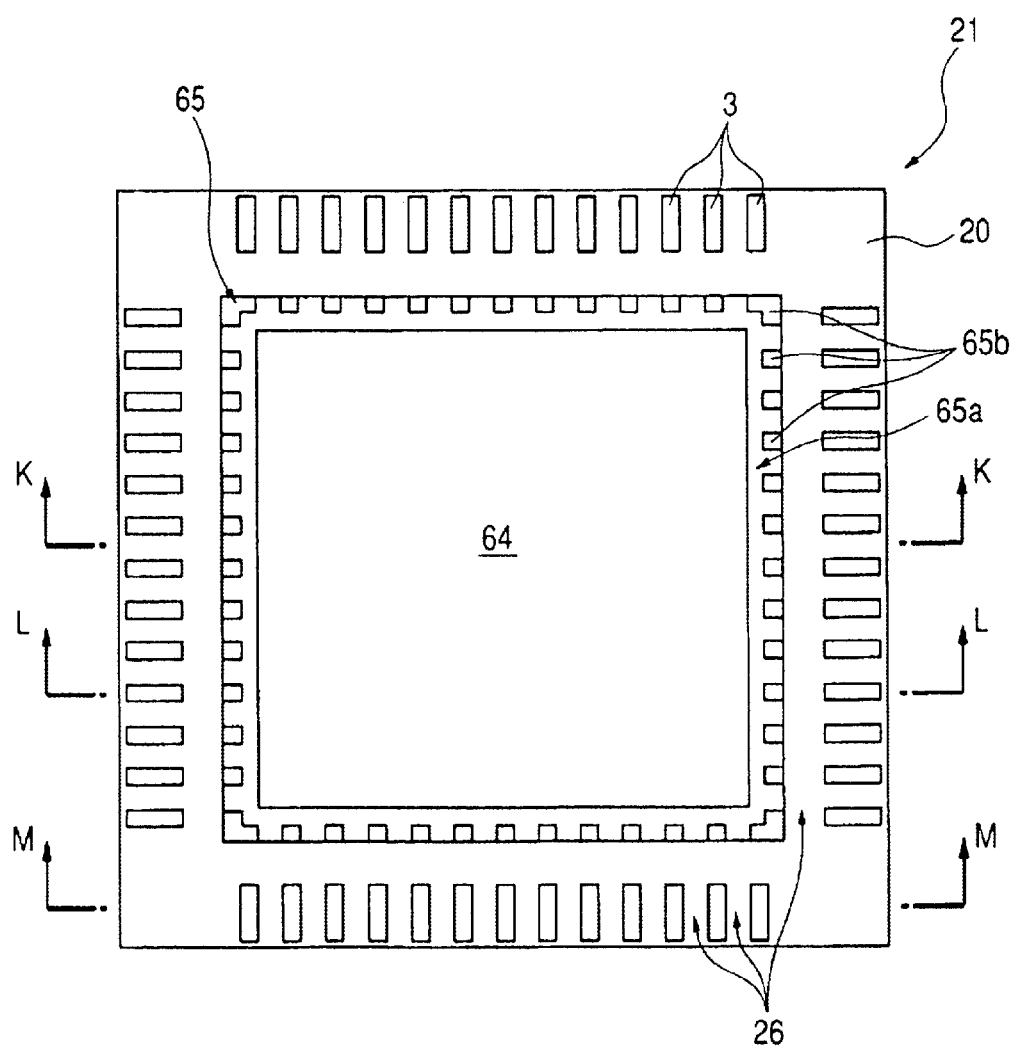
FIG. 99 is a schematic plan view showing a product-forming portion of the substrate of FIG. 98.
Figure 100A:
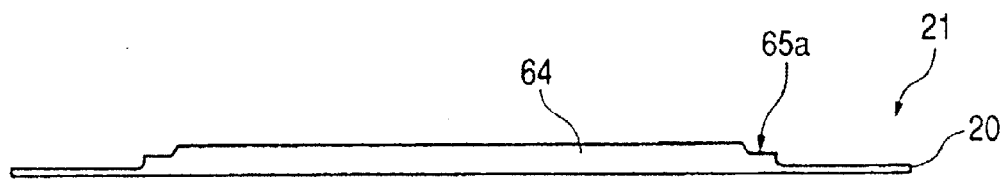
FIGS. 100(a) to 100(c) are sectional views taken along lines K—K, L—L, and M—M in FIG. 99.
Figure 100B:
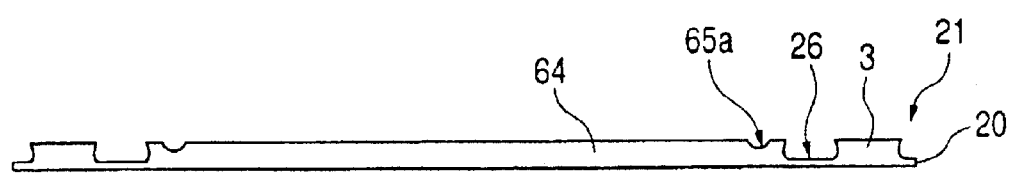
Figure 100C:
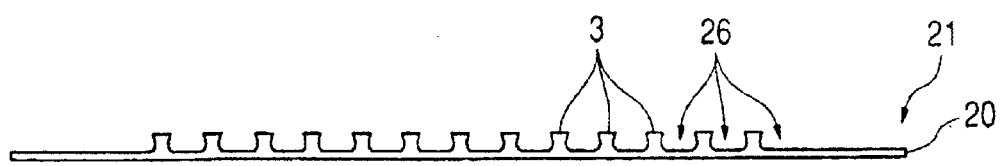
Figure 101A:
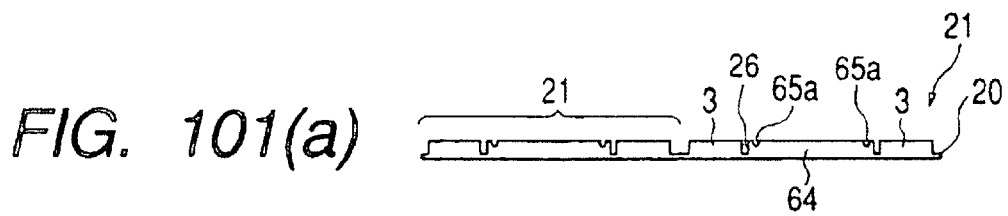
FIGS. 101(a) to 101(h) are sectional views showing, step by step, a method of manufacturing the semiconductor device of the sixteenth embodiment.
Figure 101B:
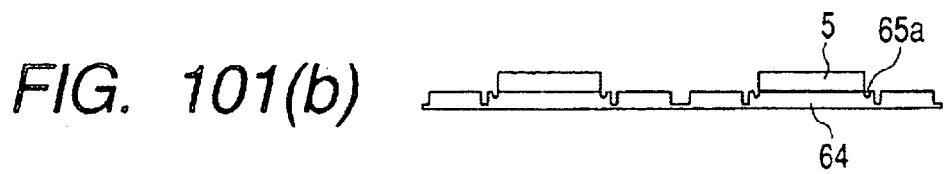
Figure 101C:
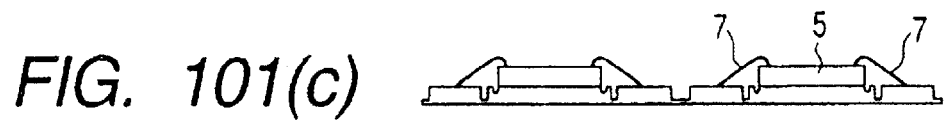
Figure 101D:
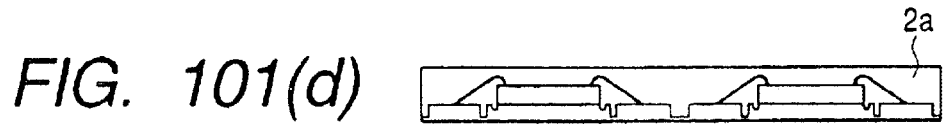
Figure 101E:
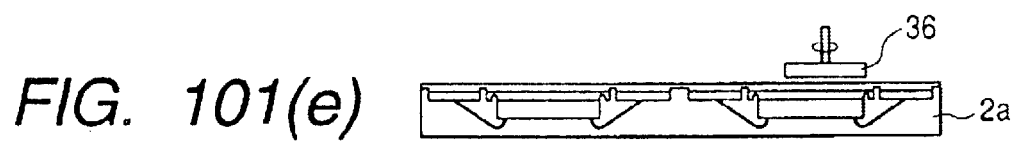
Figure 101F:
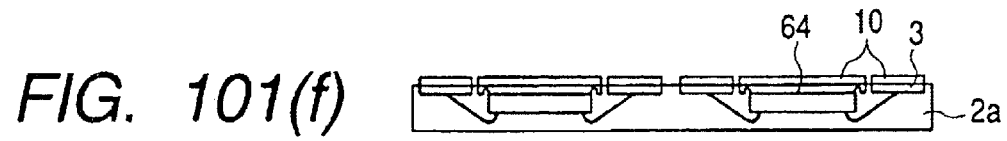
Figure 101G:
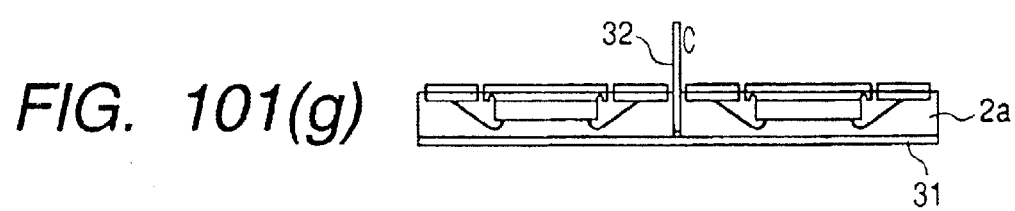
Figure 101H:
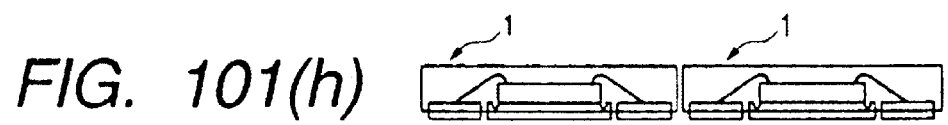

FIGS. 96 to 101 are related to a semiconductor device manufacturing method according to a sixteenth embodiment of the present invention, of which FIG. 96 is a schematic sectional view of a semiconductor device fabricated by the method, FIG. 97 is a bottom view thereof, FIG. 98 is a plan view of a substrate used in manufacturing the semiconductor device, FIG. 99 is a schematic plan view showing a product-forming portion of the substrate, FIGS. 100(a) to 100(c) are sectional views taken along lines K—K, L—L, and M—M in FIG. 99, and FIGS. 101(a) to 101(h) are sectional views showing, step by step, the semiconductor device manufacturing method.

In the fourteenth embodiment the concave/convex portions 65 are formed in side faces of the chip mounting portion 64, but in this sixteenth embodiment concave/convex portions 65 are formed in a portion deviated from the area on the main surface of the chip mounting portion 64 on which area the semiconductor chip 5 is mounted.

As shown in FIG. 100(a), the portion deviated from the chip mounting area on the main surface of the chip mounting portion 64 is a lower concave portion 65a. Convexes 65b are formed at predetermined intervals along the sides of a quadrangular chip mounting portion 64. Since the concaves 65a and grooves 26 are formed by etching, burrs are formed on the main surface side of a substrate 20. Therefore, in the stage of product, the compartments 3 and the chip mounting portion 64 are difficult to fall off from a resin layer 2a which forms resin sealing members 2. Moreover, as in the fourteenth embodiment, the bonding strength between the semiconductor chip 5 and the chip mounting portion 64 becomes higher. According to a stress simulation result it turned out that about 20% stress relaxation for the corners of the chip mounting portion 64 could be done in comparison with the absence of the concave/convex portions 65.

According to a method of manufacturing the semiconductor device of this sixteenth embodiment, the semiconductor device can be manufactured using the substrate 20 shown in FIG. 98 and in accordance with the manufacturing steps shown in FIGS. 101(a) to 101(h). This sixteenth embodiment is different from the fourteenth embodiment merely in shape and structure of product-forming portions 21. Since the manufacturing steps shown in FIGS. 101(a) to 101(h) are the same as those shown in FIGS. 90(a) to 90(h) which are related to the fourteenth embodiment, and therefore explanations thereof will here be omitted.

Also in this sixteenth embodiment there can be obtained the same effects as in the fourteenth embodiment.

Figure 102:
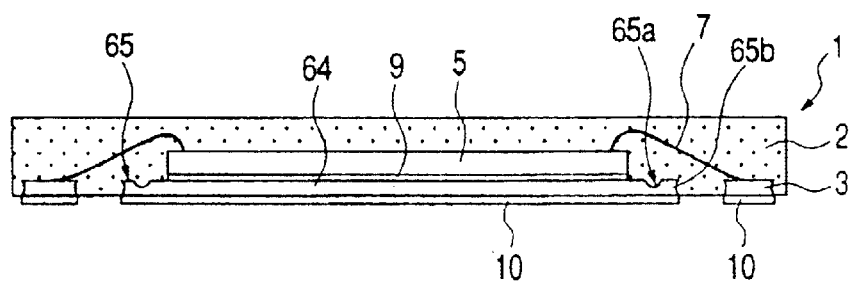
FIG. 102 is a schematic sectional view of a semiconductor device according to a first modification of the sixteenth embodiment.
Figure 103:
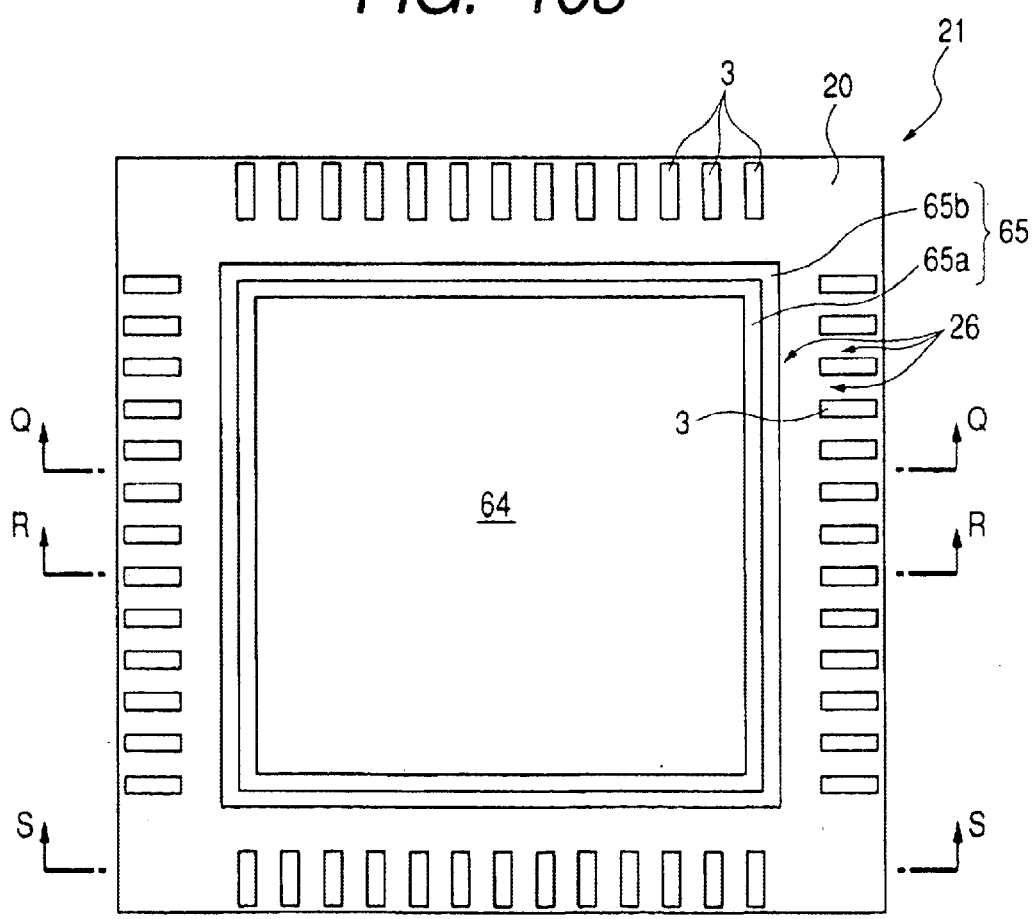
FIG. 103 is a schematic plan view showing a product-forming portion of a substrate used in manufacturing the semiconductor device of the first modification of the sixteenth embodiment.
Figure 104A:
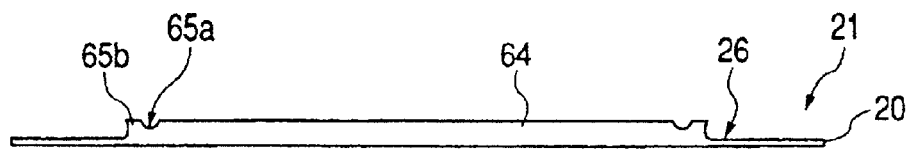
FIGS. 104(a) to 104(c) are sectional views taken along lines Q—Q, R—R, and S—S in FIG. 103.
Figure 104B:
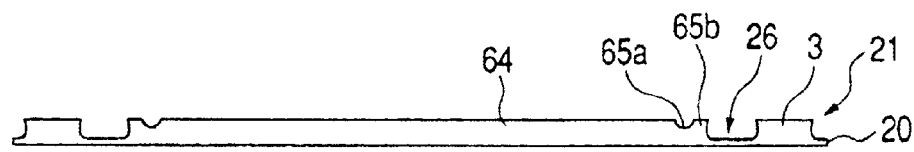
Figure 104C:
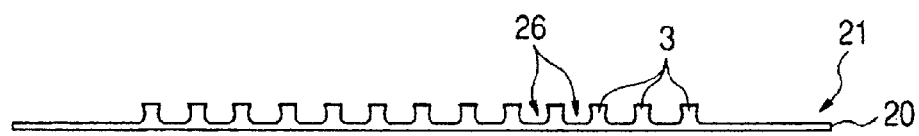

FIGS. 102 to 104 illustrate a semiconductor device manufacturing method according to a first modification of this sixteenth embodiment, of which FIG. 102 is a schematic sectional view of a semiconductor device fabricated by the method, FIG. 103 is a schematic plan view showing a product-forming portion of a substrate used in manufacturing the semiconductor device, and FIGS. 104(a) to 104(c) are sectional views taken along lines Q—Q, R—R, and S—S in FIG. 103.

This first modification shows an example of forming a concave/convex portion 65 on the main surface of the chip mounting portion 64 as in the sixteenth embodiment, but, as shown in FIGS. 102 to 104, a concave 65a constituted by a groove is formed on the main surface of the chip mounting portion 64 in a portion deviated from the area for mounting the semiconductor chip 5 so as to surround the semiconductor chip. Since the concave 65a and grooves 26 are formed by etching, the main surface side of the substrate 20 is burred. As a result, in the stage of product, the compartments 3 and the chip mounting portion 64 become difficult to fall off from the resin layer 2a which forms resin sealing members 2. Also in this first modification there can be obtained the same effects as in the sixteenth embodiment.

Figure 105:
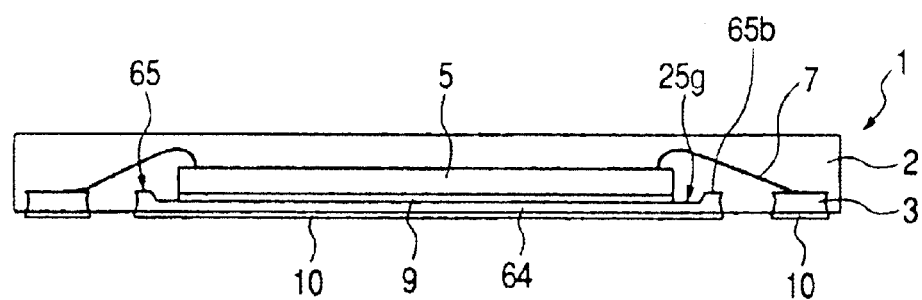
FIG. 105 is a schematic sectional view of a semiconductor device according to a second modification of the sixteenth embodiment.
Figure 106:
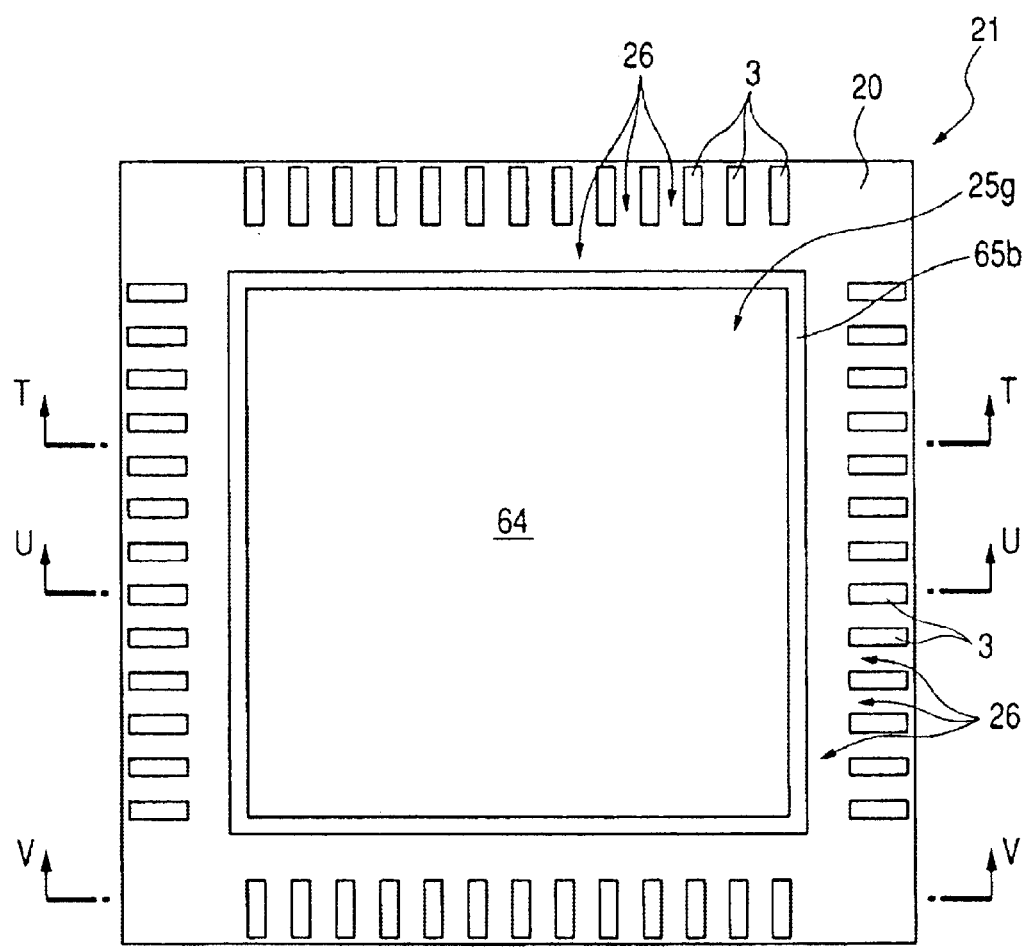
FIG. 106 is a schematic plan view showing a product-forming portion of a substrate used in manufacturing the semiconductor device of the second modification of the sixteenth embodiment.
Figure 107A:
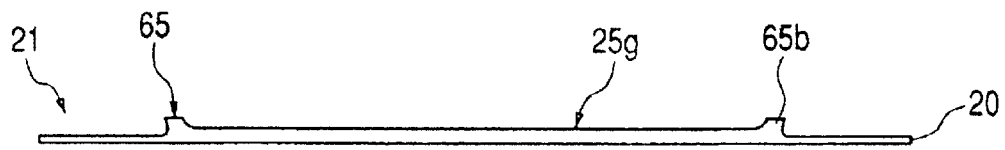
FIGS. 107(a) to 107(c) are sectional views taken along lines T—T, U—U, and V—V in FIG. 106.
Figure 107B:
Figure 107C:
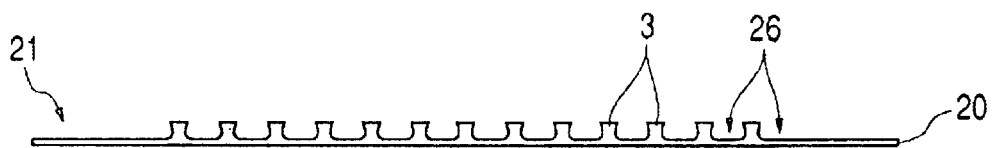

FIGS. 105 to 107 are related to a semiconductor device manufacturing method according to a second modification of the sixteenth embodiment, of which FIG. 105 is a schematic sectional view of a semiconductor device fabricated by the method, FIG. 106 is a schematic plan view showing a product-forming portion of a substrate used in manufacturing the semiconductor device, and FIGS. 107(a) to 107(c) are sectional views taken along lines T—T, U—U, and V—V in FIG. 106.

In this second modification, a concave/convex portion 65 is formed on the main surface of the chip mounting portion 64 as in the sixteenth embodiment, but, as shown in FIGS. 105 to 107, a convex 65b constituted by a rib is formed on the main surface of the chip mounting portion 64 in a portion deviated from the area for mounting the semiconductor chip 5 so as to surround the semiconductor chip. In this second modification, the area inside the convex 65b is formed as a recess 25g having a bottom shallower than the bottom of each groove 26, and the semiconductor chip 5 is mounted onto the recess 25g through an adhesive 9 (see FIG. 105). Since the recess 25g and the grooves 26 are formed by etching, the main surface side of the substrate 20 is burred. Consequently, in the stage of product, the compartments 3 and the chip mounting portion 64 become difficult to fall off from the resin layer 2a which forms resin sealing members.

According to the structure of this second modification, the semiconductor chip 5 is fixed onto the recess 25g formed in the chip mounting portion 64, so that the height of the main surface of the semiconductor chip 5 becomes lower and the height of an upper surface of the resin layer 2a can be made so much lower, whereby it is possible to attain the reduction in thickness of the semiconductor device 1. Also in this second modification there can be obtained the same effects as in the sixteenth embodiment.

[Seventeenth Embodiment]

Figure 108:
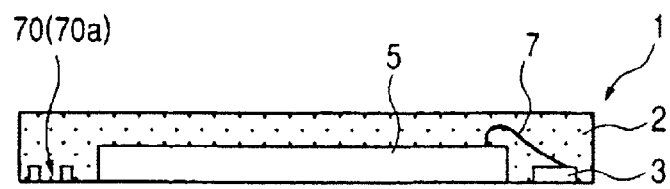
FIG. 108 is a schematic sectional view of a semiconductor device according to a seventeenth embodiment of the present invention.
Figure 109:
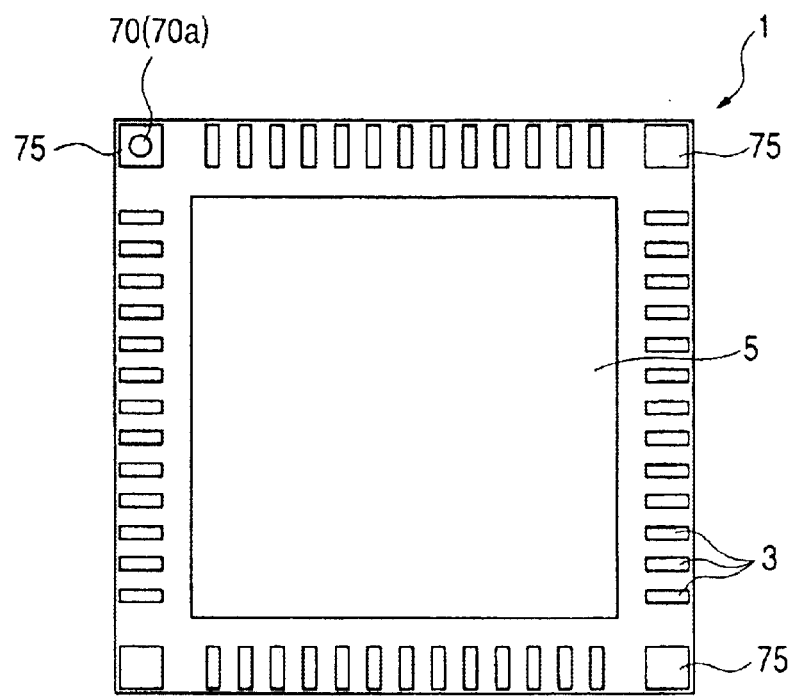
FIG. 109 is a bottom view of the semiconductor device of the seventeenth embodiment.
Figure 110:
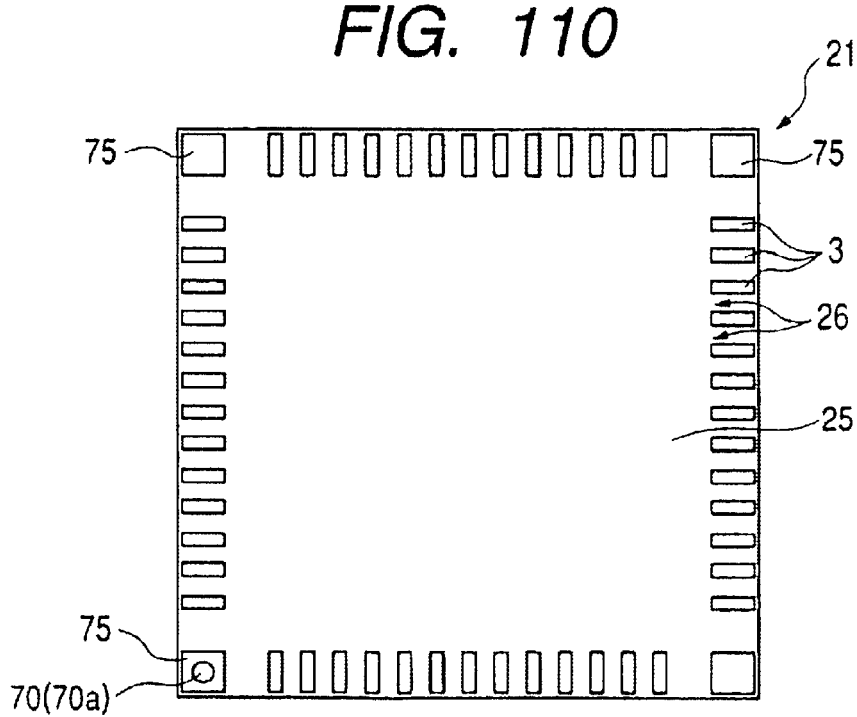
FIG. 110 is a schematic plan view showing a product-forming portion of a substrate used in manufacturing the semiconductor device of the seventeenth embodiment.

FIGS. 108 to 111 are related to a seventeenth embodiment of the present invention, of which FIG. 108 is a schematic sectional view of a semiconductor device according to this seventeenth embodiment, FIG. 109 is a bottom view thereof, FIG. 110 is a schematic plan view showing a product-forming portion of a substrate used in manufacturing the semiconductor device, and FIGS. 111(a) to 111(h) are sectional views showing, step by step, a method of manufacturing the semiconductor device.

Figure 111A:
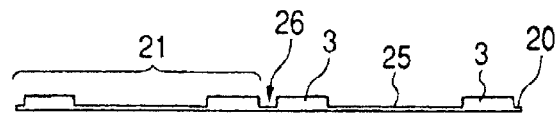
FIGS. 111(a) to 111(h) are sectional views showing, step by step, a method of manufacturing the semiconductor device of the seventeenth embodiment.
Figure 111B:
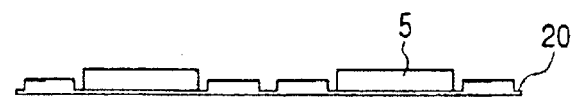
Figure 111C:
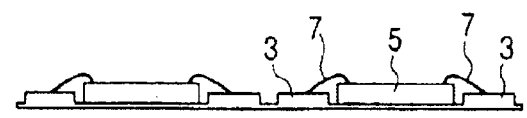
Figure 111D:
Figure 111E:
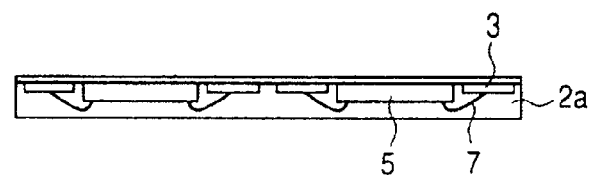
Figure 111F:
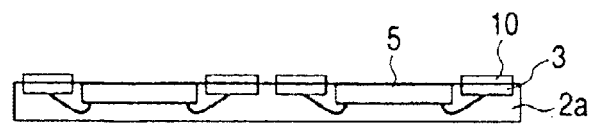
Figure 111G:
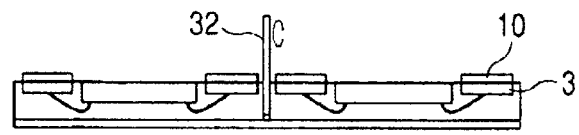
Figure 111H:

In this seventeenth embodiment, like the fifteenth embodiment, package reinforcing pads 75 are formed at the four corners of a quadrangular resin sealing member 2 in the semiconductor device 1, and the back surface of the semiconductor chip 5 is exposed to the back surface of the resin sealing member 2 as in the first embodiment. There may be adopted a structure wherein the back surface of the semiconductor chip 5 is exposed to the back surface of the resin sealing member 2 or a structure wherein the adhesive applied to the back surface of the semiconductor chip 5 may be exposed. In this seventeenth embodiment, as shown in FIG. 111(a), the semiconductor device 1 is fabricated using a substrate 20 having compartments 3 surrounded by a recess 25 and grooves 26. FIGS. 11(a) to 11(h) are the same as FIGS. 6(a) to 6(h), so explanations of manufacturing steps will here be omitted.

Also in this seventeenth embodiment, like the fifteenth embodiment, the package strength can be enhanced by using pads 75. Also in this seventeenth embodiment, by utilizing a directionality index 70, there is obtained an effect that the directionality of the semiconductor device can be recognized easily during and after the manufacture of the semiconductor device.

Although the present invention has been described above concretely by way of embodiments thereof, it goes without saying that the present invention is not limited to the above embodiments and that various changes may be made within the scope not departing from the gist of the invention.

Although in the above embodiments the present invention is applied to the manufacture of QFN type semiconductor devices, the present invention is also applicable to, for example, the manufacture of SON type semiconductor devices, thereby permitting attainment of the same effects as above.

Although in the above embodiments there are formed plural rows of compartments, the same effects as above can be obtained also in the case where there are formed compartments in a single row.

Further, although in the above embodiments an upper surface (semiconductor element-forming side) of the semiconductor element 5 lies in a higher position than the upper surfaces of compartment 3, the compartments 3 may be formed thick, whereby their upper surfaces become higher than the upper surface of the semiconductor element 5 and the wire length can be shortened.

What is claimed is:

1. A method of manufacturing a semiconductor device, comprising the steps of:
   (a) providing a substrate comprising: a metallic sheet having a main surface and a back surface; a plurality of product-forming portions; a recess and compartments formed over the main surface of the metallic sheet in each of the product-forming portions; and grooves formed over the main surface of the metallic sheet so as to surround the compartments;
   (b) after the step (a), fixing a semiconductor element to a bottom of the recess in each of the product-forming portions through an adhesive;
   (c) after the step (b), thereafter, connecting a surface of the semiconductor element and surfaces of the compartments electrically with each other through conductive wires;
   (d) after the step (c), forming an insulating resin layer over the main surface of the substrate so as to include boundary portions of each of the product-forming portions and cover the semiconductor element and the wires;
   (e) after the step (d), removing a predetermined thickness of the back surface of the metallic sheet, thereby allowing the compartments to be electrically isolated each independently and allowing the adhesive to be exposed; and
   (f) after the step (e), cutting the resin layer along the boundary portions of the product-forming portions to fabricate a plurality of semiconductor devices.

2. A method according to claim 1, further comprising, after the step (e) and before the step (f), a step of:
   (g) forming a plating film over the surfaces of the compartments exposed to a surface of the resin layer.

3. A method according to claim 1, further comprising, after the step (e), a step of:
   (h) affixing a tape to the whole of a surface of the resin layer opposite to the surface of the resin layer to which the compartments are exposed, after the step (e),
   wherein the cutting step (f) is carried out.

4. A method according to claim 1,
   wherein the product-forming portions are plurally arranged longitudinally and transversely over the substrate, and
   wherein the cutting step (f) is carried out by dicing.

5. A method according to claim 1,
   wherein, in the semiconductor element fixing step (b), the semiconductor element is fixed through an insulating adhesive, and
   wherein, thereafter, in the step (e) of removing a predetermined thickness of the back surface of the substrate, the insulating adhesive is allowed to remain and a back surface of the semiconductor element is covered with the insulating adhesive.

6. A method according to claim 5,
   wherein, as the insulating adhesive, a material is used which affords a stronger bonding force between the adhesive and the resin layer than a bonding force between the substrate and the resin layer.

7. A method according to claim 5,
   wherein the insulating adhesive includes an organic resin having a strong bonding force for the semiconductor element.

8. A method according to claim 5,
   wherein a filmy adhesive sheet is affixed to the back surface of the semiconductor element and is used as the adhesive.

9. A method according to claim 5,
   wherein a material lower in elastic modulus than the substrate is used as the adhesive.

10. A method according to claim 1,
wherein, in the step (a) of forming product-forming portions, the depth of the recess and the depth of each of the grooves are set equal to each other,
wherein, in the step (e) of removing a predetermined thickness of the back surface of the substrate, the removal is carried out in such a manner that the adhesive for bonding the semiconductor element is exposed, and
wherein the cutting step (f) is carried out after the step (f).

11. A method according to claim 1,
wherein, in the step (a) of forming product-forming portions, the depth of the recess and the depth of each of the grooves are set equal to each other,
wherein, in the step (e) of removing a predetermined thickness of the back surface of the substrate, the removal is carried out in such a manner that the adhesive for bonding the semiconductor element is exposed,
wherein, after the step (e), the exposed adhesive is removed, allowing the back surface of the semiconductor element to be exposed as a step (i), and
wherein, thereafter, the cutting step (f) is carried out.

12. A method according to claim 1,
wherein, in the step (a) of forming product-forming portions, the depth of the recess is set shallower than the depth of each of the grooves,
wherein, in the step (e) of removing a predetermined thickness of the back surface of the substrate, the compartments are isolated from one another and are each rendered independent electrically, and the substrate portion which has become thinner is allowed to remain through the adhesive on the connection side of the semiconductor element, and
wherein, subsequently, the cutting step (f) is carried out.

13. A method according to claim 1,
wherein the semiconductor element fixing step (b), the wire connecting step (c), and the resin layer forming step (d) are carried out while vacuum-chucking the back surface of the substrate so that the substrate is kept flat.

14. A method according to claim 1,
wherein, in the step (d), the resin layer is formed so as to have a constant thickness by a transfer molding method.

15. A method according to claim 1,
wherein, in the step (d), the resin layer is formed by a potting method.

16. A method according to claim 15,
wherein the resin layer is formed by using a resin having a predetermined thermal expansion coefficient so that, after the formation of the resin layer, the amount and angle of warp in the longitudinal direction of the substrate are larger than those in the transverse direction of the substrate.

17. A method according to claim 1,
wherein the step (e) of removing a predetermined thickness of the back surface of the substrate is carried out by etching.

18. A method according to claim 17,
wherein, as the etching, over-etching is carried out in such a manner that the etched portion lies inside a surface of the resin layer portion which is positioned between the compartments.

19. A method according to claim 1,
wherein, in the step (e), a second main surface of the substrate is removed by polishing.

20. A method according to claim 19,
wherein the polishing is carried out by contact shift polishing with use of a tape-like polisher having a length of several ten to several hundred meters.

21. A method according to claim 1,
wherein, within each of the product-forming portions, the compartments are arranged in plural rows along the sides of the product-forming portion.

22. A method according to claim 21,
wherein the compartments are equal in shape and size.

23. A method according to claim 1,
wherein, in the semiconductor element fixing step (b), a plurality of semiconductor elements are stacked and fixed over the recess bottom in such a manner that electrodes formed respectively over surfaces of the semiconductor elements are exposed, and
wherein, in the wire connecting step (c), the electrodes formed over the semiconductor elements and the compartments are connected with each other through conductive wires.

24. A method according to claim 1,
wherein, in the wire connecting step (c), a plurality of wires are connected to predetermined ones of the compartments.

25. A method according to claim 1,
wherein, in the step (a) of forming product-forming portions each by one or plural recesses and plural compartments, the compartment located at a predetermined position is former longer or larger than the other compartments, and
wherein, in the wire connecting step (c), a plurality of wires are connected to the longer or larger compartment.

26. A method according to claim 1,
wherein, in the step (a) of forming product-forming portions, a part of the compartments are formed so as to extent up to the interior of an area where the semiconductor element is fixed, and a surface portion of the semiconductor element-fixed area is formed at a height equal to the height of the recess bottom.

27. A method according to claim 1,
wherein, in the step (a) of forming product-forming portions, an elongated bus bar lead is provided outside the area where the semiconductor element is fixed, so as to surround the semiconductor element, and
wherein, in the wire connecting step (c), predetermined one of the wires are connected to the bus bar lead.

28. A method according to claim 27,
wherein the bus bar lead is formed in plural sets and as plural enclosures.

29. A method according to claim 27,
wherein the bus bar lead which surrounds the semiconductor element is formed discontinuously.

30. A method according to claim 27,
wherein, after forming the bus bar lead and after the steps of fixing the semiconductor element, connecting the wires, forming the resin layer, and removing a predetermined thickness of the substrate back surface, a plating film is formed over the surface of each of the compartments exposed to a surface of the resin layer in such a manner that the plating film is not formed over a back surface of the bus bar lead.

31. A method according to claim 1, wherein, in the step of forming plural compartments surrounded with a recess and grooves, the recess and grooves are formed by wet etching, and wherein the wet etching is carried out in such a manner that the width of an intermediate portion of each of the compartments is narrower than the width of the surface or a back surface opposite to the surface of each of the compartments.

32. A method according to claim 1, wherein as the substrate, a flat sheet formed of copper alloy or iron-nickel alloy is used.

33. A method according to claim 1, wherein, in the step (a) of forming product-forming portions, a plating film of a predetermined thickness is formed over the main surface of the metallic sheet which is flat, and the recess and grooves are formed in each of the product-forming portions to define a plurality of compartments surrounded with the recess and grooves, thereby forming a substrate having a plurality of the product-forming portions.

34. A method according to claim 33, wherein a solder plating film is formed selectively over the main surface of the metallic sheet.

35. A method according to claim 1, wherein, in the step (a) of forming product-forming portions, a directionality index is formed in each of the product-forming portions simultaneously with the formation of the compartments so as to be surrounded with the grooves and project, and wherein, in the step (e) of removing a predetermined thickness of the substrate back surface, the removal is performed in such a manner that the directionality index is exposed.

36. A method according to claim 28, wherein the bus bar lead which surrounds the semiconductor element is formed discontinuously.

\* \* \* \* \*